United States Patent
Senda et al.

(10) Patent No.: US 8,148,809 B2
(45) Date of Patent: Apr. 3, 2012

(54) SEMICONDUCTOR DEVICE, METHOD FOR MANUFACTURING THE SAME, AND MULTILAYER SUBSTRATE HAVING THE SAME

(75) Inventors: Kouji Senda, Nishikamo-gun (JP); Satoshi Shiraki, Toyohashi (JP); Yukihiro Maeda, Kasugai (JP); Shinichi Hirose, Okazaki (JP); Tetsuo Fujii, Toyohashi (JP); Takashi Nakano, Nukata-gun (JP)

(73) Assignee: Denso Corporation, Kariya (JP)

( * ) Notice: Subject to any disclaimer, the term of this patent is extended or adjusted under 35 U.S.C. 154(b) by 120 days.

(21) Appl. No.: 12/654,707

(22) Filed: Dec. 29, 2009

(65) Prior Publication Data

US 2010/0176480 A1    Jul. 15, 2010

(30) Foreign Application Priority Data

Jan. 15, 2009  (JP) .................................... 2009-6982
Oct. 15, 2009  (JP) ................................. 2009-238483
Dec. 15, 2009  (JP) ................................. 2009-284343

(51) Int. Cl.
  *H01L 23/48* (2006.01)
(52) U.S. Cl. ................ 257/692; 257/706; 257/E21.599; 438/113; 438/122
(58) Field of Classification Search .................. 257/501, 257/692, 706, E27.011, E21.599; 438/113, 438/122
See application file for complete search history.

(56) References Cited

U.S. PATENT DOCUMENTS

| | | | |
|---|---|---|---|
| 5,442,223 A | 8/1995 | Fujii | |
| 6,013,936 A | 1/2000 | Colt, Jr. | |
| 6,407,508 B1* | 6/2002 | Kawada et al. | 315/169.3 |
| 6,992,363 B2 | 1/2006 | Akiyama et al. | |
| 7,205,587 B2 | 4/2007 | Fujimaki | |
| 7,285,455 B2 | 10/2007 | Fujimaki | |
| 7,462,913 B2 | 12/2008 | Muramoto et al. | |

(Continued)

FOREIGN PATENT DOCUMENTS

JP        A-59-016341        1/1984

(Continued)

OTHER PUBLICATIONS

Office Action issued from the Japanese Patent Office on Oct. 6, 2009 in the related Japanese patent application No. 2007-323064 (with English translation thereof).

(Continued)

*Primary Examiner* — Matthew Landau
*Assistant Examiner* — Colleen E Snow
(74) *Attorney, Agent, or Firm* — Posz Law Group, PLC

(57) ABSTRACT

A method for manufacturing a semiconductor device includes: preparing a wafer formed of a SOI substrate; forming a circuit portion in a principal surface portion; removing a support substrate of the SOI substrate; fixing an insulation member on a backside of a semiconductor layer so as to be opposite to the circuit portion; dicing the wafer and dividing the wafer into multiple chips; arranging a first conductive member on the insulation member so as to be opposite to a part of the low potential reference circuit, and arranging a second conductive member on the insulation member so as to be opposite to a part of the high potential reference circuit; and coupling the first conductive member with a first part of the low potential reference circuit, and coupling the second conductive member with a second part of the high potential reference circuit.

22 Claims, 51 Drawing Sheets

U.S. PATENT DOCUMENTS

| | | | |
|---|---|---|---|
| 2003/0094654 A1 | 5/2003 | Christensen et al. | |
| 2007/0090458 A1* | 4/2007 | Muramoto et al. | 257/347 |
| 2009/0004772 A1 | 1/2009 | Jinbo et al. | |
| 2009/0152668 A1 | 6/2009 | Sone et al. | |

FOREIGN PATENT DOCUMENTS

| | | |
|---|---|---|
| JP | A-59-019350 | 1/1984 |
| JP | A-61-067253 | 4/1986 |
| JP | A-61-085853 | 5/1986 |
| JP | A-61-121466 | 6/1986 |
| JP | A-01-241168 | 9/1989 |
| JP | A-02-271567 | 11/1990 |
| JP | A-02-281753 | 11/1990 |
| JP | A-04-062847 | 2/1992 |
| JP | A-10-125925 | 5/1998 |
| JP | B2-3076504 | 6/2000 |
| JP | A-2004-047811 | 2/2004 |
| JP | A-2006-93229 | 4/2006 |
| JP | A-2006-287009 | 10/2006 |
| JP | A-2007-141958 | 6/2007 |
| JP | A-2008-244157 | 10/2008 |
| JP | A-2009-176814 | 8/2009 |

OTHER PUBLICATIONS

Office Action issued from the Chinese Patent Office on Dec. 25, 2009 in the related Chinese patent application No. 200810184399.8 (with English translation thereof).

First Office Action issued from the U.S. Patent and Trademark Office on Mar. 29, 2010 for the related U.S. Appl. No. 12/314,518.

Notice of Allowance and Fees Due dated Jul. 21, 2010 for the related U.S. Appl. No. 12/314,518.

U.S. Appl. No. 12/314,518, filed Dec. 11, 2008, Sone et al.

Office Action mailed Aug. 23, 2011 in corresponding JP application No. 2009-284343 (and English translation).

* cited by examiner

US 8,148,809 B2

SEMICONDUCTOR DEVICE, METHOD FOR MANUFACTURING THE SAME, AND MULTILAYER SUBSTRATE HAVING THE SAME

CROSS REFERENCE TO RELATED APPLICATIONS

This application is based on Japanese Patent Applications No. 2009-6982 filed on Jan. 15, 2009, No. 2009-238483 filed on Oct. 15, 2009, and No. 2009-284343 filed on Dec. 15, 2009, the disclosures of which are incorporated herein by reference.

FIELD OF THE INVENTION

The present invention relates to a semiconductor device, a method for manufacturing the same, and a multi-layer substrate having a built-in semiconductor device.

BACKGROUND OF THE INVENTION

One of semiconductor devices used for an inverter control to drive a load such as a motor is a HVIC (high voltage integrated circuit). The HVIC controls a power device accommodated in an inverter for driving a load.

Conventionally, as shown in FIG. 55, a HVIC 107 is used for driving the inverter. The HVIC 107 includes a high potential reference gate driving circuit 103, a low potential reference gate driving circuit 104, level shift elements 105a, 105b and a control circuit 106. The high potential reference gate driving circuit 103 corresponds to a high potential reference circuit for driving an IGBT 102a on a high potential side in an inverter circuit 101. The inverter circuit 101 drives a motor 100. The low potential reference gate driving circuit 104 corresponds to a low potential reference circuit for driving an IGBT 102b on a low potential side in an inverter circuit 101. The level shift elements 105a, 105b and the control circuit 106 are arranged between the high potential reference gate driving circuit 103 and the low potential reference gate driving circuit 104. The HVIC 107 transmits a signal via the level shift elements 105a, 105b so that the HVIC 107 performs level shift of a reference voltage in the high potential reference circuit and the low potential reference circuit. It is required for the HVIC 107 to be made into one chip in order to minimize the dimensions of the inverter. The HVIC 107 shown in FIG. 55 is also made into one chip.

However, in the HVIC 107 having the high potential reference circuit and the low potential reference circuit made into one chip, interference of potential between the high potential reference circuit and the low potential reference circuit occurs, so that the circuit may malfunction. Accordingly, conventionally, element isolation is performed with using a PN contact isolation structure, a dielectric isolation structure or a trench isolation structure in a SOI (silicon on insulator) substrate (e.g., described in the patent document No. 1). However, it is necessary to set a potential in an output part of the high potential reference circuit for driving the IGBT 102a to be a virtual GND potential as a reference potential on a high voltage side. Thus, when a low potential (e.g., 0V) is switched to a high potential (e.g., 750V) in case of the level shift in any one of the above element isolation structures, a high voltage (e.g., larger than 1200V) is generated with a rapid rising edge speed such as several tens kV/μsec, and therefore, a large potential oscillation amplitude occurs. It is difficult to manage this high voltage surge (defined as a dv/dt surge since voltage increase is high with respect to the rising edge period) having the rapid rising edge without malfunction of the circuit.

[Patent Document No. 1] JP-A-2006-93229

In the above element isolation structures, the trench isolation structure having the SOI substrate provides the strongest resistance against noise, and therefore, the trench isolation structure provides the highest possibility among the element isolation structures. However, in the HVIC having the trench isolation structure with using the SOI substrate, the potential interferes through a support substrate when the dv/dt surge is applied so that displacement current for charging and discharging a parasitic capacitance formed by an insulation layer between the support substrate and a semiconductor layer (i.e., a SOI layer) is generated. Thus, the circuit malfunctions. FIG. 56 is a cross sectional view of the HVIC when the displacement current is generated. As shown in this drawing, for example, the displacement current is generated in a current path such that the displacement current flows from a portion providing the virtual GND potential of the high potential reference circuit portion HV formed in the semiconductor layer 111 to the support substrate 112 via the insulation layer 113, and then, the displacement current flows into the portion providing the GND potential of the low potential reference circuit portion LV via the insulation layer 113.

The above difficulty may be improved such that the thickness of the insulation layer is thickened so as to reduce the parasitic capacitance, or the impurity concentration on the support substrate 112 side is decreased so as to increase a resistance so that propagation of the displacement current is reduced. However, it is difficult to improve completely the difficulty since a tiny displacement current may cause the malfunction when an amplifier circuit having a large gain or the like is integrated.

SUMMARY OF THE INVENTION

In view of the above-described problem, it is an object of the present disclosure to provide a semiconductor device, a method for manufacturing the semiconductor device, and a multi layer substrate having a built-in semiconductor device, which includes a low potential reference circuit portion and a high potential reference circuit portion disposed on a same chip, and provides to reduce generation of a displacement current caused by a dv/dt surge for charging and discharging a parasitic capacitor.

According to a first aspect of the present disclosure, a method for manufacturing a semiconductor device includes: preparing a wafer formed of a SOI substrate having a support substrate, an insulation layer and a semiconductor layer, which are stacked in this order; forming a circuit portion with a low potential reference circuit and a high potential reference circuit in a principal surface portion of the semiconductor layer, wherein the low potential reference circuit functions with a first potential as a reference potential, the high potential reference circuit functions with a second potential as a reference potential, the second potential is higher than the first potential, and the low potential reference circuit transmits a signal to and receives a signal from the high potential reference circuit; removing the support substrate of the SOI substrate after the forming the circuit portion; fixing an insulation member on a backside of the semiconductor layer so as to be opposite to the circuit portion after the removing the support substrate; dicing the wafer and dividing the wafer into a plurality of chips having the low potential reference circuit and the high potential reference circuit after the fixing the insulation member; arranging a first conductive member on the insulation member so as to be opposite to at least a part of the low potential reference circuit, and arranging a second conductive member on the insulation member so as to be opposite to at least a part of the high potential reference circuit, wherein a potential to be applied to the first conductive member is different from a potential to be applied to the second conductive member; and coupling the first conductive member with a first part of the low potential reference circuit, to which the first potential is to be applied, and coupling the second conductive member with a second part of the high potential reference circuit, to which the second potential is to be applied.

In the above method, it is possible to reduce or preclude a potential difference between both ends of a parasitic capacitor formed in the semiconductor device, and therefore, a capacitance is cancelled. Thus, generation of a displacement current generated by a dv/dt surge for charging and discharging a parasitic capacitor is prevented. Further, it is possible to prevent malfunction of a circuit.

According to a second aspect of the present disclosure, a method for manufacturing a semiconductor device includes: preparing a wafer formed of a bulk semiconductor substrate as a semiconductor layer; forming an insulation isolation trench having a predetermined depth on a principal surface of the semiconductor substrate; forming a circuit portion with a low potential reference circuit and a high potential reference circuit in a principal surface portion of the semiconductor substrate, wherein the low potential reference circuit functions with a first potential as a reference potential, the high potential reference circuit functions with a second potential as a reference potential, and the second potential is higher than the first potential; removing a part of a backside of the semiconductor substrate so as to expose the insulation isolation trench after the forming the circuit portion; fixing an insulation member on the backside of the semiconductor substrate so as to be opposite to the circuit portion after the removing the part of the backside of the semiconductor substrate; dicing the wafer and dividing the wafer into a plurality of chips having the low potential reference circuit and the high potential reference circuit after the fixing the insulation member; arranging a first conductive member on the insulation member so as to be opposite to at least a part of the low potential reference circuit, and arranging a second conductive member on the insulation member so as to be opposite to at least a part of the high potential reference circuit, wherein a potential to be applied to the first conductive member is different from a potential to be applied to the second conductive member; and coupling the first conductive member with a first part of the low potential reference circuit, to which the first potential is to be applied, and coupling the second conductive member with a second part of the high potential reference circuit, to which the second potential is to be applied.

Thus, regarding the semiconductor device formed by the manufacturing method with using the bulk semiconductor substrate, it is possible to reduce or preclude a potential difference between both ends of a parasitic capacitor formed in the semiconductor device, and therefore, a capacitance is cancelled. Thus, generation of a displacement current generated by a dv/dt surge for charging and discharging a parasitic capacitor is prevented. Further, it is possible to prevent malfunction of a circuit.

According to a third aspect of the present disclosure, a semiconductor device includes: a semiconductor layer having a circuit portion, which includes a low potential reference circuit, a high potential reference circuit and a level shift circuit, wherein the low potential reference circuit, the high potential reference circuit and the level shift circuit are disposed in a principal surface portion of the semiconductor layer, the low potential reference circuit functions with a first potential as a reference potential, the high potential reference circuit functions with a second potential as a reference potential, the second potential is higher than the first potential, and the level shift circuit includes at least one level shift element for performing level shift of a reference potential between the low potential reference circuit and the high potential reference circuit; an insulation member fixed on a backside of the semiconductor layer and opposite to the circuit portion; a first conductive member arranged on the insulation member and opposite to at least a part of the low potential reference circuit; a second conductive member arranged on the insulation member and opposite to at least a part of the high potential reference circuit; and a third conductive member arranged on the insulation member and opposite to at least a part of the level shift circuit. A potential to be applied to the first conductive member, a potential to be applied to the second conductive member and a potential to be applied to the third conductive member are different from each other. The first conductive member is electrically coupled with a first part of the low potential reference circuit, to which the first potential is to be applied. The second conductive member is electrically coupled with a second part of the high potential reference circuit, to which the second potential is to be applied, and the third conductive member is electrically coupled with the level shift circuit.

Thus, it is possible to reduce or preclude a potential difference between both ends of a parasitic capacitor formed in the semiconductor device, and therefore, a capacitance is cancelled. Thus, generation of a displacement current generated by a dv/dt surge for charging and discharging a parasitic capacitor is prevented. Further, it is possible to prevent malfunction of a circuit.

According to a fourth aspect of the present disclosure, a semiconductor device includes: a semiconductor layer having a circuit portion, which includes a low potential reference circuit and a high potential reference circuit, wherein the low potential reference circuit and the high potential reference circuit are disposed in a principal surface portion of the semiconductor layer, the low potential reference circuit functions with a first potential as a reference potential, the high potential reference circuit functions with a second potential as a reference potential, the second potential is higher than the first potential, and the low potential reference circuit transmits a signal to and receives a signal from the high potential reference circuit; an insulation member fixed on a backside of the semiconductor layer and opposite to the circuit portion; a first conductive member arranged on the insulation member and opposite to at least a part of the low potential reference circuit; and a second conductive member arranged on the insulation member and opposite to at least a part of the high potential reference circuit. A potential to be applied to the first conductive member is different from a potential to be applied to the second conductive member. The first conductive member is electrically coupled with a first part of the low potential reference circuit, to which the first potential is to be applied, and the second conductive member is electrically coupled with a second part of the high potential reference circuit, to which the second potential is to be applied.

Thus, it is possible to reduce or preclude a potential difference between both ends of a parasitic capacitor formed in the semiconductor device, and therefore, a capacitance is cancelled. Thus, generation of a displacement current generated by a dv/dt surge for charging and discharging a parasitic capacitor is prevented. Further, it is possible to prevent malfunction of a circuit.

According to a fifth aspect of the present disclosure, a multi layer substrate includes: the semiconductor device according to the fourth aspect of the present disclosure, which is embedded in the multi layer substrate; a plurality of resin layers, which are stacked; a hollow region arranged in the multi layer substrate and having dimensions corresponding to dimensions of the semiconductor device, wherein the semiconductor device is embedded in the hollow region; a wiring pattern arranged between the resin layers; and a connection via penetrating the resin layers. The circuit portion of the semiconductor device is electrically coupled with the metal film through the wiring pattern and the connection via.

In the above case, since the semiconductor device is accommodated and sealed in the multi layer substrate, it is not necessary to seal the device with another mold resin or the like. Further, heat in the semiconductor device can be discharged to the outside through the connection via.

BRIEF DESCRIPTION OF THE DRAWINGS

The above and other objects, features and advantages of the present invention will become more apparent from the following detailed description made with reference to the accompanying drawings. In the drawings:

FIG. 5A shows a state that a circuit portion forming step in a semiconductor layer is completed, FIG. 5B shows a state that a step for bonding a support member is completed, FIG. 5C shows a state that a cutting step in a removing process of a support substrate is completed, FIG. 5D shows a state that an etching step in the removing process of the support substrate is completed;

FIG. 6A shows a state that a step for fixing the insulation member is completed, FIG. 6B shows a state that a step for cutting the insulation member is completed, FIG. 6C shows a state that a step for removing the support member is completed, FIG. 6D shows a state that a dicing step is completed, and FIG. 6E shows a state that a step for mounting a chip on a lead and for coupling electrically is completed;

FIG. 10A shows a state that a circuit portion forming step in a semiconductor substrate is completed, FIG. 10B shows a state that a step for bonding a support member is completed, FIG. 10C shows a state that a cutting step in a thinning process of a semiconductor substrate is completed, FIG. 10D shows a state that a polishing step in the thinning process of the semiconductor substrate is completed, and FIG. 10E shows a state that a step for fixing an insulation member is completed;

FIG. 19A shows a state that preparation of a semiconductor layer and an insulation member bonded with a support member is completed, and FIG. 19B shows a state that a cutting step of the insulation member is completed;

DETAILED DESCRIPTION OF THE PREFERRED EMBODIMENTS

First Embodiment

Figure 1:
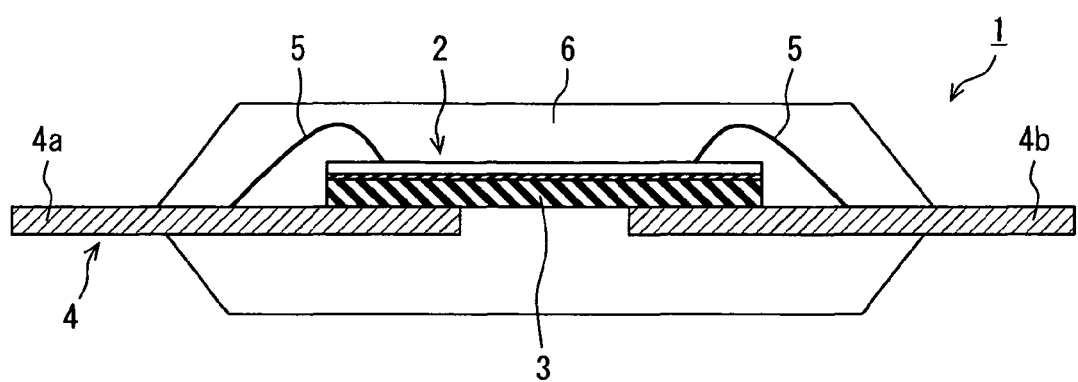
FIG. 1 is a cross sectional view showing a skeleton constitution of a semiconductor device according to a first embodiment.
Figure 2:
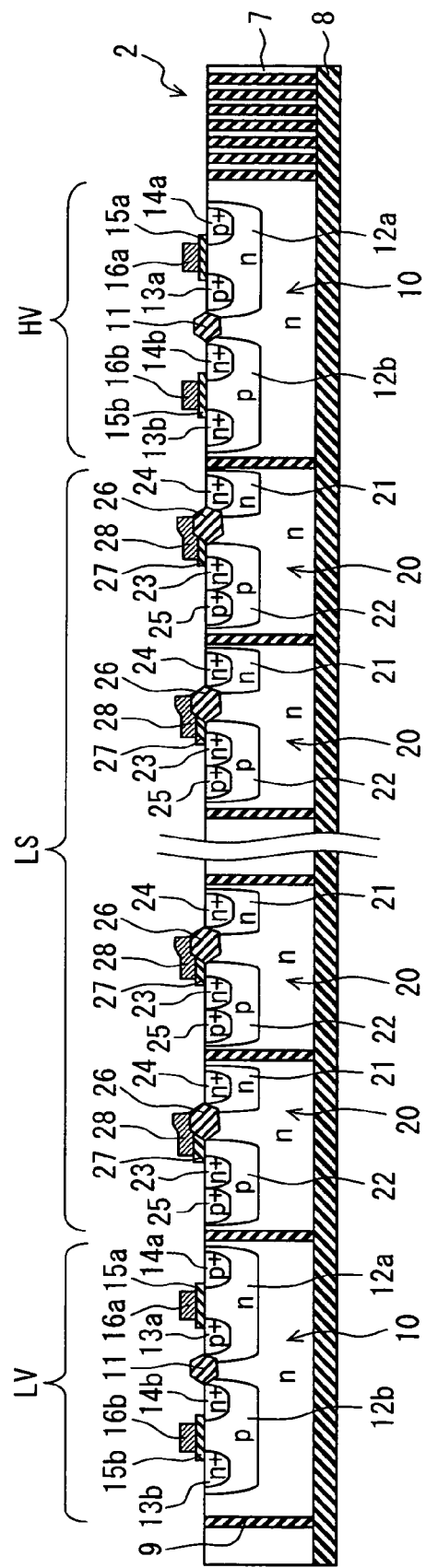
FIG. 2 is a cross sectional view showing a skeleton constitution of a semiconductor chip in the semiconductor device shown in FIG. 1.
Figure 3:
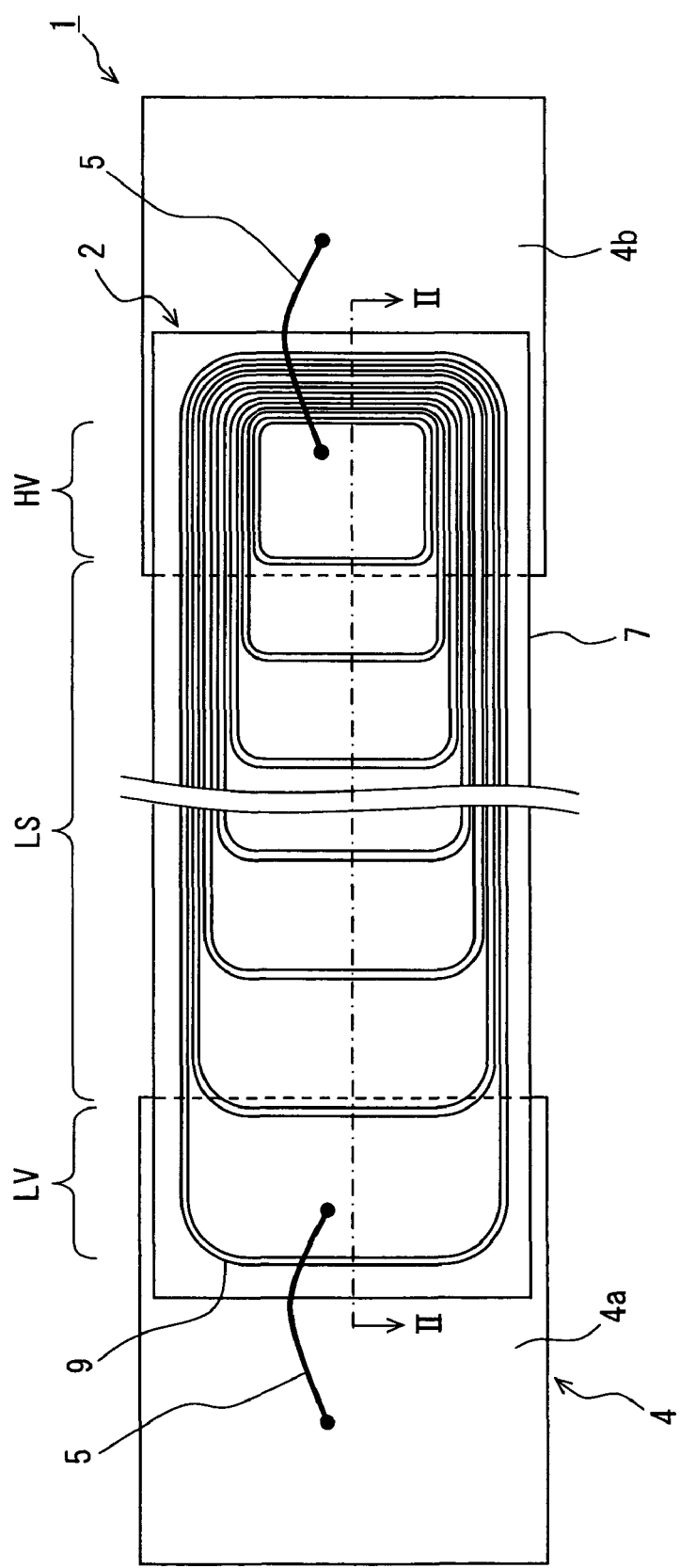
FIG. 3 is a plan view seeing from an upside of the semiconductor device shown in FIG. 1.

FIG. 1 is a cross sectional view showing a skeleton constitution of a semiconductor device according to a first embodiment. FIG. 2 is a cross sectional view showing a skeleton constitution of a semiconductor chip of the semiconductor device in FIG. 1. FIG. 3 is a layout diagram showing the semiconductor device shown in FIG. 1 seeing from an upper side. Here, in FIG. 3, a seal resin is not shown. Further, FIG. 2 corresponds to a cross sectional view taken along line II-II in FIG. 3.

A thickness direction of a semiconductor layer is simply defined as a thickness direction, and a direction perpendicular to the thickness direction is simply defined as a vertical direction.

As shown in FIG. 1, in the semiconductor device 1 of the present embodiment, a semiconductor chip 2 for providing a HVIC is fixed to a lead 4 through an insulation member 3. The HVIC on the semiconductor chip 2 has a certain portion, which is electrically coupled with the lead 4 via a bonding wire 5. A resin mold 6 covers the semiconductor chip 2, the insulation member 3, the bonding wire 5 and a part of the lead 4.

The semiconductor chip 2 is formed such that a support substrate is removed from a SOI substrate, which includes the support substrate, an insulation layer and a semiconductor layer stacked in this order. Specifically, as shown in FIG. 2, the chip 2 includes the semiconductor layer 7 and the insulation layer 8, which are stacked each other. The semiconductor layer 7 is separated (i.e., isolated) with multiple insulation isolation trenches 9. The insulation isolation trench 9 may be prepared by embedding an insulation material in a trench, which penetrates a principal surface of the semiconductor layer 7, and reaches the insulation layer 8, prepared by embedding a poly crystal silicon material or a metal material in the trench through a sidewall insulation film formed on a sidewall of the trench, or prepared by a trench having a hollow portion. In the present embodiment, an insulation material is embedded in a trench. All of the insulation isolation trenches 9 have the same width along with the vertical direction.

As shown in FIGS. 2 and 3, multiple insulation isolation trenches 9 has a multi ring structure. A region between the insulation isolation trench 9 disposed on an utmost outside and the adjacent insulation isolation trench 9 disposed next to the inside of the utmost outside trench 9 provides a low potential reference circuit LV. A region inside of the insulation isolation trench 9 disposed on an utmost inside provides a high potential reference circuit HV. A region formed between the low potential reference circuit and the high potential reference circuit provides a level shift circuit LS for transmitting a signal between the low potential reference circuit and the high potential reference circuit. In the present embodiment, the low potential reference circuit LV, the high potential reference circuit HV and the level shift circuit LS are formed as a circuit portion in the semiconductor layer 7.

The low potential reference circuit LV in the semiconductor layer 7 includes a signal processing circuit such as a logic circuit driven with a small potential. These are operated with a reference potential (i.e., ground potential) of zero voltage (i.e., the first potential). The low potential reference circuit LV is isolated from other portions of the semiconductor chip 2 with the insulation layer 8 and the insulation isolation trench 9. The low potential reference circuit LV further includes various elements such as a CMOS transistor 10 for providing the signal processing circuit. Specifically, the semiconductor layer 7 is isolated with the insulation film 11 for element isolation such as a STI film or a LOCOS oxide film. Isolated regions are defined as a N type well layer 12a and a P type well layer 12b. In the N type well layer 12a, a P+ type source region 13a and a P+ type drain region 14a are formed. In the P type well layer 12b, a N+ type source region 13b and a N+ type drain region 14b are formed. A gate electrode 16a is formed on a surface of the N type well layer 12a between the P+ type source region 13a and the P+ type drain region 14a through a gate insulation film 15a, and a gate electrode 16b is formed on a surface of the P type well layer 12b between the N+ type source region 13b and the N+ type drain region 14b through a gate insulation film 15b. Thus, a CMOS transistor 10 having a N channel MOSFET and a P channel MOSFET is formed.

Here, a wiring portion electrically coupling with the gate electrodes 16a, 16b, the source regions 13a, 13b or the drain regions 14a, 14b for providing the CMOS transistor 10, and an interlayer insulation film are formed on a principal surface side of the semiconductor layer 7. These are not shown in the drawings. A bipolar transistor, a diffusion resistor and a memory other than the CMOS transistor 10 are formed in the semiconductor layer 7. These structures are well known, and therefore, only the CMOS transistor 10 as a representative element is shown in the drawings.

The high potential reference circuit HV in the semiconductor layer 7 includes a signal processing circuit such as a logic circuit driven with a high potential. These are operated with a potential (i.e., the second potential) as a reference potential (i.e. a virtual ground potential) of, for example, 1200 volts higher than the reference potential of the low potential reference circuit LV. The high potential reference circuit HV is isolated from other portions of the semiconductor chip 2 with the insulation layer 8 and the insulation isolation trench 9. The high potential reference circuit HV also includes the CMOS transistor 10 having the same structure as that in the low potential reference circuit LV. The circuit HV further includes a bipolar transistor, a diffusion resistor and a memory, which are not shown.

A high withstand voltage LDMOS transistor 20 as a level shift element is formed in the level shift circuit LS in the semiconductor layer 7. The high withstand voltage LDMOS transistor 20 includes a N type drain region 21, a P type channel region 22 and a N+ type source region 23, which are arranged in a principal surface portion of the semiconductor layer 7. A N+ type contact region 24 is formed in a surface portion of the N type drain region 21. A, P+ type contact region 25 is formed in a surface portion of the P type channel region 22. The N type drain region 21 and the P type channel region 22 are separated from each other with a LOCOS oxide, film 26. A gate electrode 28 is arranged on the P type channel region 22 via the gate insulation film 27. Thus, the high withstand voltage LDMOS transistor 20 is formed.

Here, a wiring portion electrically coupling with the gate electrode 28, the N+ type source region 23 or the P+ type contact layer 25 or the N+ type contact layer 24, an interlayer insulation film and a protection film are formed in a principal surface side of the semiconductor layer 7. These are not shown in the drawings.

Multiple cells having the high withstand voltage LDMOS transistor 20 with the above structure are formed. Multiple cells are arranged between the low potential reference circuit LV and the high potential reference circuit HV. Cells are isolated from each other with the insulation isolation trench 9. The high withstand voltage LDMOS transistor 20 are sequentially connected in series with each other between the first potential and the second potential, as is well known. A voltage range of each high withstand voltage LDMOS transistor 20 can be changed from the second potential (i.e., 1200V) to the first potential (i.e., 0V) in order.

The insulation member 3 is made of insulation material such as glass, resin and ceramics. The insulation member 3 is arranged on a whole of a backside of the semiconductor layer 7 so as to be opposite to the circuit portion LV, HV, LS. The insulation member 3 may be formed by depositing insulation material on a backside surface of the semiconductor chip 2 by a CVD method or the like. Alternatively, the insulation member 3 may be a member having a plate shape with an uniform thickness, which is preliminary formed. The thickness of the insulation member 3 may be any. As described in later, since a biased potential in the insulation member 3 is generated when the semiconductor device functions, it is preferred that the thickness of the insulation member 3 is thin as much as possible although the thickness secures insulation between the semiconductor layer 7 and the lead 4. Specifically, since the biased potential is changed according to the material of the insulation member 3, i.e., a dielectric constant of the insulation member 3, the preferred thickness of the insulation member 3 is appropriately determined based on the material of the insulation member 3. In the present embodiment, the insulation member 3 is formed of a substrate (i.e., glass substrate) having a thickness equal to or smaller than 100 micrometers and made of borosilicate glass (having a dielectric constant about four). The insulation member 3 is fixed to and bonded with a whole of a backside (i.e., a backside as a contact surface of the semiconductor layer 7) of the insulation layer 8 of the semiconductor chip 2.

The lead 4 corresponds to a conductive member. The semiconductor chip 2 is mounted on the lead 4. Further, the lead 4 functions as a terminal for electrically coupling the circuit portion such as the HVIC formed in the semiconductor chip 2 and an external circuit of the semiconductor device 1. In the present embodiment, the lead 4 includes the first lead 4a for applying the reference potential to the low potential reference circuit LV and the second lead 4b for applying the reference potential to the high potential reference circuit HV. These lead 4a, 4b are electrically separated by removing an unwanted part of a lead frame, which is prepared by processing a metal plate, after sealed with the resin mold 6. Here, the lead 4a corresponds to the first conductive member, and the second lead 4b corresponds to the second conductive member.

As shown in FIG. 1, the lead 4 is arranged under the semiconductor chip 2 via the insulation member 3. The first lead 4a is opposite to at leas t a part of the low potential reference circuit LV. The second lead 4b is opposite to at least a part of the high potential reference circuit HV. In the present embodiment, as shown in FIG. 3, the first lead 4a is designed to insert into a level shift circuit LS side by a predetermined distance from the insulation isolation trench 9, which separates the low potential reference circuit LV and the level shift circuit LS. Further, the second lead 4b is also designed to insert into a level shift circuit LS side by a predetermined distance from the insulation isolation trench 9, which separates the high potential reference circuit HV and the level shift circuit LS. Thus, by designing the lead 4 to insert by the predetermined distance, the first lead 4a is opposite to almost a whole of the low potential reference circuit LV, and the second lead 4b is opposite to almost a whole of the high potential reference circuit HV even if a position misalignment occurs when the semiconductor chip 2 is mounted on the lead 4.

Further, in the present embodiment, the width of each of the first and second leads 4a, 4b is wider than the width of the semiconductor chip 2. According to this point, the first lead 4a is opposite to almost a whole of the low potential reference circuit LV, and the second lead 4b is opposite to almost a whole of the high potential reference circuit HV even if a position misalignment occurs when the semiconductor chip 2 is mounted on the lead 4. Alternatively, the width of each of the first and second leads 4a, 4b may be equalized to the width of each of the low potential reference circuit LV and the high potential reference circuit HV. In this case, an area of each of the first and second leads 4a, 4b, which is opposite to a region other than the low potential reference circuit LV and the high potential reference circuit HV, can be reduced as much as possible. Specifically, multiple insulation isolation trenches 9 are formed around the high potential reference circuit HV. A region between multiple insulation isolation trenches 9 provides the level shift circuit LS or the low potential reference circuit LV. Accordingly, when the width of the second lead 4b is equalized to the width of the high potential reference circuit HV, and the second lead 4b is fixed to a position, which corresponds to the high potential reference circuit HV, these structure is effective for reducing an area opposite to a region having a different potential with regard to the second lead 4b.

Figure 4:
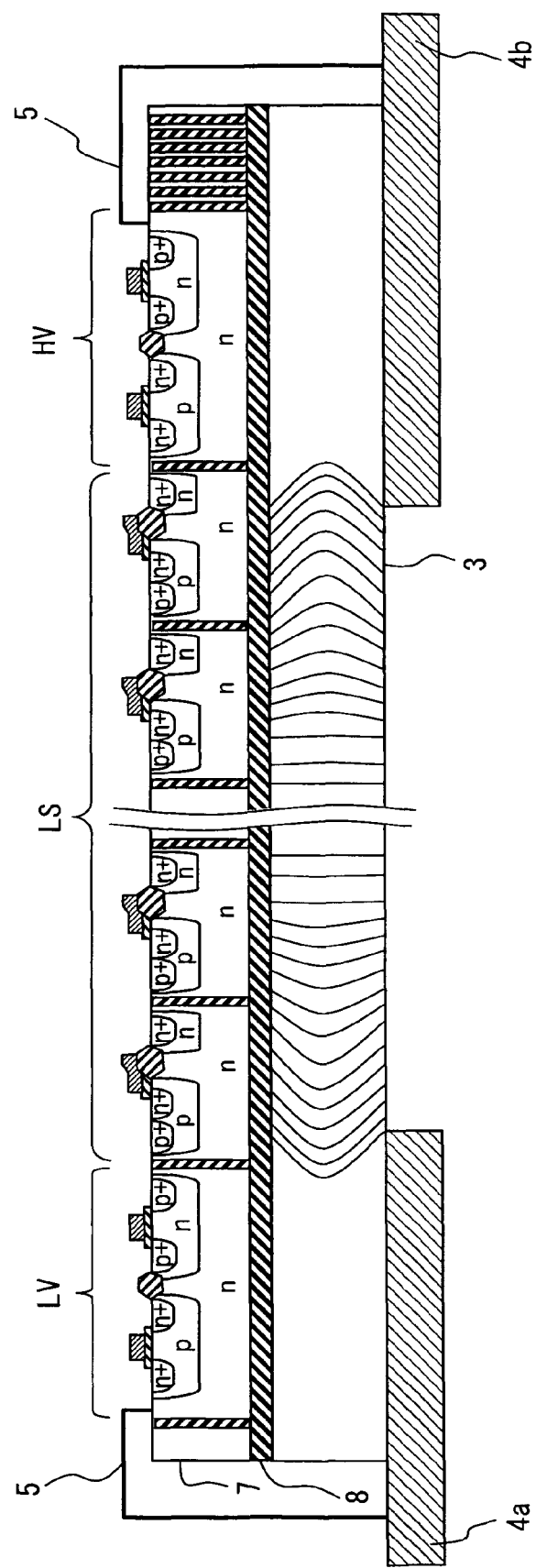
FIG. 4 is a pattern diagram showing an equipotential distribution in an insulation member in the semiconductor device shown in FIGS. 1 to 3.

The first lead 4a is electrically coupled with a line (not shown), which applies the reference potential of the low potential reference circuit LV via the bonding wire 5. The second lead 4b is electrically coupled with a line (not shown), which applies the reference potential of the high potential reference circuit HV via the bonding wire 5. Here, as shown in FIG. 4, the reference potential of the low potential reference circuit LV is applied to a N type region below the low potential reference circuit LV. The reference potential of the high potential reference circuit HV is applied to a N type region below the high potential reference circuit HV.

The resin mold 6 is made of insulation material. The resin mold 6 seals and covers the semiconductor chip 2, the insulation member 3, the bonding wire 5 and a part of the lead 4 (including a connection portion with the bonding wire). In the present embodiment, the resin mold 6 is formed by a transfer mold method.

In the semiconductor device 1 having the above structure, the first lead 4a is opposite to an almost whole of the low potential reference circuit LV, and the second lead 4b is opposite to an almost whole of the high potential reference circuit HV. Further, the first lead 4a is coupled with the line, which applies the reference potential of the low potential reference circuit LV, via the bonding wire 5. The second lead 4b is coupled with the line, which applies the reference potential of the high potential reference circuit HV, via the bonding wire 5. Accordingly, a portion of the insulation member 3 disposed below the low potential reference circuit LV is sandwiched between the same potential portions when the low potential reference circuit LV and the first lead 4a have the same potential. Similarly, a portion of the insulation member 3 disposed below the high potential reference circuit HV is sandwiched between the same potential portions when the high potential reference circuit HV and the second lead 4b have the same potential.

Accordingly, it is possible to preclude a potential difference between both ends of a parasitic capacitor formed in the semiconductor device 1, and therefore, a capacitance is cancelled. Thus, generation of a displacement current generated by a dv/dt surge for charging and discharging a parasitic capacitor is prevented. Further, it is possible to prevent malfunction of a circuit.

In case of the above structure, an electric field is generated in the insulation member 3 between the high potential reference circuit HV and the low potential reference circuit LV according to a potential difference the high potential reference circuit HV side and the low potential reference circuit LV side. FIG. 4 is a pattern diagram showing an equipotential distribution in the insulation member 3 in the above described semiconductor device 1. As shown in FIG. 4, the equipotential distribution in the insulation member 3 is not always a parallel distribution from the high potential reference circuit HV side to the low potential reference circuit LV side, but has a potential such that the easier generation of the bias, the nearer the high potential reference circuit HV or the nearer the low potential reference circuit LV. Because of the biased potential, as if a parasitic capacitance is formed between the high potential reference circuit HV and a portion of the biased potential and between the low potential reference circuit LV and a portion of the biased potential, the parasitic capacitor may provide a displacement current.

This biased potential depends on the dielectric constant and the thickness of the insulation member 3. Specifically, the larger the biased potential, the higher the dielectric constant or the thicker the thickness of the insulation member 3. Since the dielectric constant of the insulation member 3 is determined primarily by the material of the insulation member 3, the dielectric constant is set when the material of the insulation member 3 is selected. However, the thickness can be a changeable parameter appropriately. Accordingly, it is preferable to thin the thickness of the insulation member 3 in order to restrict the displacement current.

The larger the biased potential, the longer the distance between adjacent leads, i.e., in the present embodiment, the longer the distance between the first lead 4a and the second lead 4b. In the present embodiment, both of the first lead 4a and the second lead 4b are inserted into the level shift circuit LS side by a predetermined distance. Thus, even if position misalignment occurs when the semiconductor chip 2 is mounted on the lead 4, the first lead 4a is opposite to almost a whole of the low potential reference circuit LV, and the second lead 4b is opposite to almost a whole of the high potential reference circuit HV. Accordingly, the biased potential is restricted, and therefore, the displacement current is reduced, compared with a case where the first lead 4a is opposite to only a part of the low potential reference circuit LV, and the second lead 4b is opposite to only a part of the high potential reference circuit HV, so that the distance between the first lead 4a and the second lead 4b is longer than that in the present embodiment.

Figure 5A:
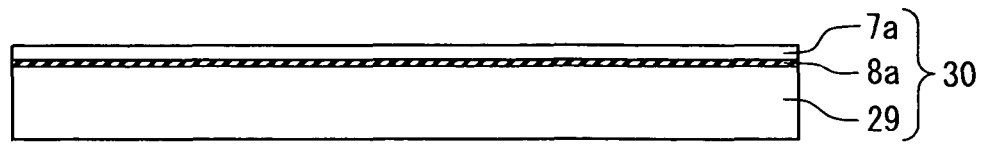
FIGS. 5A to 5D are cross sectional views showing a manufacturing process of the semiconductor device shown in FIG. 1.
Figure 5B:
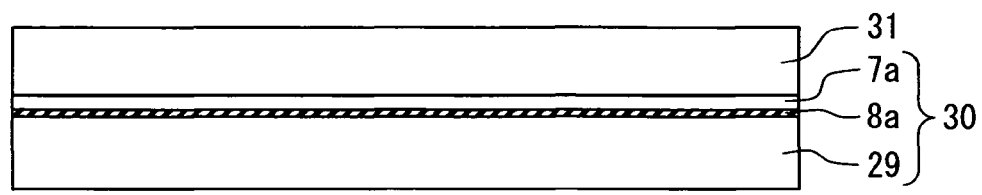
Figure 5C:
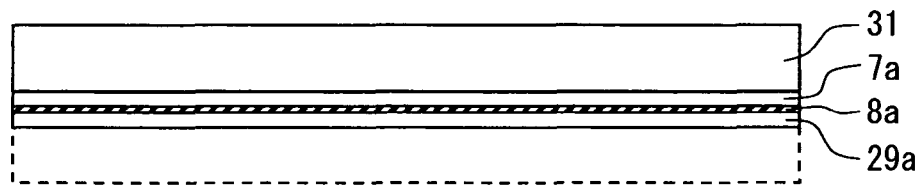
Figure 5D:
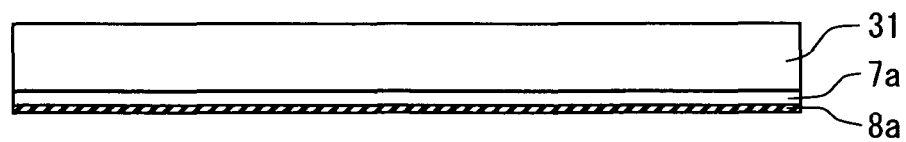
Figure 6A:
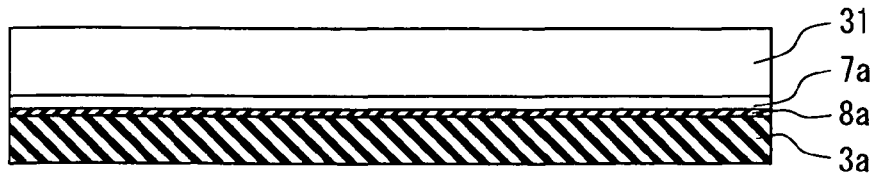
FIGS. 6A to 6E are cross sectional views showing the manufacturing process after the step in FIG. 5D.
Figure 6B:
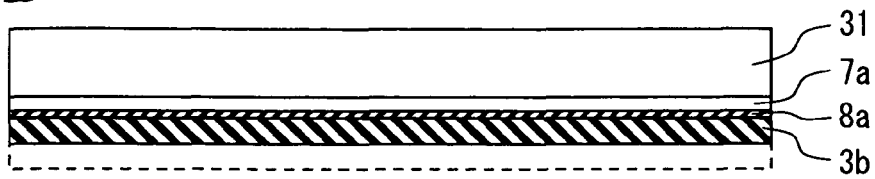
Figure 6C:
Figure 6D:
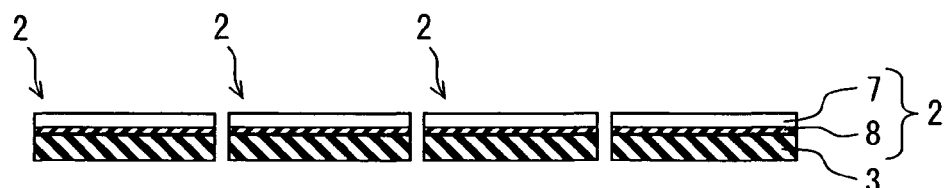
Figure 6E:
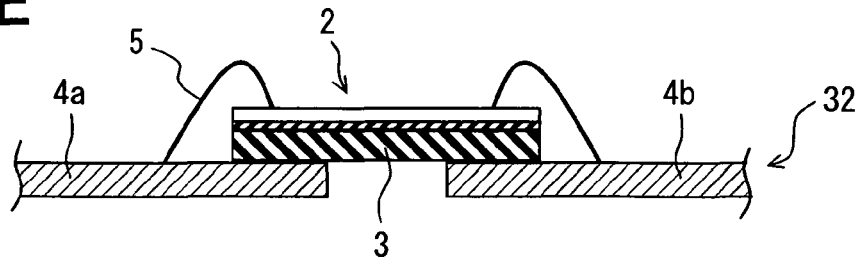

Next, a manufacturing method of the above semiconductor device 1 will be explained. FIGS. 5A to 5D are cross sectional views showing a manufacturing process of the semiconductor device shown in FIG. 1. FIG. 5A shows a state that a circuit portion forming step in a semiconductor layer is completed, FIG. 5B shows a state that a step for bonding a support member is completed, FIG. 5C shows a state that a cutting step in a removing process of a support substrate is completed, and FIG. 5D shows a state that an etching step in the removing process of the support substrate is completed. FIGS. 6A to 6E are cross sectional views showing the manufacturing process after the step in FIG. 5D. FIG. 6A shows a state that a step for fixing the insulation member is completed, FIG. 6B shows a state that a step for cutting the insulation member is completed, FIG. 6C shows a state that a step for removing the support member is completed, FIG. 6D shows a state that a dicing step is completed, and FIG. 6E shows a state that a step for mounting a chip on a lead and for coupling electrically is completed. Here, in FIGS. 5A to 5D, and 6A to 6E, the circuit portion HV, LV, LS (and their constitution), the insulation isolation trench 9, the wiring portion and the interlayer insulation film are not shown.

First, as shown in FIG. 5A, the SOI substrate 30 is prepared such that a silicon oxide film as the insulation layer 8a is inserted between the support substrate 29 made of single crystal silicon and the semiconductor layer 7 in which an impurity such as boron is doped. In the present embodiment, the thickness of the support substrate is 725 micrometers, the thickness of the semiconductor layer 7a is 15 micrometers, and the thickness of the insulation layer 8a is 8 micrometers. The semiconductor layer 7a and the insulation layer 8a are in a wafer state. After dicing, they provide the semiconductor layer 7 and the insulation layer 8, respectively.

With using a conventional semiconductor process, the above described insulation isolation trench 9 and the low potential reference circuit LV, the high potential reference circuit HV and the level shift circuit LS as the circuit portion are formed in a principal surface portion of the semiconductor layer 7a in the SOI substrate 30. The insulation isolation trench 9 or the circuit portion may be formed firstly. Preferably, in view of the element isolation, it is preferable to form the insulation isolation trench 9 firstly. When the circuit portion LV, HV, LS is formed, the wiring portion, the interlayer insulation film and the protection film are formed on the principal surface of the semiconductor layer 7a.

After the circuit portion LV, HV, LS is formed in the semiconductor layer 7a, if necessary, as shown in FIG. 5B, the support member 31 having a plate shape and made of glass or resin is bonded in order to cover a whole of a principal surface of the semiconductor layer 7a (specifically, to cover a whole of the protection film made of silicon nitride film, for example). Thus, the rigidity of the SOI substrate 30 is increased, and therefore, the semiconductor layer 7a and the like are protected from being broken when the support substrate 29 is removed in a later step. In the present embodiment, a glass plate as the support substrate 31 is bonded with adhesive.

Then, under a condition that the support substrate 31 is bonded, as shown in FIG. 5C, the support substrate 29 is mechanically cut and removed by a predetermined thickness from a backside.

Here, a step for removing the support substrate 29 may be performed only by cutting. However, since the surface (the backside surface) of the insulation layer 8a has concavities and convexities, and the insulation layer 8a made of a silicon oxide film is harder than the support substrate 29 made of silicon, silicon material of the support substrate 29 may remain in the concavities of the surface of the insulation layer 8a. When the silicon material remains in the low potential reference circuit LV and the high potential reference circuit HV, the silicon material may provide a transmission passage of the displacement current.

In the present embodiment, firstly, the support substrate 29 is thinned in the cutting step so as to be equal to or thinner than 20 micrometers. After that, the remained support substrate 29a is completely removed in an etching step with using the insulation layer 8a as an etching stopper, as shown in FIG. 5D. Thus, the silicon material disposed in the concavities of the surface of the insulation layer 8a is removed, and therefore, the silicon material is prevented from remaining. Here, the etching step may be performed by a wet etching method or a dry etching method. An etchant or an etching gas for etching the support substrate 29 selectively with respect to the insulation layer 8a may be selected appropriately. For example, with using mixed acid (e.g., mixture of nitric acid, hydrochloric acid, hydrofluoric acid and sulphuric acid), the remained support substrate 29a is removed by a spin etching method. Thus, the insulation layer 8a is exposed. Thus, the support substrate 29 is removed, and the whole of the backside surface of the insulation layer 8a is exposed.

Next, as shown in FIG. 6A, the insulation member 3a is fixed to the backside so as to cover the whole of the backside surface of the exposed insulation layer 8a. Specifically, the insulation member 3a is fixed to the backside of the semiconductor layer 7a. The insulation member 3a may be fixed by various conventional methods in accordance with the material of the insulation member 3a. In the present embodiment, a substrate as the insulation member 3a made of borosilicate glass is bonded to and fixed to the backside of the insulation layer 8a through an adhesive film not shown. Here, the insulation member 3a provides the insulation member 3 after dicing.

Here, as described above, the thickness of the insulation member 3 in the semiconductor device 1 is preferably thin in order to restrict the displacement current in a range for securing insulation performance between the semiconductor layer 7 and the lead 4. Accordingly, the insulation member 3 having a predetermined thickness may be fixed to the backside of the insulation layer 8a in order to restrict the displacement current. Since the thickness of the insulation member 3 is thin, the insulation member 3 may be damaged till the member 3 is fixed.

Thus, in the present embodiment, the insulation member 3a has a thickness thicker than the insulation member 3. After the insulation member 3a is bonded to the backside of the insulation layer 8a, as shown in FIG. 6B, the insulation member 3a is cut. Thus, the cut insulation member 3b has a preferable predetermined thickness for the insulation member 3.

Here, the insulation member 3 may be formed such that liquid insulation material such as resin or SOG (spin on glass) may be applied to the backside of the insulation layer 8a with using a spin coater. In this case, the liquid resin may be PIQ (poly imide), or resist, mold resin (epoxy resin or the like). In order to be a predetermined thickness, it is possible to apply multiple times. Further, the insulation member 3 may be formed as a deposition film of an insulation film (e.g., an oxide film or a nitride film) by a CVD method. Thus, when the insulation member 3 is formed by a deposition method (including an applying method), the thickness can be controlled to be a predetermined thickness. It is not necessary to cut the insulation member 3.

Next, the adhesive force of the adhesive is reduced by a light irradiation method with using ultra violet light, by application of heat, or with using organic solvent. As shown in FIG. 6C, the support substrate 31 is removed from the semiconductor layer 7a. Here, when the insulation member 3b having a predetermined thickness is fixed without cutting the insulation member 3a, the support substrate 31 may be removed after the insulation member 3b is fixed.

The integrated semiconductor layer 7a, the insulation layer 8a and the insulation member 3b are diced to be a predetermined chip shape including the low potential reference circuit LV, the high potential reference circuit HV and the level shift circuit LS, which are disposed in each chip. Thus, as shown in FIG. 6D, the semiconductor chip 2 in which the insulation member 3 is fixed to the backside of the insulation layer 8 is obtained.

Next, as shown in FIG. 6E, the semiconductor chip 2 with the fixed insulation member 3 is fixed to (i.e., mounted on) the lead frame 32 including the first and second leads 4a, 4b with using the backside of the insulation member 3 as a contact surface such that the first lead 4a is opposite to the low potential reference circuit LV, and the second lead 4b is opposite to the high potential reference circuit HV. Further, with using the bonding wire 5, the first lead 4a is electrically coupled with the line (not shown) for applying the reference potential of the low potential reference circuit LV, and the second lead 4b is electrically coupled with the line (not shown) for applying the reference potential of the high potential reference circuit HV.

The semiconductor chip 2 mounted on the lead frame 32 and electrically coupled with the lead 4a, 4b via the bonding wire 5 is arranged in a transfer molding apparatus, and then, the mold resin 6 is formed. Specifically, the lead frame 32 bonded to the chip 2 is arranged in a mold, and then, a resin tablet including epoxy resin is poured into the mold. The temperature is increased so that the resin has fluidity, and the fluent resin is pressured and fed. Thus, the mold forming is performed. After the mold resin 6 is formed, the unwanted part (i.e., a connection part) of the lead frame 32 exposed from the resin mold 6 is removed, so that the first lead 4a is electrically separated from the second lead 4b. Thus, the semiconductor device 1 shown in FIG. 1 is completed.

Thus, in the present embodiment, the semiconductor device 1 is obtained with using the SOI substrate 30.

In the present embodiment, the support member 31 is removed after the insulation member 3b is fixed to the backside of the insulation layer 8a and before dicing. The support member 31 may be removed after dicing. In this case, the support member 31 may be diced. However, as described in the present embodiment, when the support member 31 is removed before dicing, the support member 31 can be reused. Here, when the support member 31 is not bonded, it is not necessary to perform a step for removing the support member 31.

Further, in the present embodiment, after the insulation member 3a is bonded, the insulation member 3b is cut so that the insulation member 3b having a predetermined thickness is formed. However, the insulation member 3b, which is preliminary processed to have the predetermined thickness, may be bonded.

Figure 7:
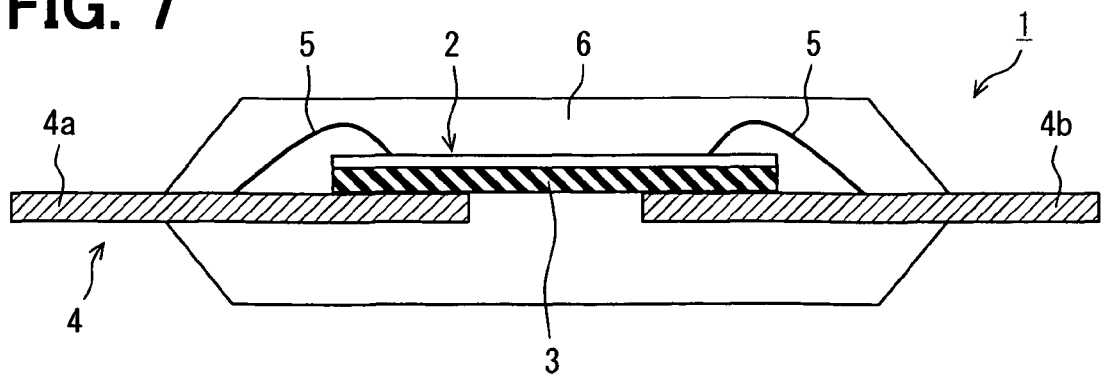
FIG. 7 is a cross sectional view showing a modification example of the semiconductor device.

In the present embodiment, the insulation layer 8a of the SOI substrate 30 remains. Specifically, the present embodiment provides an example that the insulation member 3a is fixed to the backside of the insulation layer 8a, and the semiconductor chip 2 includes the insulation layer 8. Alternatively, as shown in FIG. 7, when the support substrate 29 together with the insulation layer 8a are removed, the insulation member 3 may be fixed to the backside of the semiconductor layer 7. In this case, after the support substrate 29 is removed, the insulation layer 8a is selectively removed by an etching method or the like. Then, the insulation member 3a may be fixed to the backside of the exposed semiconductor layer 7a. However, as described in the present embodiment, when the insulation layer 8a for providing the SOI substrate 30 remains without being removed, the semiconductor layer 7a is protected from being contaminated until the insulation member 3a is fixed to the backside of the semiconductor layer 7a. Further, since the insulation member 3a is fixed to the insulation layer 8a, it is possible that a good fixation state is secured (for example, adhesiveness is improved), compared with a case where the insulation member 3a is fixed to the semiconductor layer 7a. FIG. 7 is a cross sectional view showing a modification example.

Figure 8:
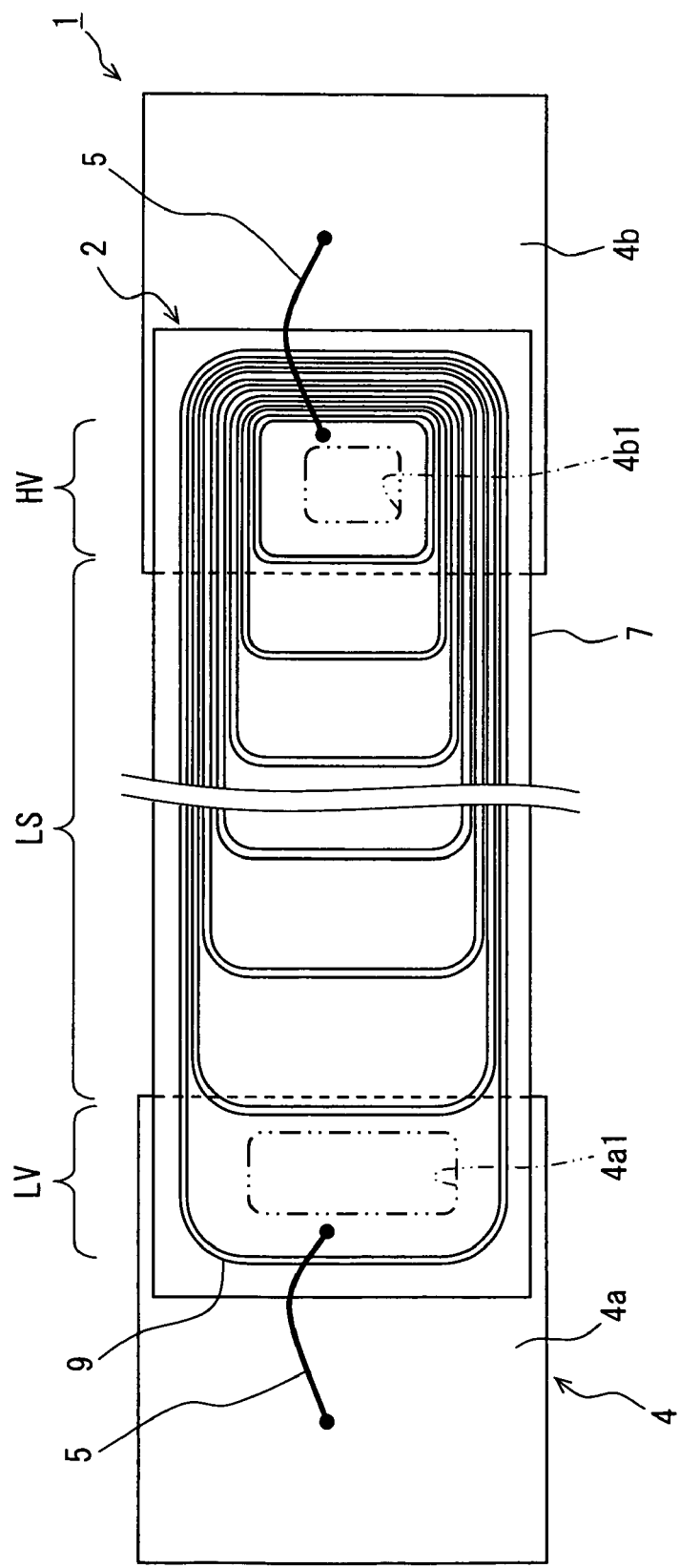
FIG. 8 is a plan view showing a modification example of the semiconductor device.

The present embodiment provides an example that the first lead 4a is opposite to almost a whole of the low potential reference circuit LV, and the second lead 4b is opposite to almost a whole of the high potential reference circuit HV. However, the first lead 4a may be arranged to be opposite to at least a part of the circuit portion LV including the low potential reference circuit LV and the high potential reference circuit HV, the part which is only disposed in the low potential reference circuit LV. The second lead 4b may be arranged to be opposite to at least a part of the circuit portion HV including the low potential reference circuit LV and the high potential reference circuit HV, the part which is only disposed in the high potential reference circuit HV. Accordingly, the first lead 4a may be opposite to only a part of the low potential reference circuit LV, and the second lead 4b may be opposite to only a part of the high potential reference circuit HV. In this case, as described above, the longer the distance between the first lead 4a and the second lead 4b, the larger the bias of the potential. Thus, as shown in FIG. 8, for example, it is preferable to have the lead 4a, 4b with a ring shape. Here, the reference numerals 4a1, 4b1 represent hollow portions in the leads 4a, 4b, respectively. The hollow portions 4a1, 4b1 correspond to center portions of the circuit portion LV, HV, respectively. The leads 4a, 4b are opposite to periphery regions of the circuit portion LV, HV surrounding the center portions, respectively. FIG. 8 is a plan view showing a modification example, and corresponds to FIG. 3. However, as shown in FIG. 3, when each lead 4a, 4b is opposite to almost a whole of the corresponding circuit portion LV, HV, and the lead 4a, 4b is coupled with a whole of a backside of the insulation member 3 corresponding to the circuit portion LV, HV, heat radiation performance for radiating heat from the semiconductor chip 2 to the lead 4 via the insulation member 3 is superior to a structure that the lead 4a, 4b is opposite to only a corresponding part of the circuit portion HV, LV. Thus, the current flowing through the structure shown in FIG. 3 is larger than the current flowing through the structure shown in FIG. 8.

Further, the present embodiment provides an example that the connection portion between the first lead 4a and the insulation member 3 is opposite to the low potential reference circuit LV and a part of the level shift circuit LS, and the connection portion between the second lead 4b and the insulation member 3 is opposite to the high potential reference circuit HV and a part of the level shift circuit LS. However, the potential in the level shift circuit LS is disposed between the first potential of the low potential reference circuit LV and the second potential of the high potential reference circuit HV. Thus, a potential difference between the level shift circuit LS and the lead 4 (i.e., the lead 4a, 4b) opposite to the circuit LS is generated. Thus, when the potential difference is generated, the displacement current may occur. Accordingly, it is preferred that the connection portion between the first lead 4a and the insulation member 3 is opposite to only the low potential reference circuit LV, and the connection portion between the second lead 4b and the insulation member 3 is opposite to only the high potential reference circuit HV.

Figure 9:
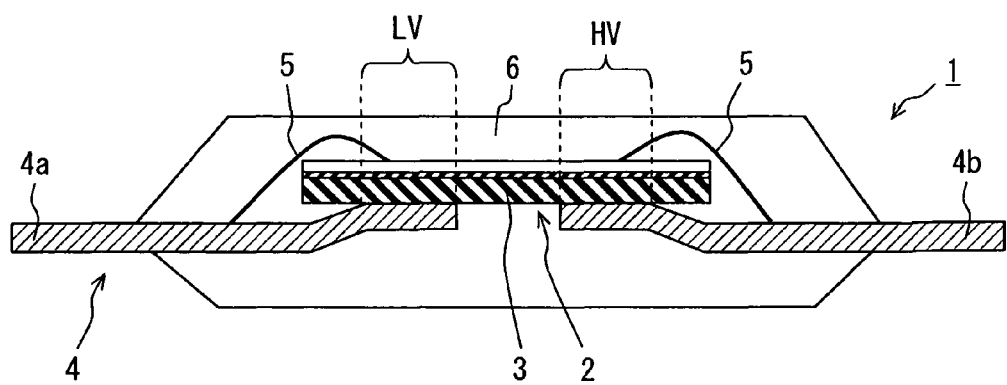
FIG. 9 is a cross sectional view showing a modification example of the semiconductor device.

Specifically, the high potential reference circuit HV is surrounded with multiple insulation isolation trenches 9 for providing the level shifty circuit LS and the low potential reference circuit LV (in FIGS. 2 and 3). Accordingly, as shown in FIG. 1, when the lead 4 is flat, the lead 4 crosses the level shift circuit LS and the low potential reference circuit LV even when the lead 4 (i.e., the second lead 4b) is retrieved to any side near the high potential reference circuit HV (See FIG. 3). However, for example, when the bent lead 4 shown in FIG. 9 is used, the connection portion between the first lead 4a and the insulation member 3 is opposite to only the low potential reference circuit LV, and the connection portion between the second lead 4b and the insulation member 3 is opposite to only the high potential reference circuit HV. Specifically, an opposite part of the lead 4 opposite to the level shift circuit LS can be arranged far from the backside of the insulation member 3. FIG. 9 is a cross sectional view showing a modification example and corresponds to FIG. 1. In the example shown in FIG. 9, the first lead 4a is also bent. Alternatively, at least the second lead 4b may have a bent structure. As described above, when the width of each of the first and second leads 4a, 4b is equalized to the width of each of the low potential reference circuit LV and the high potential reference circuit HV, and further, the bent structure shown in FIG. 9 is applied, the connection portion of the first lead 4a with the insulation member 3 can be opposite to only the low potential reference circuit LV, and the connection portion of the second lead 4b with the insulation member 3 can be opposite to only the high potential reference circuit HV.

Figure 20:
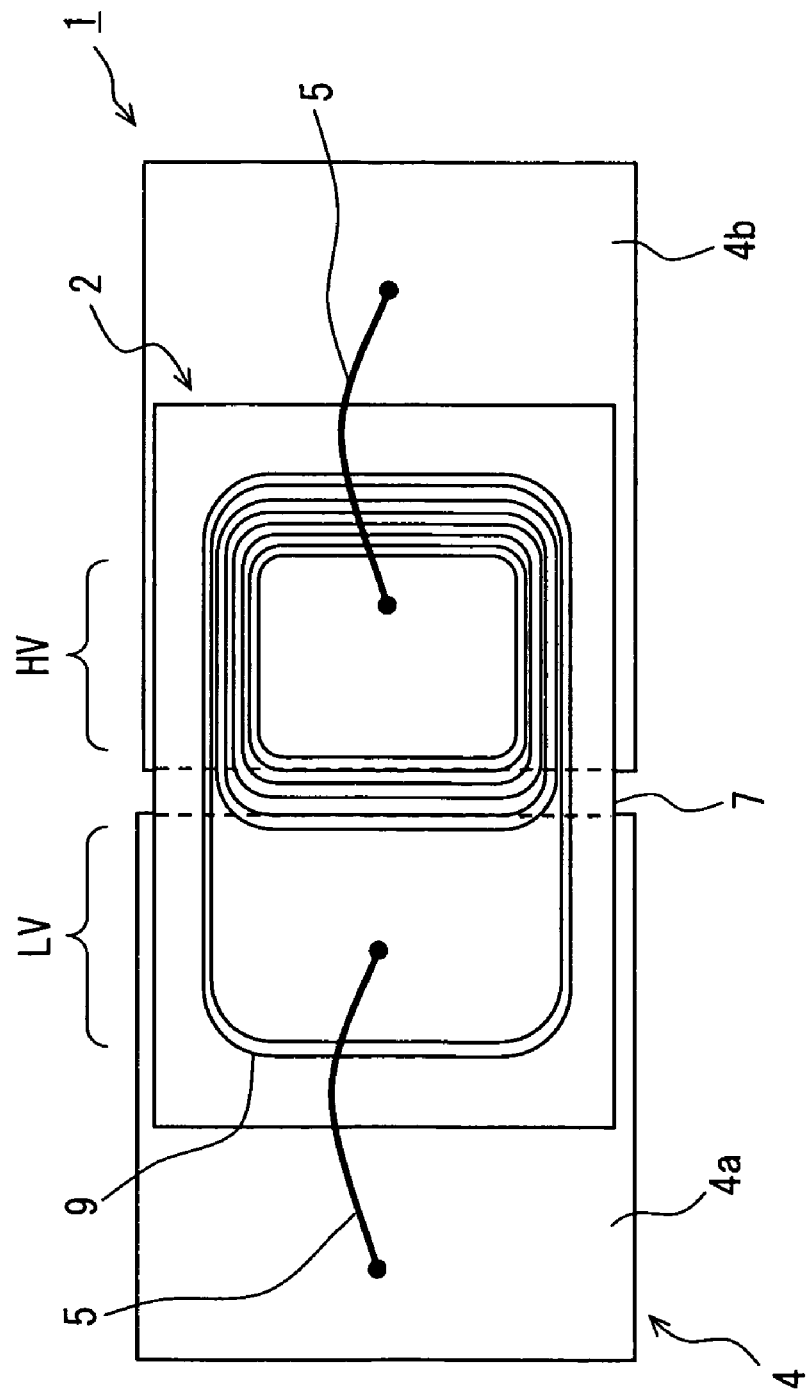
FIG. 20 is a plan view showing a semiconductor device according to a sixth embodiment.

Further, an example is shown such that the level shift circuit LS is arranged between the low potential reference circuit LV and the high potential reference circuit HV. Similarly, it is also the same as a construction such that the level shift circuit LS is not arranged between the low potential reference circuit LV and the high potential reference circuit HV, and multiple insulation isolation trenches 9 for separating electrically between the low potential reference circuit LV and the high potential reference circuit HV are formed therebetween (as shown in FIG. 20). Preferably, the connection portion of the lead 4 with the insulation member 3 is not opposite to a region partitioned with the insulation isolation trench 9 disposed between the low potential reference circuit LV and the high potential reference circuit HV.

Second Embodiment

Figure 10A:
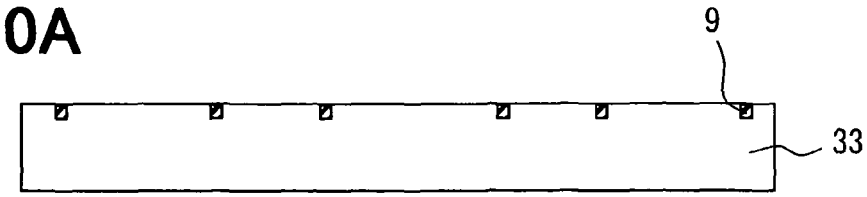
FIGS. 10A to 10E are cross sectional views showing a manufacturing process of a semiconductor device according to a second embodiment.
Figure 10B:
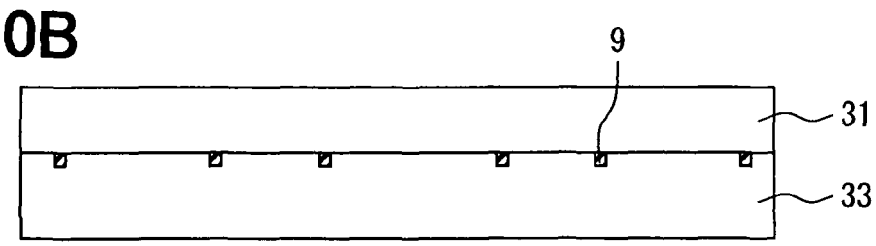
Figure 10C:
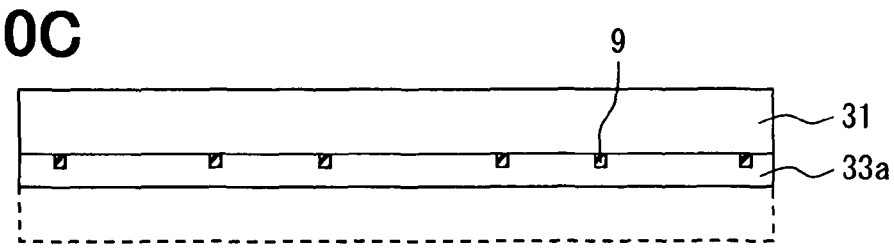
Figure 10D:
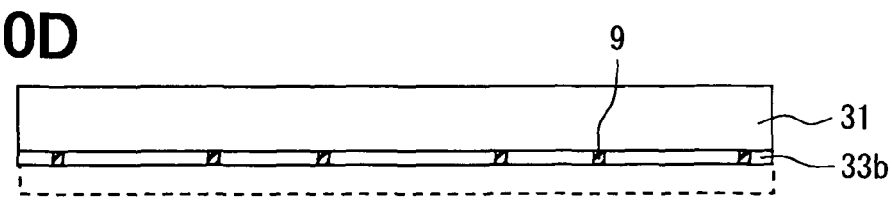
Figure 10E:
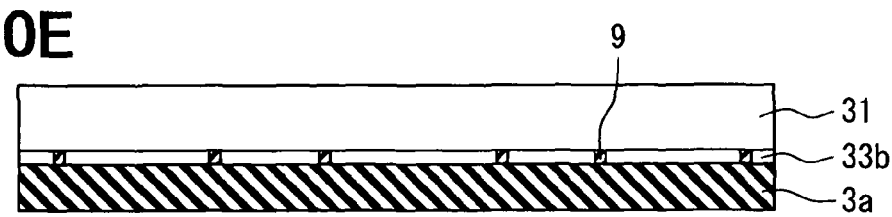

Next, a second embodiment of the present invention will be explained with reference to FIGS. 10A to 10E. FIGS. 10A to 10E are cross sectional views showing a manufacturing process of a semiconductor device according to a second embodiment, FIG. 10A shows a state that a circuit portion forming step in a semiconductor substrate is completed, FIG. 10B shows a state that a step for bonding a support member is completed, FIG. 10C shows a state that a cutting step in a thinning process of a semiconductor substrate is completed, FIG. 10D shows a state that a polishing step in the thinning process of the semiconductor substrate is completed, and FIG. 10E shows a state that a step for fixing an insulation member is completed. In FIGS. 10A to 10E, the insulation isolation trench is shown, but the circuit portion LV, HV, LS (and their constitution elements), the wiring portion and the interlayer insulation film are not shown. Further, arrangement of the insulation isolation trench shown in FIGS. 10A to 10E is different from FIGS. 2 and 3. This is because the arrangement is merely shown as a pattern diagram as a matter of convenience. Thus, actually, the insulation isolation trench shown in FIGS. 2 and 3 corresponds to the insulation isolation trench shown in FIGS. 10A to 10E.

The first embodiment provides an example that the semiconductor device 1 is formed with using the SOI substrate 30. In the present embodiment, the semiconductor device 1 is formed with using a single crystal bulk semiconductor substrate. Here, the formed semiconductor device 1 has the structure shown in the modification example (in FIG. 7) of the first embodiment. Accordingly, the difference with the semiconductor device 1 (in FIGS. 1 to 3) according to the first embodiment is such that the semiconductor chip 2 does not include the insulation layer 8. Other structure is the same.

Firstly, the single crystal bulk silicon substrate as a semiconductor layer 33 is prepared. The semiconductor layer 33 is in a wafer state. After dicing, the layer 33 provides the semiconductor layer 7 (corresponding to the semiconductor layer 7 in the first embodiment). By a conventional semiconductor process, the insulation isolation trench 9, the low potential reference circuit KV, the high potential reference circuit HV and the level shift circuit LS are formed in a principal surface portion of the semiconductor layer 33, as shown in FIG. 10A.

Here, the insulation isolation trench 9 or the circuit portion may be formed firstly. For example, when the insulation isolation trench 9 with embedded insulation material is formed, and the insulation isolation trench 9 is firstly formed, the semiconductor layer 33 is bored from the principal surface by a dry etching method by a predetermined depth so that a trench is formed without penetrating the layer 33. After a thermal oxidation film is formed, poly crystal silicon is embedded in the trench so that the insulation isolation trench 9 is formed. Then, the circuit portion LV, HV, LS is formed. On the other hand, when the circuit portion is firstly formed, in view of thermal damage to the circuit portion, the semiconductor layer 33 is bored from the principal surface by a dry etching method by a predetermined depth so that a trench is formed without penetrating the layer 33 after the circuit portion is formed. Then, an oxide film formed by a CVD method is embedded in the trench so that the insulation isolation trench 9 is formed. Here, when the circuit portion LV, HV, LS is formed, the wiring portion, the interlayer insulation film and the protection film are also formed.

After the circuit portion LV, HV, LS is formed in the semiconductor layer 33, if necessary, as shown in FIG. 10B, the support member 31 having a plate shape and made of glass or resin is bonded so as to cover a whole of the principal surface of the semiconductor layer 33 (specifically, for example, cover a protection film made of silicon nitride film). Thus, rigidity of the semiconductor layer 33 is increased. When the semiconductor layer 33 is thinned later, the semiconductor layer 33 is protected from being damaged. In the present embodiment, the glass substrate as the support member 31 is bonded with adhesive.

Then, under a condition that the support member 31 is bonded, the semiconductor layer 33 is removed from the backside thereof by a predetermined thickness so as to expose a part of the insulation isolation trench 9. Thus, the semiconductor layer 33 is thinned.

Here, the thinning of the semiconductor layer 33 may be performed by only a cutting step. However, when the layer 33 is cut, a crystal structure on a cut surface portion is damaged, so that a fracture layer is formed. In the fracture layer, crystal defects may be easily generated. The crystal defects cause a leakage current or the like.

In the present embodiment, as shown in FIG. 10C, firstly the semiconductor layer 33*a* is thinned by a cutting step so as not to expose the insulation isolation trench 9. Then, the backside of the thinned semiconductor layer 33*a* is polished by a CMP method or the like. Thus, as shown in FIG. 10D, the semiconductor layer 33*b* is thinned, the insulation isolation trench 9 is exposed, and the fracture layer is removed. When the fracture layer is removed, occurrence of poor quality or the like caused by the crystal defects is restricted. By performing this thinning, the thickness of the semiconductor layer 33*b* is equal to the thickness of the semiconductor layer 7 in the semiconductor chip 2. Alternatively, when the semiconductor layer 33*a* may be thinned to be a predetermined thickness by an etching process (e.g., an alkali etching process) instead of a polishing method, the fracture layer is removed.

Then, as shown in FIG. 10E, the insulation member 3*a* is fixed to the backside in order to cover a whole of the backside of the semiconductor layer 33*b* on which a part of the insulation isolation trench 9 is exposed. The insulation member 3*a* may be fixed by various conventional methods according to the material of the member 3*a*. In the present embodiment, a substrate as the insulation member 3*a* made of borosilicate glass is bonded to and fixed to the backside of the semiconductor layer 33*b* via an adhesive film not shown. Here, the insulation member 3*a* provides the insulation member 3 after dicing.

The process after a step for fixing the insulation member 3*a* is the same as the manufacturing process (FIG. 6A and subsequent steps) shown in the first embodiment. Accordingly, the description after the step of FIG. 10E is skipped. The obtained semiconductor device 1 provides the structure shown in FIG. 7, as described above.

Thus, the semiconductor device 1 is obtained with using the single crystal bulk silicon as the semiconductor layer 33.

Figure 11:
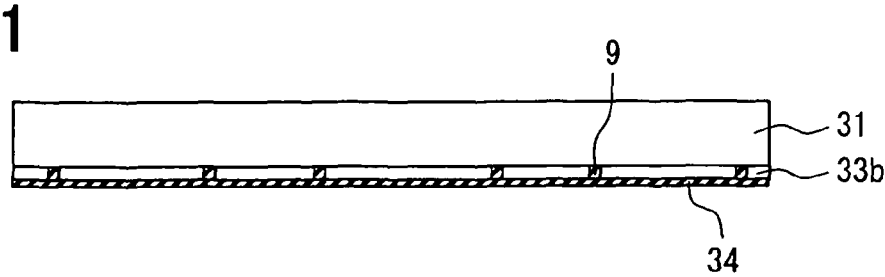
FIG. 11 is a cross sectional view showing a modification example.

The present embodiment provides an example that the insulation member 3*a* is fixed to the thinned semiconductor layer 33*b*, on which a part of the insulation isolation trench 9 is exposed. However, the insulation film 34 may be formed on the backside of the semiconductor layer 33*b* by a CVD method or the like before the insulation member 3*a* is fixed, as shown in FIG. 11. Then, the insulation member 3*a* may be fixed to the insulation film 34. Thus, when the insulation film 34 is formed on the backside of the semiconductor layer 33*b*, the semiconductor layer 33*b* is protected from being contaminated till the insulation member 3*a* is fixed to the backside of the semiconductor layer 33*b*. Further, since the insulation member 3*a* is fixed to the insulation film 34, it is possible that a good fixation state is secured (for example, adhesiveness is improved), compared with a case where the insulation member 3*a* is fixed to the semiconductor layer 33*b*. Thus, the insulation film 34 provides the same effect as the insulation layer 8*a* in the SOI substrate 30. FIG. 11 is a cross sectional view showing a modification example.

In the present embodiment, modification examples according to the first embodiment may be applied. For example, after dicing, the support member 31 may be removed. Thus, the support member 31 may be diced. However, as described in the first embodiment, when the support member 31 is removed before dicing, the support member 31 can be reused. Here, when the support member 31 is not bonded, it is not necessary to remove the support member 31.

The insulation member 3 (or 3*a*) preliminary processed to have a predetermined thickness may be bonded to the backside of the semiconductor layer 33*b*. However, when the insulation member 3*b* is cut to be a predetermined thickness after the insulation member 3*a* is bonded, the insulation member 3 is protected from being damaged till fixation is performed.

Third Embodiment

Figure 12:
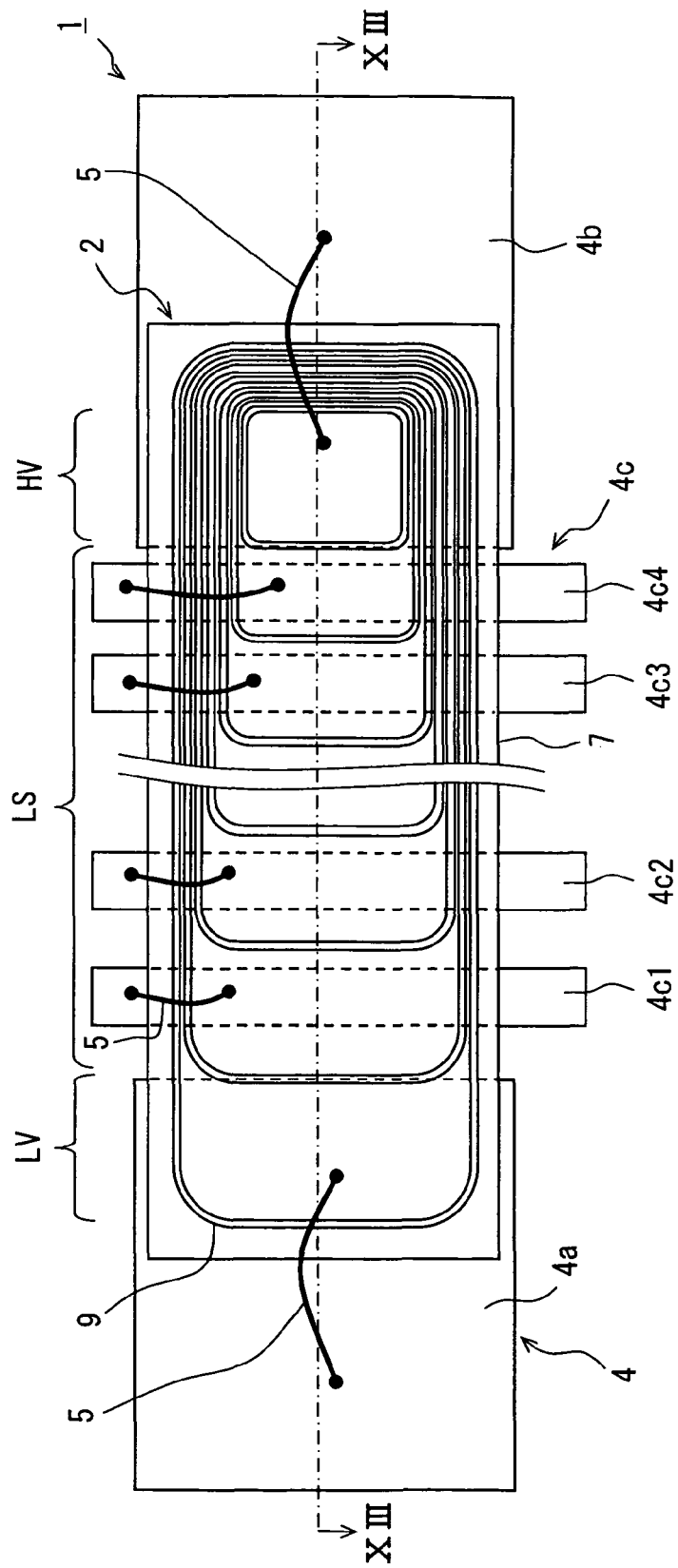
FIG. 12 is a plan view showing a semiconductor device according to a third embodiment.
Figure 13:
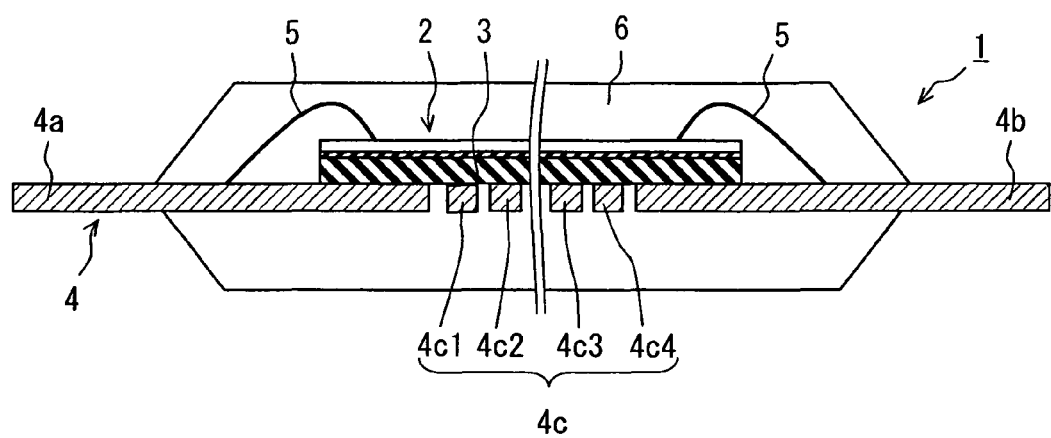
FIG. 13 is a cross sectional view showing the semiconductor device taken along line XIII-XIII in FIG. 12.
Figure 14:
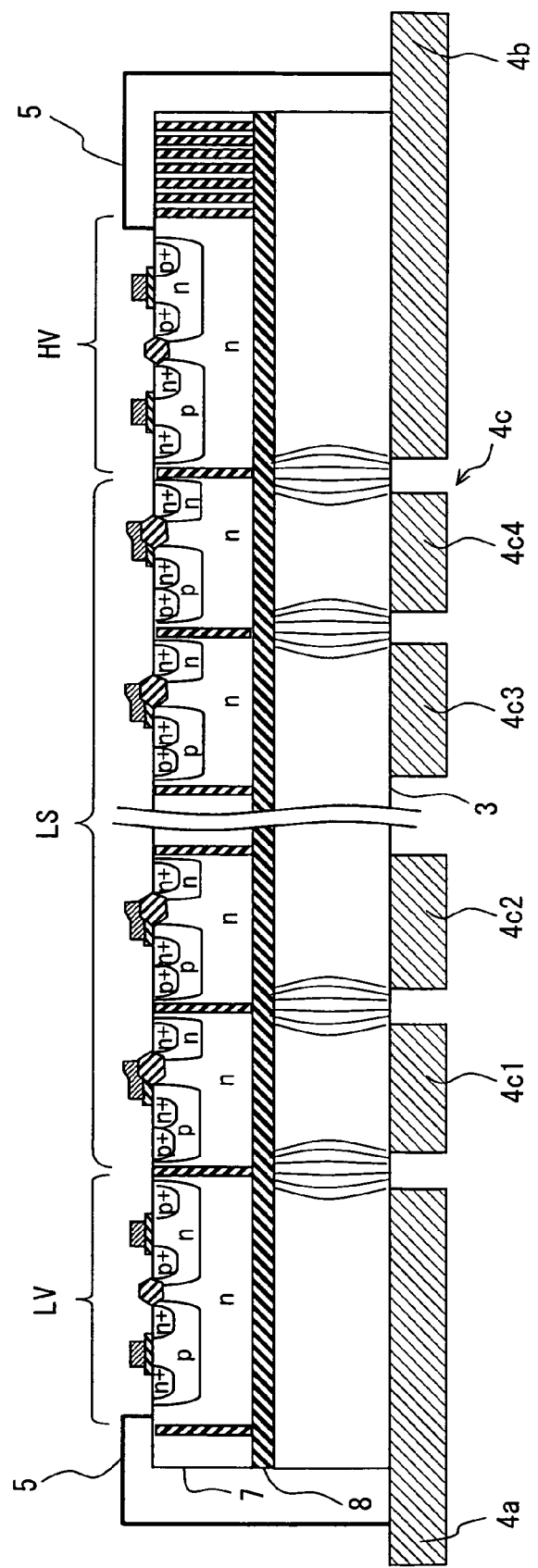
FIG. 14 is a pattern diagram showing an equipotential distribution in an insulation member in the semiconductor device shown in FIGS. 12 and 13.

Next, a third embodiment will be explained with reference to FIGS. 12 to 14. FIG. 12 is a plan view showing a skeleton constitution of a semiconductor device according to a third embodiment. FIG. 13 is a cross sectional view showing the semiconductor device taken along line XIII-XIII in FIG. 12. FIG. 14 is a pattern diagram showing an equipotential distribution in an insulation member in the semiconductor device shown in FIGS. 12 and 13. Here, FIG. 12 corresponds to FIG. 3, and FIG. 13 corresponds to FIG. 1. Further, FIG. 14 corresponds to FIG. 4. In FIGS. 12 to 14, only four third leads 4*c* (4*c*1-4*c*4) are shown as a matter of convenience.

In the first embodiment, the circuit portion LV, HV, LS is formed in the semiconductor layer 7. The first lead 4*a* is arranged to be opposite to the low potential reference circuit LV, and the second lead 4*b* is arranged to be opposite to the high potential reference circuit HV. On the other hand, in the present embodiment, as shown in FIGS. 12 and 13, the first lead 4*a* and the second lead 4*b* as the lead 4 are electrically separated. The device includes a third lead 4*c*, to which a potential different from those of the lead 4*a*, 4*b* is applied. The third lead 4*c* is arranged to be opposite to at least a part of the level shift circuit LS in the circuit portion via the insulation member 3. As shown in FIG. 13, the third lead 4*c* is electrically coupled with a certain portion of the level shift circuit LS.

Specifically, in an example shown in FIGS. 13 and 14, the third lead 4*c* is arranged to be opposite to each of multiple level shift elements for providing the level shift circuit LS. The third lead 4*c* opposite to the element via the insulation member 3 is electrically coupled with the certain portion of the level shift element so that they have the same potential. Thus, the level shift circuit LS includes multiple level shift elements, and the third lead 4*c* is arranged to be opposite to each level shift element with one-to-one relationship.

Thus, in the semiconductor device 1 according to the present embodiment, the third lead 4*c* as a third conductive member is arranged with respect to the level shift circuit LS disposed between the high potential reference circuit HV and the low potential reference circuit LV. The third lead 4*c* is electrically coupled with an opposite part of the level shift circuit LS opposite to the third lead 4*c*. Accordingly, a part of the insulation member 3 disposed below the level shift circuit LS is sandwiched between the same potential portions when the level shift circuit LS and the third lead 4*c* have almost the same potential. Thus, electric charge is not accumulated in a part of the insulation member 3 disposed between the third lead 4*c* and the opposite part of the level shift circuit LS. Thus, the displacement current cased by the dv/dt surge for charging and discharging a parasitic capacitor is restricted from occurring in a passage of a forming portion of the level shift circuit LS. Further, it is possible to prevent malfunction of a circuit.

In the semiconductor device 1 according to the present embodiment, the third lead 4*c* is arranged with respect to the level shift circuit LS disposed between the high potential reference circuit HV and the low potential reference circuit LV. The third lead 4*c* and the opposite part of the level shift circuit. LS opposite to the third lead 4*c* have the same potential between the first potential and the second potential. Accordingly, the potential difference in the insulation member 3 between adjacent lead 4 is reduced, compared with a case where the device includes only the first lead 4*a* and the second lead 4*b*. thus, the above described biased potential is reduced, and therefore, occurrence of the displacement current is restricted.

Specifically, in the present embodiment, each third lead 4*c* is arranged to be opposite to a corresponding level shift element. The third lead 4*c* is electrically coupled with the corresponding level shift element. Accordingly, the capacitance of the parasitic capacitor in a whole area of the level shift circuit LS is cancelled, compared with a case where only one third lead 4*c* is arranged to be opposite to the level shift circuit LS having multiple level shift elements. In the insulation member 3, the potential difference between adjacent lead 4 is much reduced, and as a result, as shown in FIG. 14, the bias of potential is much reduced. Thus, the occurrence of the displacement current is effectively restricted.

Here, the semiconductor device 1 can be manufactured by a manufacturing method of the semiconductor device 1 according to the first embodiment.

Figure 15:
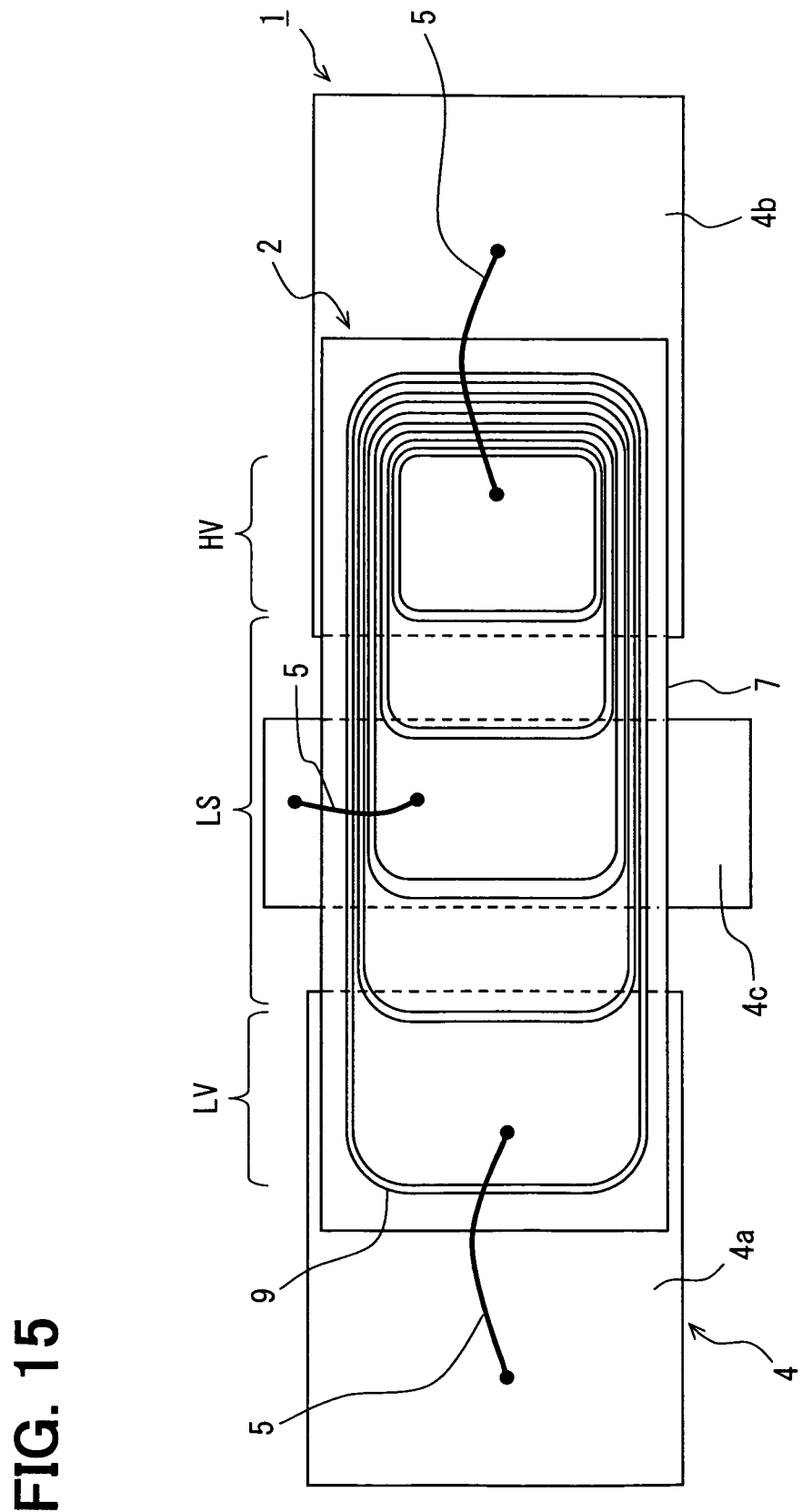
FIG. 15 is a plan view showing a modification example of the semiconductor device.

In the present embodiment, the level shift circuit LS includes multiple level shift elements. Each third lead 4*c* is arranged to be opposite to a corresponding level shift element with one-to-one relationship. Alternatively, each third lead 4*c* may be arranged to be opposite to a corresponding level shift element among only a part of multiple level shift elements with one-to-one relationship. For example, as shown in FIG. 15, the level shift circuit LS includes three level shift elements having three levels (300V, 600V and 900V), which are electrically coupled in series with each other. The third lead 4*c* is arranged to be opposite to only the level shift element (having 600V) disposed at the center of the levels shift circuit LS. The third lead 4*c* is electrically coupled with the level shift element (having 600V). In case of this structure, occurrence of the displacement current is restricted, compared with a case where the device 1 includes the level shift circuit LS, but the third lead 4*c* is not arranged. FIG. 15 is a plan view showing a modification example, and corresponds to FIG. 12.

The present embodiment provides an example that the semiconductor device 1 formed of the SOI substrate 30. Alternatively, the present embodiment may be applied to the semiconductor device 1 formed of the single crystal bulk semiconductor substrate as the semiconductor layer 33. Further, the shape and the width of the first and second leads 4a, 4b may be the same as those in the first embodiment.

Fourth Embodiment

Figure 16:
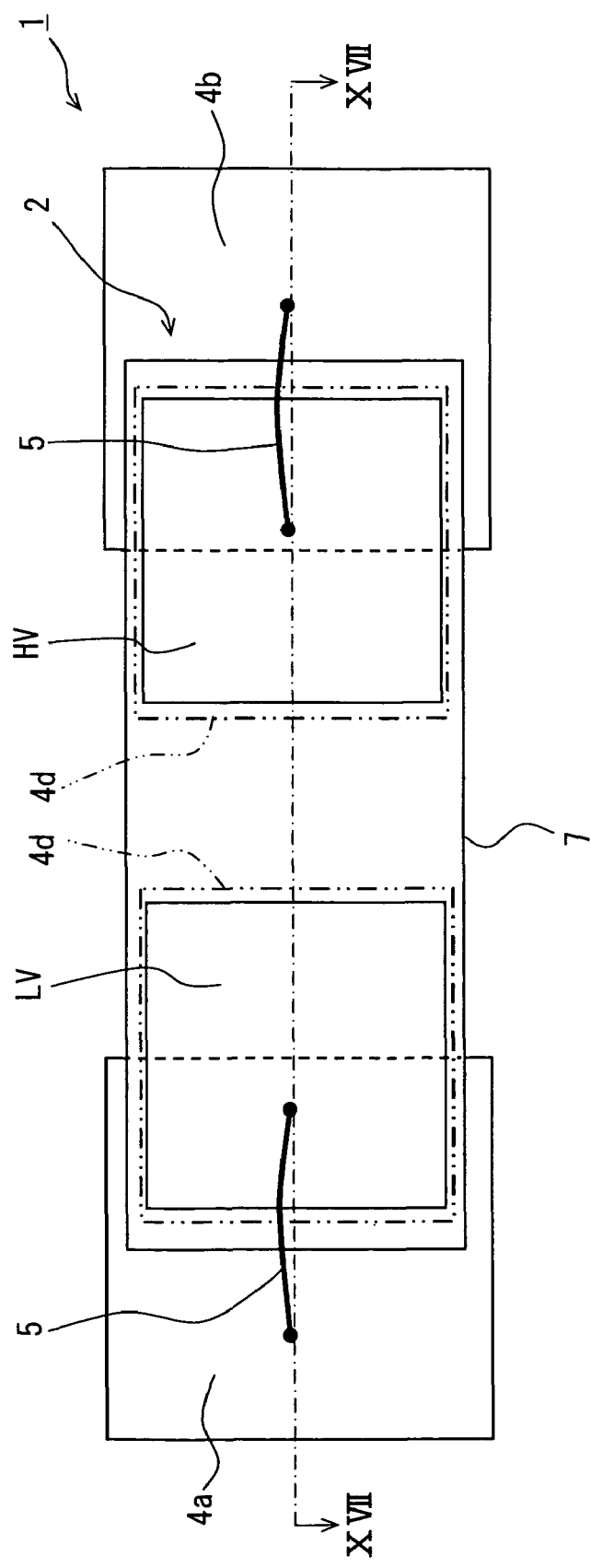
FIG. 16 is a plan view showing a skeleton constitution of a semiconductor device according to a fourth embodiment.
Figure 17:
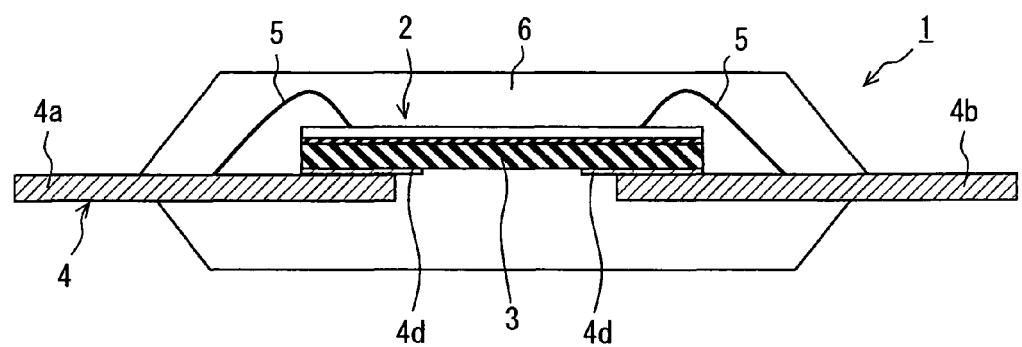
FIG. 17 is a cross sectional view showing the semiconductor device taken along line XVII-XVII in FIG. 16.

Next, a fourth embodiment of the present invention will be explained with reference to FIGS. 16 and 17. FIG. 16 is a plan view showing a skeleton constitution of a semiconductor device according to a fourth embodiment. FIG. 17 is a cross sectional view showing the device taken along line XVII-XVII in FIG. 16. FIG. 16 corresponds to FIG. 3, and the insulation isolation trench 9 is not shown so that the drawing is simplified.

The first embodiment provides an example that the semiconductor chip 2 is mounted on the lead 4 (the first lead 4a and the second lead 4b) by a die mount method to face the backside of the insulation member 3 on the lead 4. In this structure, it is necessary to position the semiconductor chip 2 including the insulation member 3 such that each lead 4a, 4b is opposite to a corresponding circuit portion with high positioning accuracy.

On the other hand, in the present embodiment, as shown in FIGS. 16 and 17, a metal film 4d (i.e., a metal electrode) made of aluminum, nickel or solder is formed on the backside of a fixed surface of the insulation member 3 with respect to the semiconductor layer 7 in accordance with the low potential reference circuit LV and the high potential reference circuit HV, respectively. The lead 4a, 4b is bonded to the metal film 4d. In the present embodiment, as shown in FIG. 16, the device 1 includes the metal film 4d opposite to almost a whole of the low potential reference circuit LV and the metal film 4d opposite to almost a whole of the high potential reference circuit HV. The lead 4a, 4b is soldered on the metal film 4d.

In the above described semiconductor device 1, a metal film is deposited on a whole of the backside surface of the insulation member 3 by a sputtering method or a plating method before the semiconductor chip 2 including the insulation member 3 is arranged on the lead frame 32 including the lead 4. After that, the metal film is patterned according to the circuit portion, so that the device 1 includes multiple parts, which are electrically separated from each other. The semiconductor chip 2 having the patterned metal film is arranged on the lead frame 32 including the lead 4. The lead 4 is bonded to a corresponding part of the metal film 4d. The semiconductor device 1 according to the present embodiment is obtained by the above process.

Thus, in the present embodiment, since the patterned metal film 4d electrically functions as a part of the lead 4 (i.e., 4a, 4b), the lead 4 (including the metal film 4d) can be arranged at a predetermined position, compared with a case where the lead 4 is fixed to the insulation member 3 without forming the metal film 4d.

Further, since the lead 4 is bonded to the corresponding metal film 4d, it is not necessary to position the semiconductor chip 2 with high positioning accuracy.

The present embodiment provides an example that the metal film 4d is formed so as to be opposite to almost a whole of each of the low potential reference circuit LV and the high potential reference circuit HV. The arrangement is not limited to the above example. The metal film 4d may be arranged to be opposite to at least a part of each of the low potential reference circuit LV and the high potential reference circuit HV.

In the present embodiment, regarding the level shift circuit LS and the third lead 4c, it is not specifically described. The metal film 4d may be arranged to be opposite to the level shift circuit LS. Specifically, in the structure having multiple level shift elements, since the distance between adjacent lead 4 becomes narrow, it is preferred that the metal film 4 is arranged in accordance with each level shift element.

The present embodiment provides an example that the semiconductor device 1 is formed of the SOI substrate 30. The present embodiment may be applied to the semiconductor device 1 formed of the single crystal bulk semiconductor substrate as the semiconductor layer 33.

Fifth Embodiment

Figure 18:
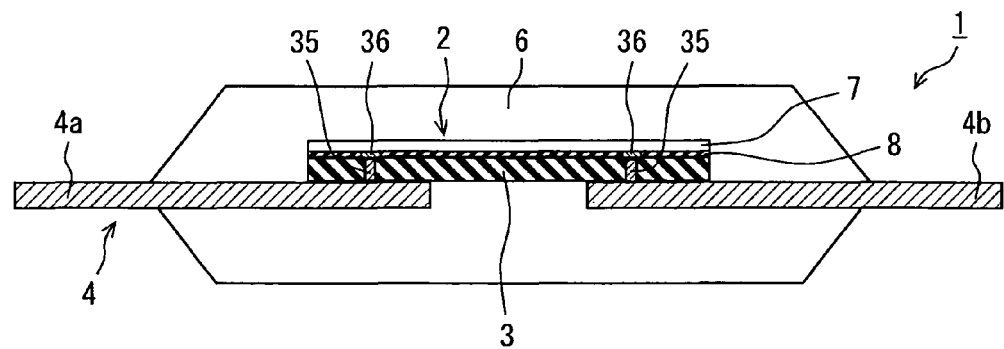
FIG. 18 is a cross sectional view showing a skeleton constitution of a semiconductor device according to a fifth embodiment.
Figure 19A:
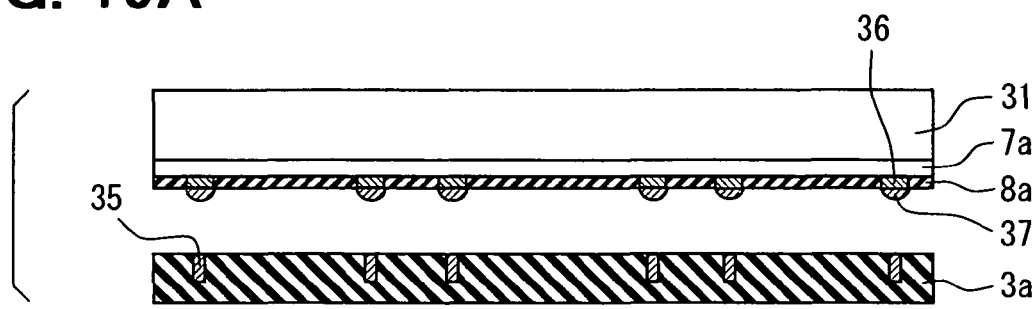
FIG. 19A to 19B are cross sectional views showing a manufacturing process of the semiconductor device shown in FIG. 18.
Figure 19B:
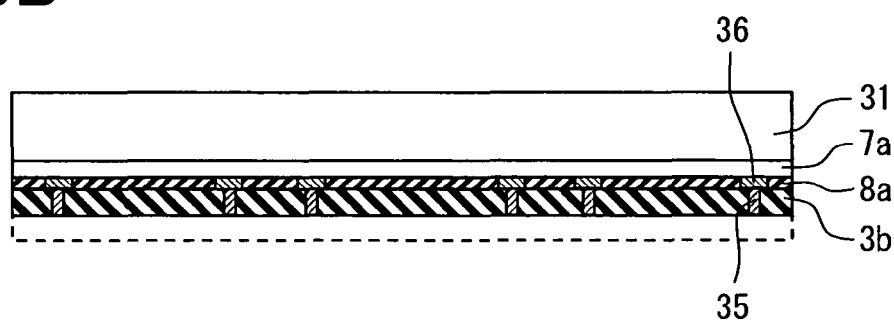

Next, a fifth embodiment of the present invention will be explained with reference to FIGS. 18 and 19A-19B. FIG. 18 is a cross sectional view showing a skeleton constitution of a semiconductor device according to a fifth embodiment. FIG. 19A to 19B are cross sectional views showing a manufacturing process of the semiconductor device shown in FIG. 18, FIG. 19A shows a state that preparation of a semiconductor layer and an insulation member bonded with a support member is completed, and FIG. 19B shows a state that a cutting step of the insulation member is completed.

The above embodiments provide an example that the first lead 4a and the region of the low potential reference circuit LV to be applied with the reference potential are electrically coupled with each other via the bonding wire 5, and the second lead 4b and the region of the high potential reference circuit HV to be applied with the reference potential are electrically, coupled with each other via the bonding wire 5. Further, the third lead 4c and the corresponding region of the level shift element are electrically coupled with each other.

However, in the present embodiment, as shown in FIG. 18, the insulation member 3 may includes a through hole electrode 35, so that each lead 4 and the corresponding part of the circuit portion are electrically coupled with each other via the through hole electrode 35. In the example shown in FIG. 18, the first lead 4a and the region of the low potential reference circuit LV to be applied with the reference potential are electrically coupled with each other via the through hole electrode 35, and the second lead 4b and the region of the high potential reference circuit HV to be applied with the reference potential are electrically coupled with each other via the through hole electrode 35. This feature provides the same effect as the above described embodiments.

Further, the bonding wire may be not necessary. Since an electrode (through hole electrode 35) is formed in the insulation member 3 itself configured to provide a passage of potential interference, the potential of the semiconductor layer 7 is much stably stabilized. Further, since the thermal conductivity of the material of the through hole electrode 35 is higher than that of the insulation member 3, the heat in the semiconductor chip 2 is effectively transmitted to the lead 4 via the through hole electrode 35, so that heat radiation performance is improved. In view of potential stability and improvement of heat radiation performance, it is preferred that the device 1 includes multiple through hole electrodes 35.

In FIG. 18, similar to the first embodiment, the semiconductor chip 2 includes the insulation layer 8, and another through hole electrode 36 is formed with respect to the through hole electrode 35. Thus, the first lead 4a and the region of the low potential reference circuit LV to be applied with the reference potential are electrically coupled with each other via the through hole electrodes 35, 36, and the second lead 4b and the region of the high potential reference circuit HV to be applied with the reference potential are electrically coupled with each other via the through hole electrodes 35, 36.

The above semiconductor device 1 can be obtained by a conventional semiconductor process. Specifically, as shown in FIG. 19A, a trench having a predetermined depth is formed in the insulation member 3a before the member 3a is bonded. Then, conductive material is embedded in the trench so that the through hole electrode 35 is formed. After the support substrate 29 is removed, the through hole electrode 36 is formed such that conductive material is embedded in the through hole of the insulation layer 8a. A bump 37 made of solder or the like and disposed on the backside of the insulation layer 8a is formed on the through hole electrode 36. Then, in a reflow process, the corresponding through hole electrodes 35, 36 are electrically and mechanically bonded to each other via the bump 37. Then, the insulation member 3a is cut from the backside thereof so as to provide the insulation member 3b having the predetermined thickness. Further, as shown in FIG. 19B, the through hole electrode 35 is exposed. The following steps are described above.

Sixth Embodiment

Next, a semiconductor device according to a sixth embodiment will be explained with reference to FIG. 20. FIG. 20 is a plan view showing the sixth embodiment.

The above embodiments provide examples that the low potential reference circuit LV, the high potential reference circuit HV and the level shift circuit LS are formed in the same semiconductor chip 2, i.e., the same semiconductor layer 7. However, in the present embodiment, a circuit for transmitting a signal between the low potential reference circuit LV, the high potential reference circuit HV is formed in another chip. Specifically, in the present embodiment, the semiconductor chip 2 includes only the low potential reference circuit LV and the high potential reference circuit HV. The semiconductor chip 2 having only the low potential reference circuit LV and the high potential reference circuit HV has a structure other than a structure that the third lead 4c is arranged just under the level shift circuit LS.

For example, as shown in FIG. 20, the semiconductor chip 2 includes only the low potential reference circuit LV and the high potential reference circuit HV. The first lead 4a is arranged to be opposite to at least a part of the low potential reference circuit LV, and the second lead 4b is arranged to be opposite to at least a part of the high potential reference circuit HV. In FIG. 20, each lead 4a, 4b is opposite to almost a whole of a corresponding circuit portion LV, HV.

Seventh Embodiment

Figure 21:
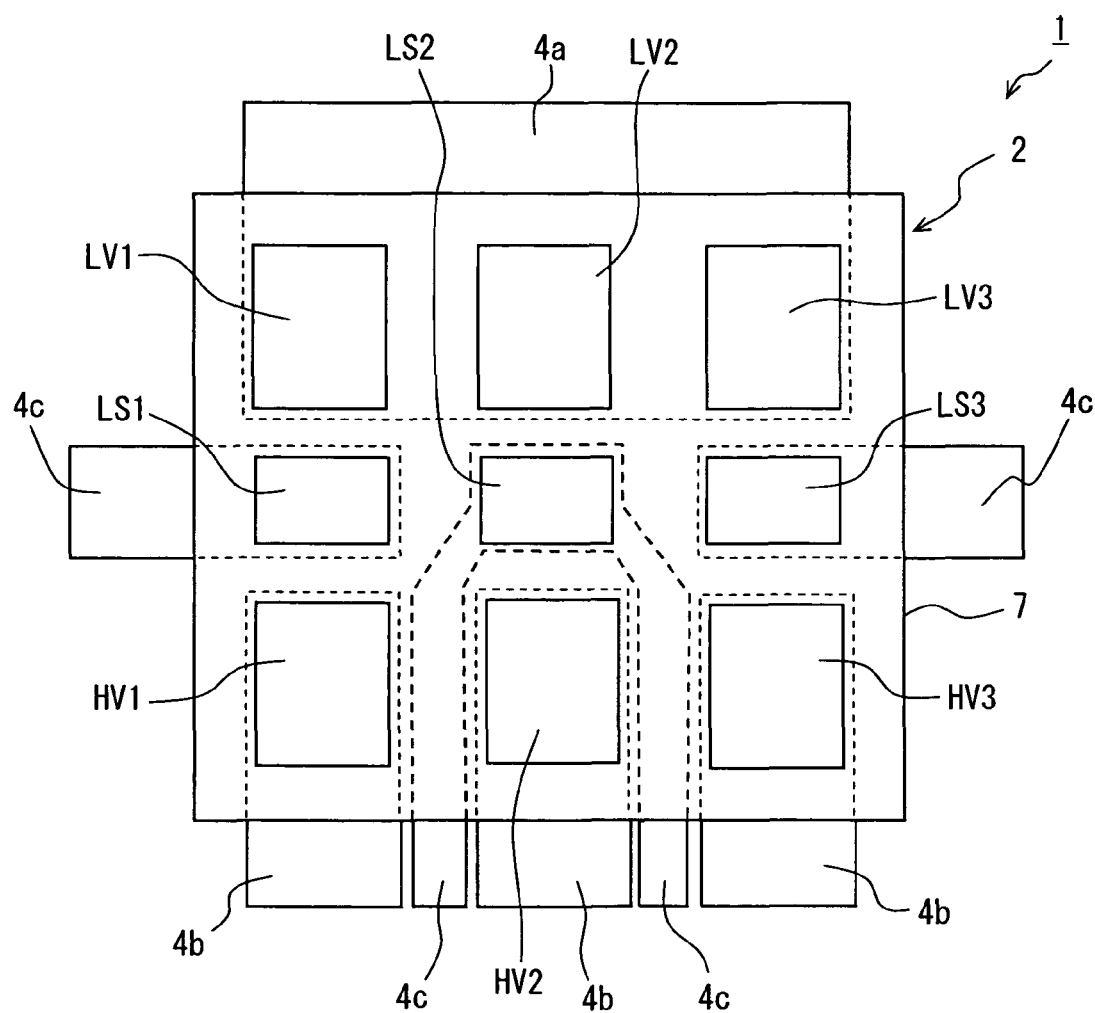
FIG. 21 is a plan view showing a semiconductor device according to a seventh embodiment.

Next, a semiconductor device according to a seventh embodiment will be explained with reference to FIG. 21. FIG. 21 is a plan view showing a seventh embodiment.

Figure 55:
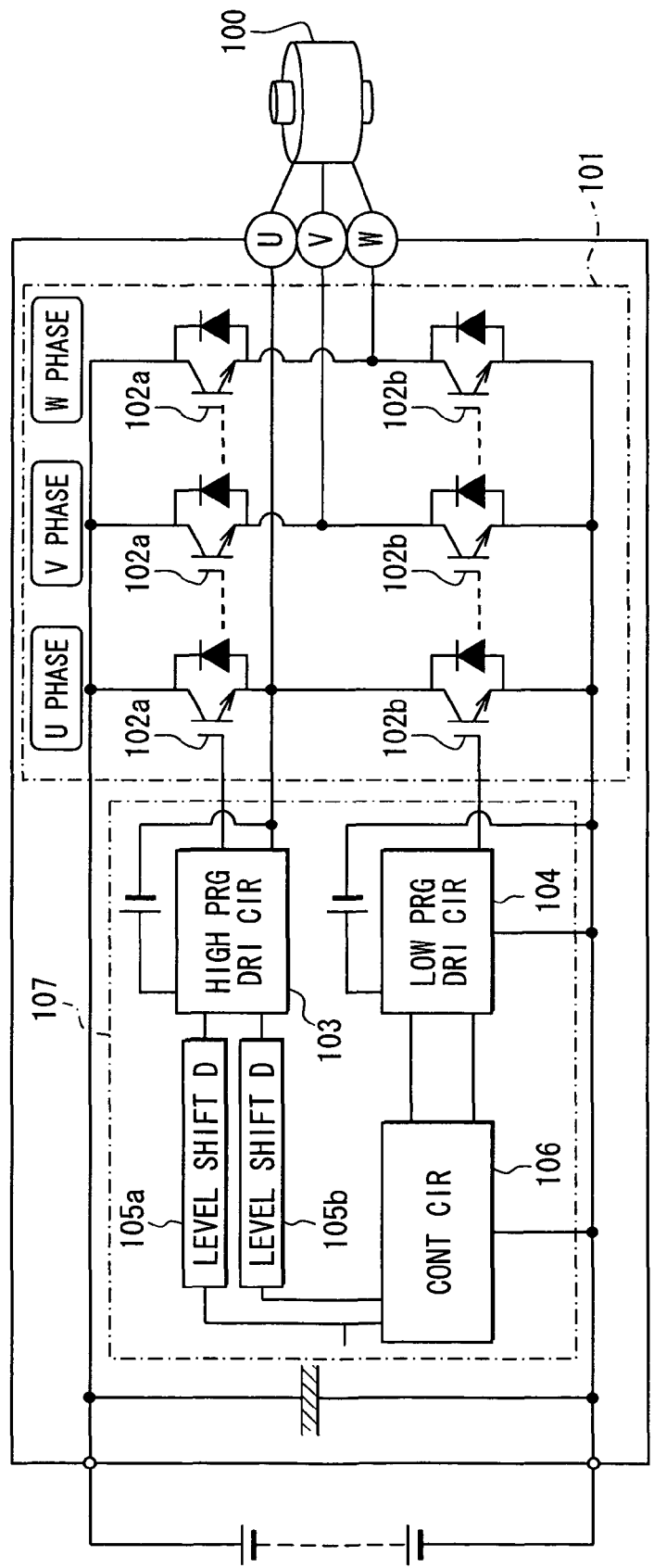
FIG. 55 is a diagram showing a circuit construction for driving an inverter circuit of a motor drive.
Figure 56:
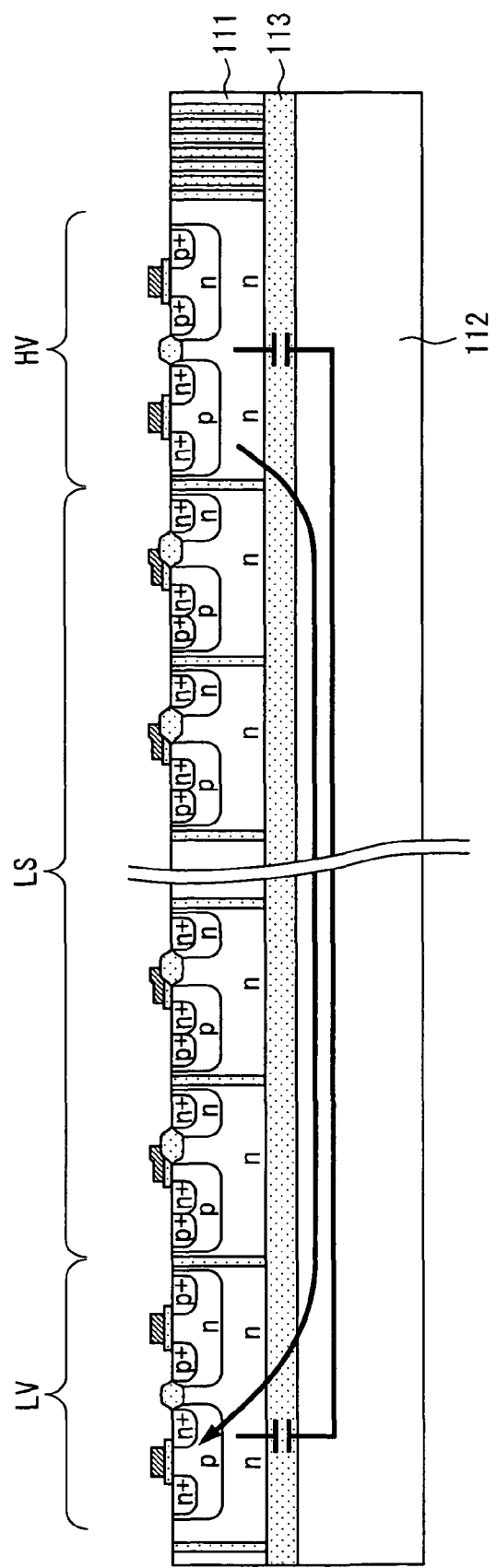
FIG. 56 is a cross sectional view explaining a displacement current in a HVIC.

The above described embodiments provide examples that one set of the low potential reference circuit LV, the high potential reference circuit HV and the level shift circuit LS is formed in the same semiconductor chip 2. The number of sets of the circuit portions LV, HV, LS is not limited to one in the above embodiments. In the present embodiment, for example, in view of a control circuit for driving a three phase (U phase, V phase and W phase) motor shown in FIG. 55, the same semiconductor chip 2 includes three sets of the circuit portions LV, HV, LS, as shown in FIG. 21. In FIG. 21, the circuit portion LV1, HV1, LS1 corresponds to the U phase, the circuit portion LV2, HV2, LS2 corresponds to the V phase, and the circuit portion LV3, HV3, LS3 corresponds to the W phase.

As shown in FIG. 21, independent second leads 4b are formed so as to be opposite to the high potential reference circuits HV1, HV2, HV3, respectively. This is because the high potential reference circuits HV1, HV2, HV3 provide the high potentials at different times, respectively. Similarly, independent third leads 4c are formed so as to be opposite to the level shift circuits LS1, LS2, LS3. However, the first lead 4a is commonly arranged with respect to the low potential reference circuits LV1, LV2, LV3. This is because the reference voltage of the low potential reference circuits LV1, LV2, LV3 is zero.

Thus, three phase driving circuits for three different phases are formed in the same chip 2. As described above, since the portion of the circuit portion and the lead 4, which are opposite to each other, have the same potential, the potential interference between different phases is restricted.

In the above case, the level shift circuit LS is disposed in the same chip 2. Alternatively, the device 1 may include at least the low potential reference circuit LV and the high potential reference circuit HV. Further, three phase low potential reference circuits LV (LV1-LV3) have the reference potential (as the first potential) of zero. Thus, in the example shown in FIG. 21, the first lead 4a arranged to be opposite to the circuits is common. Alternatively, three first leads 4a may be arranged to be opposite to the three low potential reference circuits LV (LV1-LV3), respectively. However, when the first lead 4a is common, as shown in FIG. 21, it is possible to reduce the number of the bonding wires.

Eighth Embodiment

Figure 22:
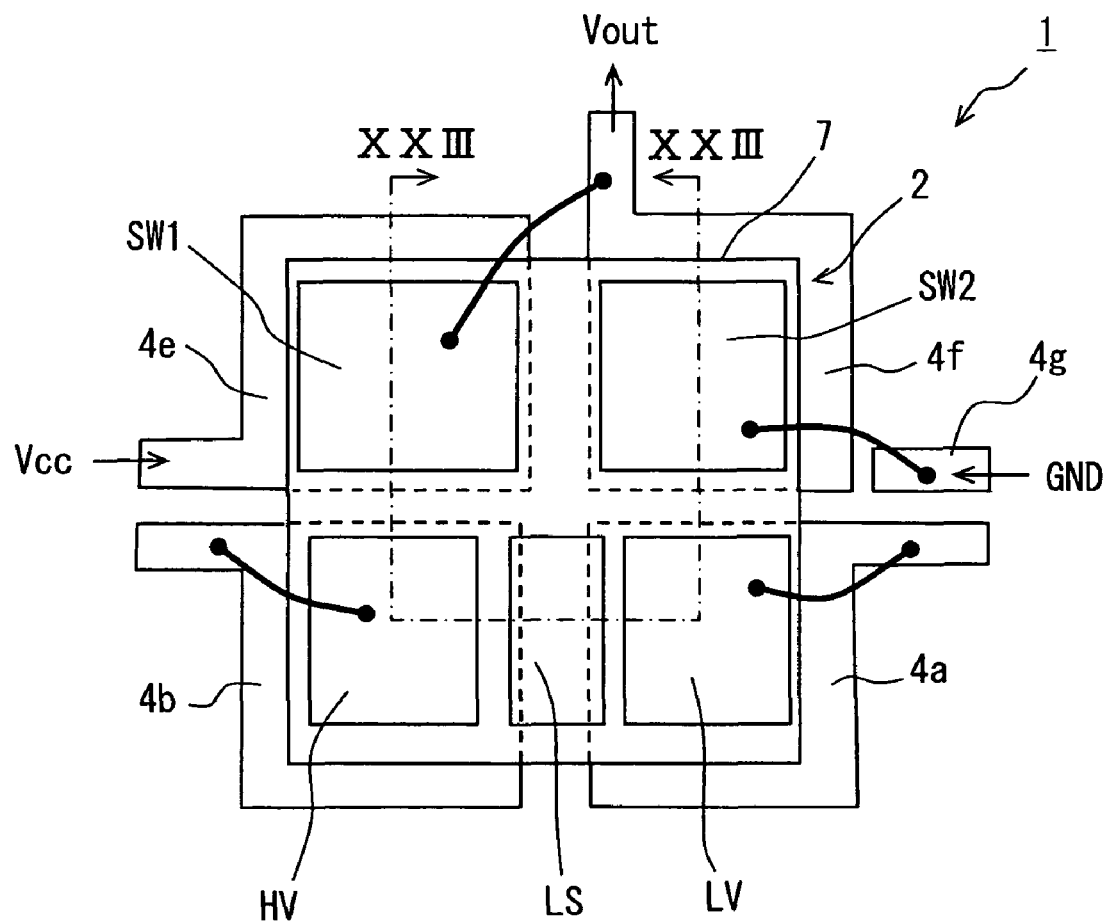
FIG. 22 is a plan view showing a semiconductor device according to a eighth embodiment.
Figure 23:
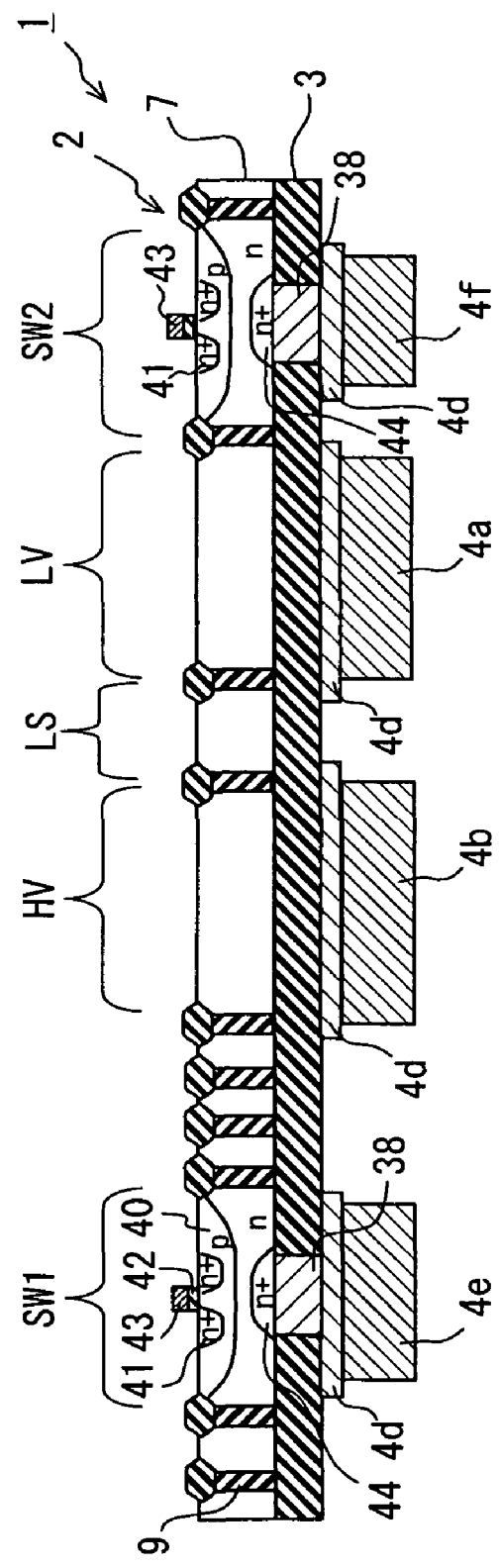
FIG. 23 is a cross sectional view showing the semiconductor device taken along XXIII-XXIII in FIG. 22.

Next, a semiconductor device according to an eighth embodiment will be explained with respect to FIGS. 22 and 23. FIG. 22 is a plan view showing a semiconductor device according to the eighth embodiment. FIG. 23 is a cross sectional view showing the semiconductor device taken along line XXIII-XXIII in FIG. 22.

In the present embodiment, as shown in FIGS. 22 and 23, not only the driving circuit for generating a gate driving signal but also switching elements SW1, SW2 having a gate for providing an inverter circuit are integrally formed in the same semiconductor chip 2. In an example in FIGS. 22 and 23, the elements SW1, SW2 are formed of a N channel vertical type MOSFET (i.e., DMOS transistor). Each element SW1, SW includes a P type channel region 40 and a N+ type source region 41, which are disposed in a principal surface portion of the semiconductor layer 7. Further, a gate electrode 43 is arranged on the P type channel region 40 via a gate insulation film 42. A N+ type drain region 44 is formed in a backside surface portion of the semiconductor layer 7.

The lead 4e arranged to be opposite to the element SW1 is electrically coupled with the N+ type drain region 4 of the element SW1. The lead 4f arranged to be opposite to the element SW2 is electrically coupled with the N+ type drain region 44 of the element SW2. A N+ type source region 41 (and a source electrode not shown) in the element SW1 on a high potential side formed on the principal surface side of the semiconductor chip 2 is electrically coupled with the lead 4f connected to the N+ type drain region 44 in the element SW2 on the low potential side via the bonding wire 5. Further, the N+ type source region 41 (and a source electrode not shown) in the element SW2 is electrically coupled with the lead 4g via the bonding wire 5. Thus, the elements SW1, SW2 are connected in series with each other so that a half bridge circuit is formed. The lead 4f functions as an output terminal. The lead 4e is a terminal on a power source side electrically coupled with the N+ type drain region 44 in the element SW1. The lead 4g is a terminal on a ground side electrically coupled with the N+ type source region 41 (and the source electrode not shown) in the element SW via the bonding wire 5.

The gate electrode 43 in the element SW is electrically coupled with a gate signal output portion of the high potential reference circuit HV via a wiring not shown and formed on the principal surface of the semiconductor layer 7. The gate electrode 43 in the element SW is electrically coupled with a gate signal output portion of the low potential reference circuit LV via a wiring not shown and formed on the principal surface of the semiconductor layer 7. A drain electrode is formed of the through hole electrode 38 disposed in the insulation member 3 and the metal film 4d disposed on the backside of the insulation member 3. The drain electrode is arranged on the N+ type drain region 44 in the elements SW1, SW2.

In the example shown in FIGS. 22 and 23, the low potential reference circuit LV and the high potential reference circuit HV are electrically coupled with the opposing leads 4a, 4b, via the bonding wire 5, respectively. As described above (in FIG. 18), they may be electrically coupled with each other via the through hole electrode 35 formed in the insulation member 3. In this case, the through hole electrodes 35, 36 can be formed at the same time.

In FIGS. 22 and 23, the resin mold 6 is not shown. Further, the elements SW1, SW2 are not limited only to the N channel vertical type MOSFET. The elements SW1, SW2 may be formed of a P channel vertical type MOSFET. Alternatively, they may be an IGBT instead of the MOSFET. Further, they may be formed of a lateral type transistor. The third lead 4c may be arranged just under the level shift circuit LS.

Ninth Embodiment

Figure 24:
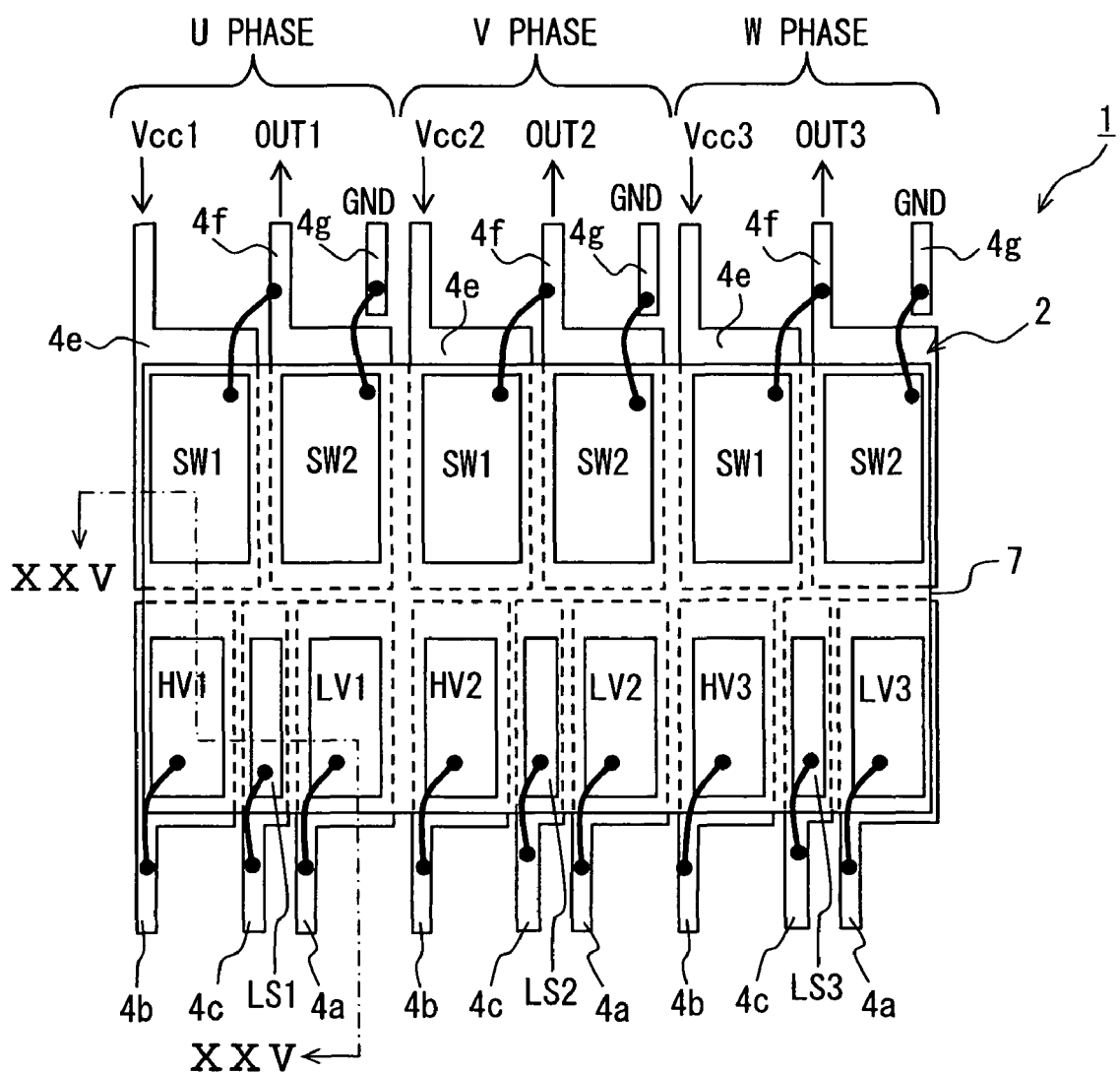
FIG. 24 is a plan view showing a semiconductor device according to a ninth embodiment.
Figure 25:
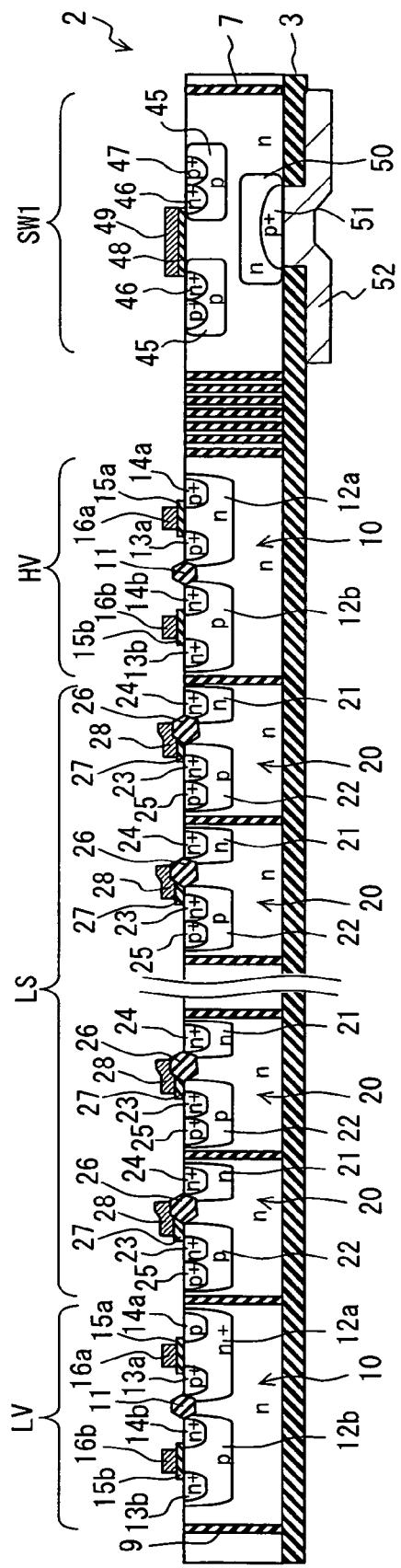
FIG. 25 is a cross sectional view showing a semiconductor device taken along line XXV-XXV in FIG. 24.
Figure 26:
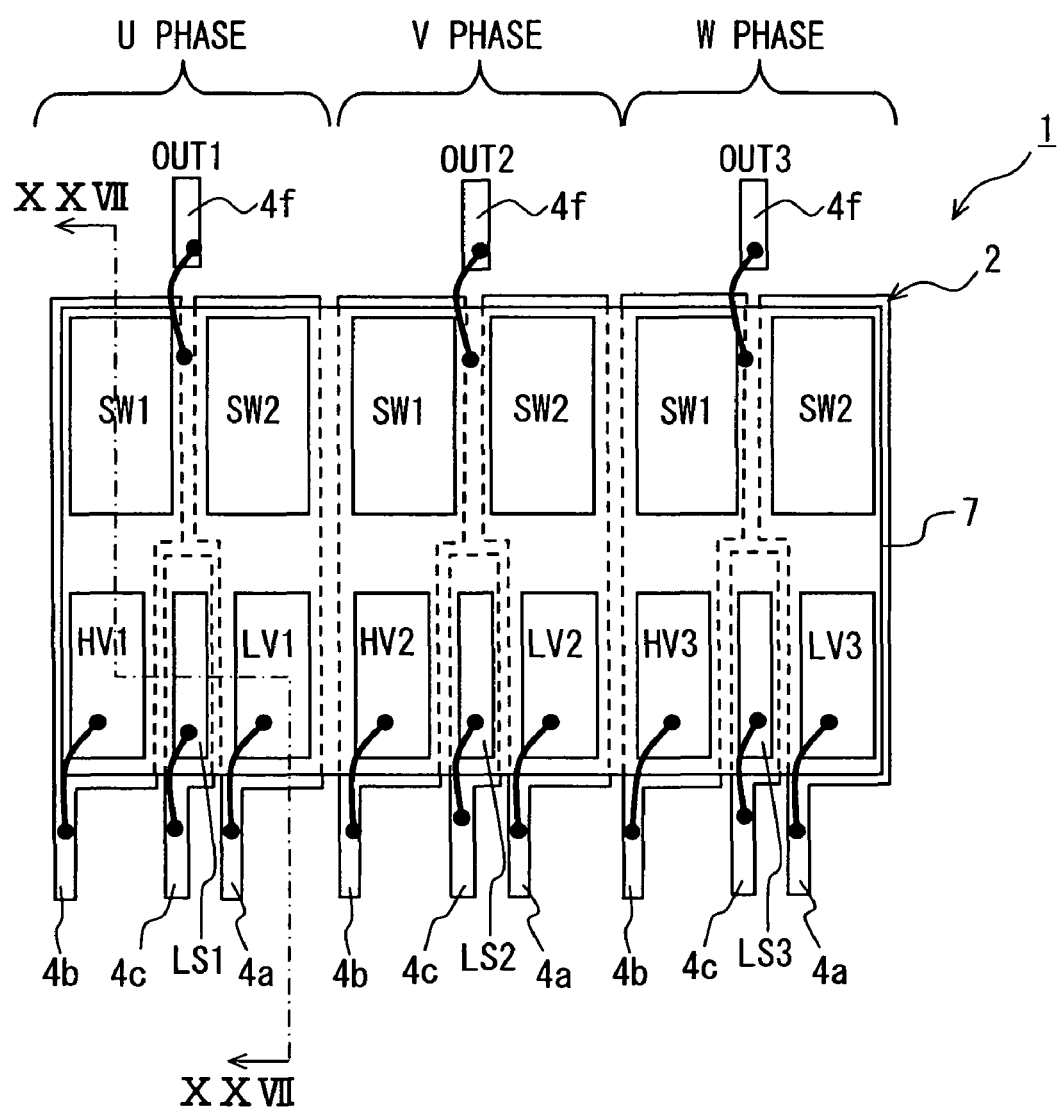
FIG. 26 is a plan view showing a semiconductor device according to another example of the ninth embodiment.
Figure 27:
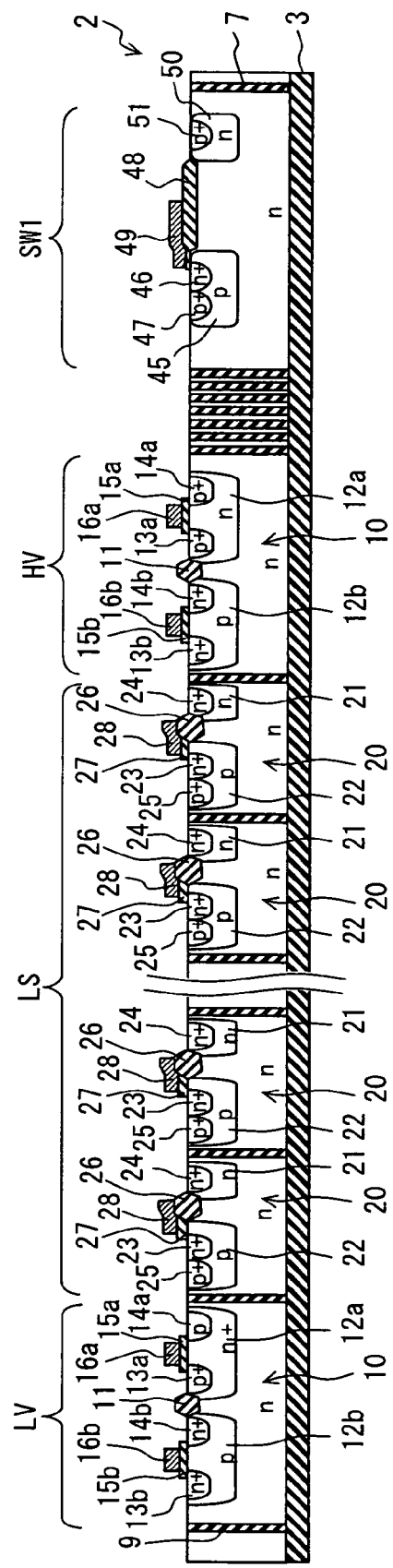
FIG. 27 is a cross sectional view showing the semiconductor device taken along line XXVII-XXVII in FIG. 26.

Next, a semiconductor device according to a ninth embodiment will be explained with reference to FIGS. 24-27. FIG. 24 is a plan view showing a semiconductor device according to a ninth embodiment. FIG. 25 is a cross sectional view showing a semiconductor device taken along line XXV-XXV in FIG. 24. FIG. 26 is a plan view showing another example of the ninth embodiment. FIG. 27 is a cross sectional view showing the semiconductor device taken along line XXVII-XXVII in FIG. 26.

In the present embodiment, the device 1 includes switching elements SW1, SW2 (i.e., an inverter circuit) for three phases and a control circuit for driving a motor. In a structure shown in FIGS. 24 and 25, the element SW1 on the high potential side and the element SW2 on the low potential side are formed of a vertical type IGBT.

In a case where the vertical IGBT is used, as shown in FIG. 25, the P type channel region 45, the N+ type emitter region 46 and the P+ type contact region 47 are formed in a principal surface portion of the semiconductor layer 7. The gate electrode 49 is arranged on the P type channel region 45 via the gate insulation film 48. A N type field stop region 50 and a p+ type collector region 51 having an concentration higher than the semiconductor layer 7 are formed in a backside surface portion of the semiconductor layer 7. A collector electrode 52 is arranged on the P+ type collector region 51 such that the electrode 52 penetrates the insulation member 3, which covers the backside of the semiconductor layer 7. The collector electrode 52 can be formed of the through hole electrode 38 and the metal film 4d.

As shown in FIG. 24, U phase portions (i.e., SW1, SW2, LV1, HV1, LS1) in the semiconductor chip 2 having a planar shape of a rectangular are disposed on one side along with a longitudinal direction of a rectangular shape, and W phase portions (i.e., SW1, SW, LV3, HV3, LS3) in the chip 2 are disposed on the other side along with the longitudinal direction of the rectangular shape. V phase portions (i.e., SW1, SW, LV2, HV2, LS2) are sandwiched between the U phase portions and the W phase portions.

In each portion of the U phase, the V phase and the W phase, the elements SW1, SW2 are formed to be adjacent to each other along with the longitudinal direction of the rectangular shape. The circuit portion LV, HV, LS is formed to be adjacent to a forming region of each of the elements SW1, SW2 along with a latitudinal direction of the rectangular shape. Further, in the circuit portion LV, HV, LS, the high potential reference circuit HV is formed on a side of the high potential side element SW1, and the low potential reference circuit LV is formed on a side of the low potential side element SW2. The level shift circuit LS is formed between the high potential reference circuit HV and the low potential reference circuit LV.

The P+ type collector region 51 (and a collector electrode 52) on the element SW1 is electrically coupled with the lead 4e, which is arranged to be opposite to the element SW1. The P+ type collector region 51 (and a collector electrode 52) on the element SW2 is electrically coupled with the lead 4f, which is arranged to be opposite to the element SW2. The N+ type emitter region 46 (and an emitter electrode not shown) in the element SW1 formed on the principal side of the semiconductor chip 2 is electrically coupled with the lead 4f, which is connected to the P+ type collector region 51 (and a collector electrode 52) in the element SW2 on the low potential side, via the bonding wire 5. The N+ type emitter region 46 (and an emitter electrode not shown) in the element SW2 is electrically coupled with the lead 4g via the bonding wire 5. Thus, in each phase, the elements SW1, SW are connected in series with each other so that the half bridge circuit is formed. The lead 4f functions as an output terminal. Here, the lead 4e is a terminal on a power source side electrically coupled with the P+ type collector region 51 in the element SW1. The lead 4g is a terminal on a ground side electrically coupled with the N+ type emitter region 46 in the element SW2 via the bonding wire 5.

In each portion of the U phase, the V phase and the W phase, the circuit portion LV, HV, LS is electrically coupled with the lead 4a-4c, which is opposite to the circuit portion. Further, the gate electrode 49 of the element SW1 is electrically coupled with a gate signal output portion of the high potential reference circuit HV via a wiring not shown and formed on the principal surface of the semiconductor layer 7. The gate electrode 49 of the element SW2 is electrically coupled with a gate signal output portion of the low potential reference circuit LV via a wiring not shown and formed on the principal surface of the semiconductor layer 7.

In the above construction, each phase portion functions with displacing a phase. In a conventional construction with using the SOI substrate, one phase portion generates a noise caused by a potential difference to another phase portion. The origin of the noise is derived from the displacement current caused by accumulated charge in an insulation layer (i.e., an embedded oxide film). To prevent generation of the noise, the potential difference between insulation layers is restricted. On the other hand; in the example shown in FIG. 24, the lead 4 is divided with respect to each phase. Further, in each phase portion, the lead 4 is divided with respect to the elements SW1, SW2, the low potential reference circuit KV and the high potential reference circuit HV and the level shift circuit LS. Accordingly, the noise is dramatically reduced.

Here, in FIG. 24, the circuit portion HV, LV, LS is electrically coupled with the corresponding lead 4a-4c via the bonding wire 5. As described above (in FIG. 18), they may be electrically coupled with each other via the through hole electrode 35 disposed in the insulation member 3. In FIGS. 24 and 25, the resin mold 6 is not shown. Further, in FIG. 25, the lead 4 is not shown. The elements SW1, SW2 is not limited to the N channel vertical type IGBT. The elements SW1, SW2 may be formed of a P channel vertical type IGBT. Alternatively, the elements SW1, SW2 may be formed of a MOSFET. In FIG. 24, the third lead 4c is arranged just under the level shift circuit LS to be opposite to the level shift circuit LS. Alternatively, the third lead 4c may not be arranged just under the level shift circuit LS. In FIG. 24, the lead 4 (4b, 4e) in each phase portion is divided with respect to the element SW1 and the high potential reference circuit HV. Alternatively, the lead 4 may be common.

Next, a construction with using a lateral type IGBT will be explained with reference to FIGS. 26 and 27. In case of the lateral type IGBT, as shown in FIG. 27, a N type field stop region 50 having a concentration higher than the semiconductor layer 7 and a P+ type collector region 51 together with the P type channel region 45, the N+ type emitter region 46 and the P+ type contact region 47 are formed in a principal surface portion of the semiconductor layer 7. The gate electrode 49 is arranged on the P type channel region 45 via the gate insulation film 48. As shown in FIG. 26, the U phase portions (i.e., SW1, SW2, LV1, HV1, LS1) in the semiconductor chip 2 having a planar shape of a rectangular are disposed on one side along with a longitudinal direction of a rectangular shape, and W phase portions (i.e.; SW1, SW, LV3, HV3, LS3) in the chip 2 are disposed on the other side along with the longitudinal direction of the rectangular shape. V phase portions (i.e., SW1, SW, LV2, HV2, LS2) are sandwiched between the U phase portions and the W phase portions.

In each portion of the U phase, the V phase and the W phase, the elements SW1, SW2 are formed to be adjacent to each other along with the longitudinal direction of the rectangular shape. The circuit portion LV, HV, LS is formed to be adjacent to a forming region of each of the elements SW1, SW2 along with a latitudinal direction of the rectangular shape. Further, in the circuit portion LV, HV, LS, the high potential reference circuit HV is formed on a side of the high potential side element SW1, and the low potential reference circuit LV is formed on a side of the low potential side element SW2. The level shift circuit LS is formed between the high potential reference circuit HV and the low potential reference circuit LV.

In each portion of the U phase, the V phase and the W phase, the first lead 4a is opposite to the low potential reference circuit LV, and further, opposite to the low potential side element SW2. The first lead 4a is electrically coupled with the portion of the low potential reference circuit LV to be applied with the first potential. The second lead 4b is opposite to the high potential reference circuit HV, and further, opposite to the high potential side element SW1. The second lead 4b is electrically coupled with the portion of the high potential reference circuit HV to be applied with the second potential. The third lead 4c is opposite to the level shift circuit LS, and electrically coupled with the level shift circuit LS.

The P+ type collector region 51 (and the collector electrode 52) in the element SW1 is electrically coupled with the portion of the high potential reference circuit HV to be applied with the second potential (for example, 1200V) via a wiring not shown and formed on the principal surface of the semiconductor layer 7. The N+ type emitter region 46 (and an emitter electrode not shown) in the element SW2 is electrically coupled with the portion of the low potential reference circuit LV to be applied with the first potential (for example, 0V) via a wiring not shown and formed on the principal surface of the semiconductor layer 7. Further, the N+ type emitter region 46 (and the emitter electrode not shown) in the element SW1 and the P+ type collector region 51 (and the collector electrode 52) in the element SW2 are electrically coupled with each other via a wiring not shown and formed on the principal surface of the semiconductor layer 7. The wiring is electrically coupled with the lead 4f via the bonding wire 5. The gate electrode 49 in the element SW1 is electrically coupled with a gate signal output portion of the high potential reference circuit HV via a wiring not shown and formed on the principal surface of the semiconductor layer 7. The gate electrode 49 in the element SW2 is electrically coupled with a gate signal output portion of the low potential reference circuit LV via a wiring not shown and formed on the principal surface of the semiconductor layer 7.

Thus, in each phase portion, the elements SW1, SW2 are connected in series with each other so that a half bridge is formed. Further, the lead 4f functions as an output terminal. Even in case of this construction with the lateral type IGBT, noise is reduced, similar to the vertical type IGBT. Here, in FIG. 26, the circuit portion LV, HV, LS is electrically coupled with the corresponding lead 4a-4c via the bonding wire 5. As described above (in FIG. 18), they may be electrically connected with each other via the through hole electrode 35 formed in the insulation member 3. In FIGS. 26 and 27, the resin mold 6 is not shown. In FIG. 27, the lead 4 is not shown. The elements SW1, SW2 is not limited to the N channel vertical type IGBT. Alternatively, the elements SW1, SW2 may be formed of a P channel vertical type IGBT. Alternatively, the elements SW1, SW2 may be formed of a MOSFET. In FIG. 26, the third lead 4c is arranged just under the level shift circuit LS to be opposite to the level shift circuit LS. Alternatively, the third lead 4c may not be arranged just under the level shift circuit LS. In FIG. 26, the lead 4 (4b) in each phase portion is common with respect to the element SW1 and the high potential reference circuit HV. Alternatively, the lead 4 may be divided.

Tenth Embodiment

Figure 28:
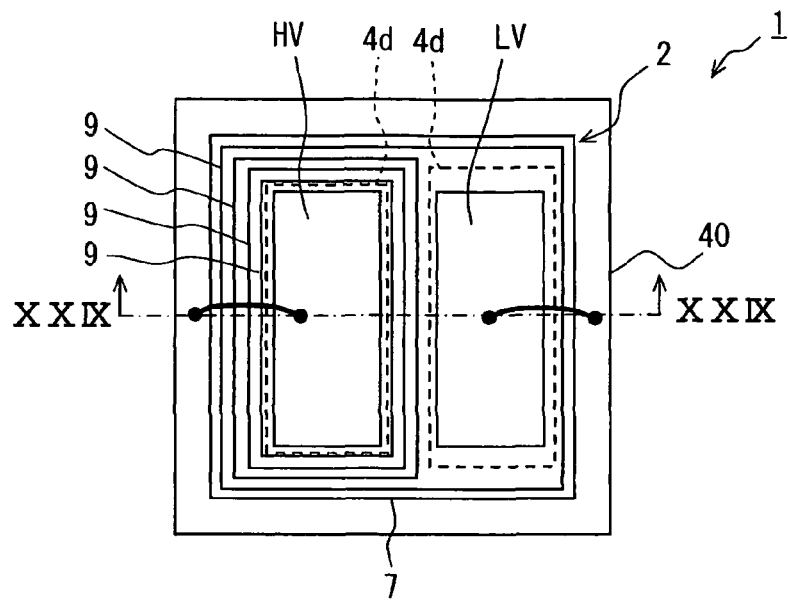
FIG. 28 is a plan view showing a semiconductor device according to a tenth embodiment.
Figure 29:
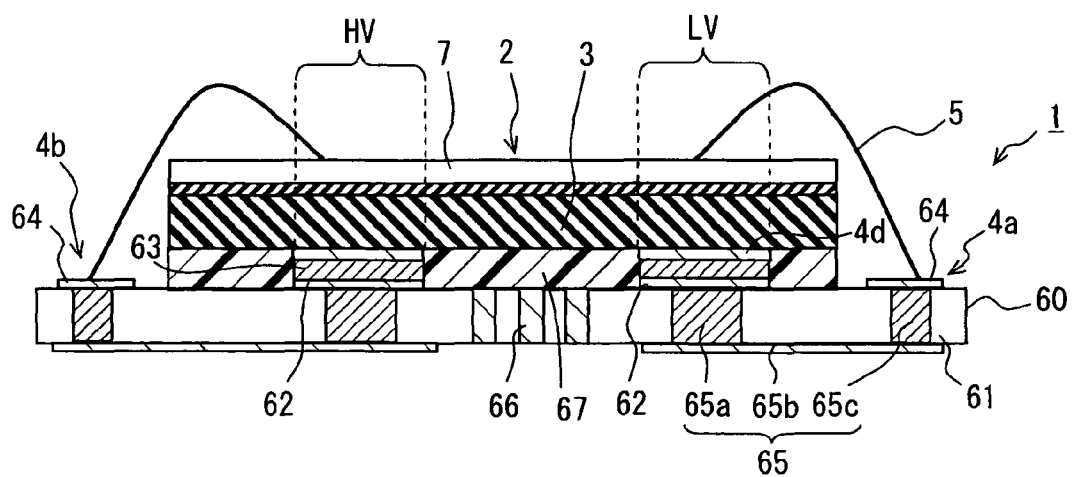
FIG. 29 is a cross sectional view showing the semiconductor device taken along line XXIX-XXIX in FIG. 28.

Next, a semiconductor device according to a tenth embodiment will be explained with reference to FIGS. 28 and 29. FIG. 28 is a plan view showing a semiconductor device according to a tenth embodiment. FIG. 29 is a cross sectional view showing the semiconductor device taken along line XXIX-XXIX in FIG. 28.

In the above described embodiments, the conductive member is the lead. However, the conductive member is not limited to the lead specifically. For example, as described in the present embodiment, the conductive member may be a substrate with a conductive pattern formed on a surface of the substrate.

For example, in an example shown in FIGS. 28 and 29, similar to FIGS. 16 and 17, backside electrodes 4d (as a metal film) are formed on a portion of the backside of the insulation member 3 corresponding to the high potential reference circuit HV and the low potential reference circuit LV, respectively. The substrate 60 is a wiring board such that a wiring is formed on a board 61 made of electric insulation material. The backside electrode 4d is mechanically and electrically coupled with (i.e., bonded to) a land 62 via a connection member 63 such as solder. The land 62 is formed on one side of the substrate 60 (i.e., the board 61). The land 62 is electrically coupled with a land 64 via a wiring portion 65 formed on the substrate 60. The land 64 is formed on a region of the one side of the substrate 60 other than a mounting region of the semiconductor chip 2. The land 64 is electrically coupled with a certain portion of the circuit portion HV, LV on the semiconductor layer 7 via the bonding wire 5. The certain portion corresponds to the land 64.

In the example shown in FIG. 29, each land 62, 64 provides at least a part of a conductive pattern formed on the one side of the substrate 60. The wiring portion 65 includes a conductive pattern 65b formed on the backside of the substrate 60 and through hole connection portions 65a, 65c. Specifically, in the example shown in FIGS. 28 and 29, the backside electrode 4d, the connection member 63, the lands 62, 64 arranged on the board 61 and the wiring portion 65 provide the conductive member. In this construction, similar to the construction in FIGS. 16 and 17, the conductive member (including the backside electrode 4d) can be arranged at a desired position, compared with a construction with using only the lead 4. Here, the reference numeral 66 in FIG. 29 represents a thermal via, which is prepared such that conductive material is embedded in a through hole of the substrate 60. The reference numeral 67 represents a sealing portion inserted between the backside of the insulation member 3 and the one side of the substrate 60 for sealing a connection portion between the backside electrode 4d and the land 62 and for coupling mechanically the insulation member 3 and the substrate 60. The one side of the substrate 60 faces the backside of the insulation member 3.

In the above example, the land 62 is coupled with the land 64 via the wiring portion 65. Alternatively, the lands 62, 64 may be integrated. Specifically, the backside electrode 4d is coupled with a part of a land formed on the one side of the substrate 60 via the connection member 63. The bonding wire 5 is coupled with a region other than a region covered with the semiconductor chip 2. In the construction having the wiring portion 65, the conductive pattern 65b may be an inner layer conductive pattern, and the device 1 may include a connection via instead of the through hole connection portion 65a, 65b.

Eleventh Embodiment

Figure 30:
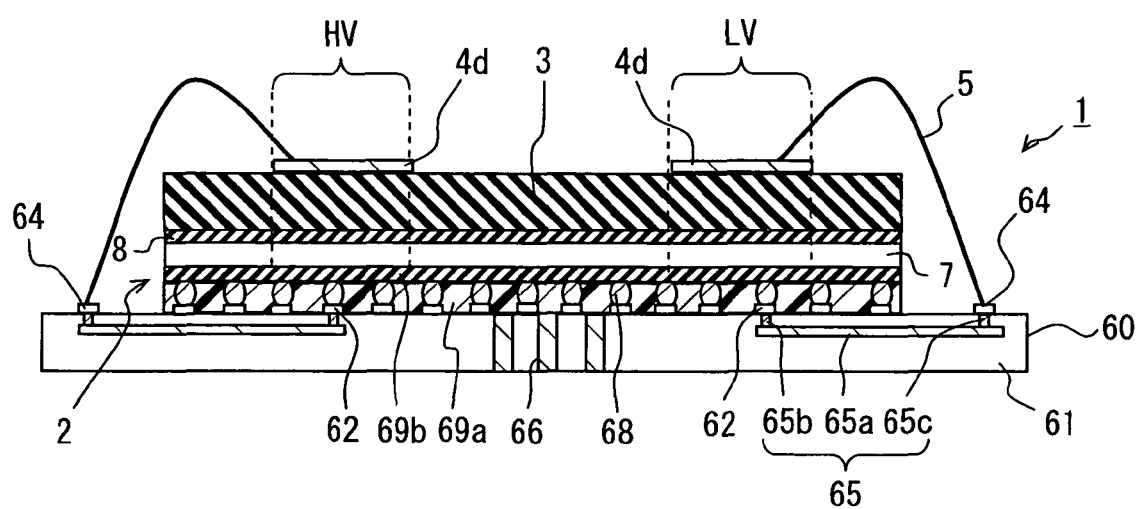
FIG. 30 is a cross sectional view showing a semiconductor device according to an eleventh embodiment.

Next, a semiconductor device according to an eleventh embodiment will be explained with reference to FIG. 30. FIG. 30 is a cross sectional view showing the eleventh embodiment.

As shown in FIG. 30, in the present embodiment, a connection portion 68 such as a bump is formed on a pad region (not shown) disposed on the principal surface of the semiconductor chip 2. The connection portion 68 is electrically and mechanically coupled with a land corresponding to the substrate 60. Specifically, the semiconductor device 1 has a flip-chip type mounting structure. In the semiconductor device 1, similar to FIGS. 16 and 17, the backside electrodes 4d (i.e., the metal film) are formed on a portion of the backside of the insulation member 3 corresponding to the high potential reference circuit HV and the low potential reference circuit LV, respectively. Each backside electrode 4d is coupled with the corresponding land 64 formed on the surface of the substrate 60 via the bonding wire 5.

As shown in FIG. 29, each land 64 is coupled with a corresponding land 62 via the wiring portion 65. The land 62 is electrically coupled with a corresponding certain portion of the circuit portion HV, LV formed in the semiconductor layer 7 via the connection portion 68 and a pad portion not shown. In an example shown in FIG. 30, the wiring portion 65 includes an inner layer conductive pattern 65a and connection vias 65b, 65c. This construction can obtain the same effect as the construction shown in FIGS. 28 and 29.

A planar structure of the semiconductor device shown in FIG. 30 is almost the same as that in FIG. 28, other than a point that the semiconductor chip 2 is opposite to the substrate 60. Thus, the planar structure is not described. Further, the reference numeral 69a in FIG. 30 represents a sealing portion inserted between the principal surface portion of the semiconductor chip 2 (i.e., a surface portion of the insulation layer 69b) and one side of the substrate 60 facing the chip 2 for mechanically coupling the chip 2 and the substrate 60 and for sealing a connection portion between the connection portion 68 and the land (including the land 62). The reference numeral 69b represents an insulation layer arranged on the principal surface of the semiconductor chip 2. The connection portion 68 is electrically coupled with a certain portion of the circuit portion formed in the semiconductor layer 7 via a contact hole, a via hole or a through hole (all of which include a conductive member), each of which is not shown and formed in the insulation layer 69b.

In the tenth and eleventh embodiments shown in FIGS. 28-30, the backside electrode 4d is formed with respect to only the high potential reference circuit HV and the low potential reference circuit LV as the circuit portion. However, formation of the backside electrode 4d is not limited to the above examples. As described in the above embodiment, the backside electrode 4d may be formed in each region having different reference potential and including the level shift circuit LS.

Twelfth Embodiment

Next, a twelfth embodiment of the present invention will be explained with reference to FIGS. 31 and 32. FIG. 32 is a cross sectional view showing the twelfth embodiment. FIG. 32 is a plan view taken along line XXXII-XXXII in FIG. 31.

In the present embodiment, the flip-chip type semiconductor chip 2 shown in FIG. 30 is embedded in a multi layer substrate.

Figure 31:
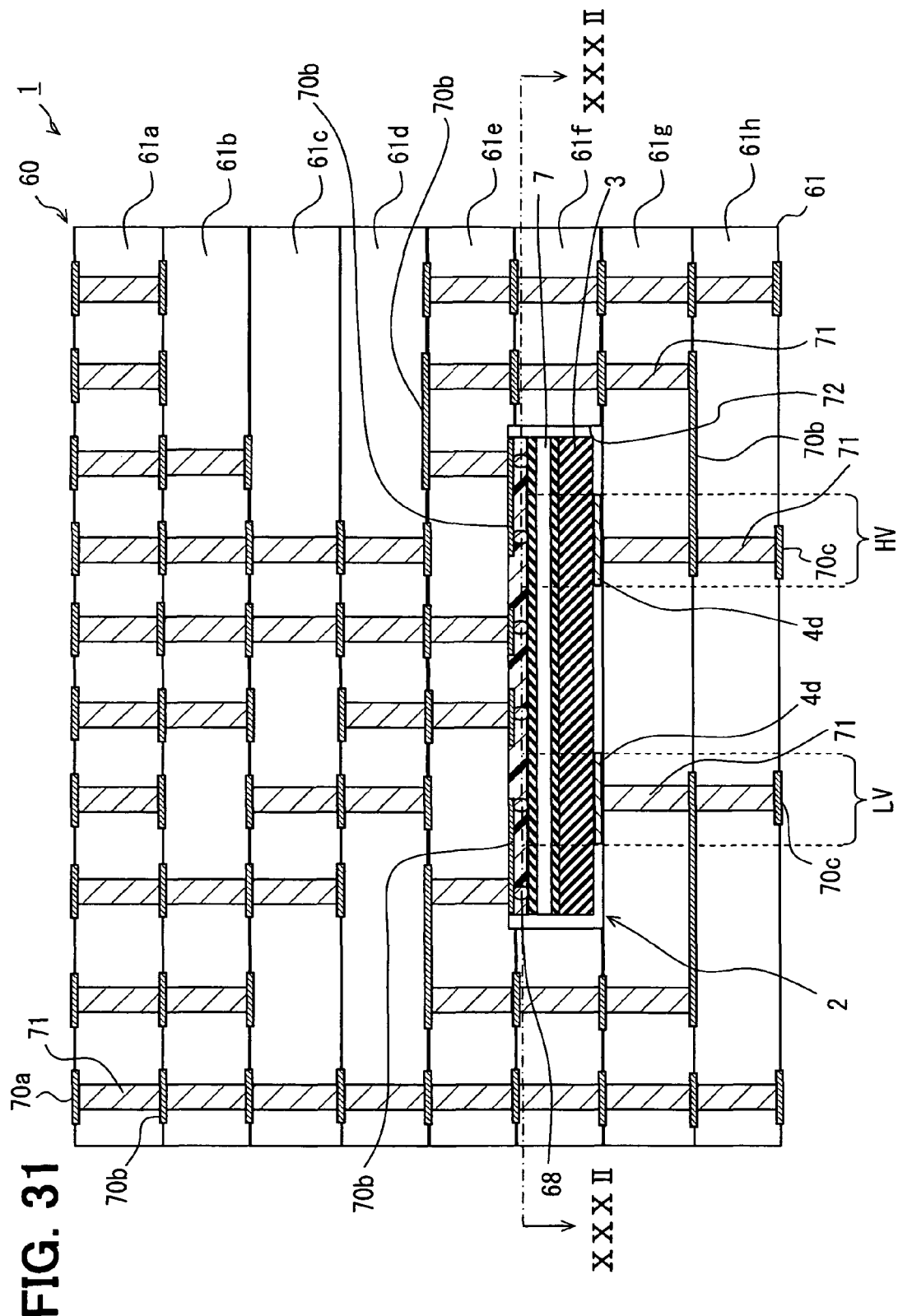
FIG. 31 is a cross sectional view showing a semiconductor device according to a twelfth embodiment.
Figure 32:
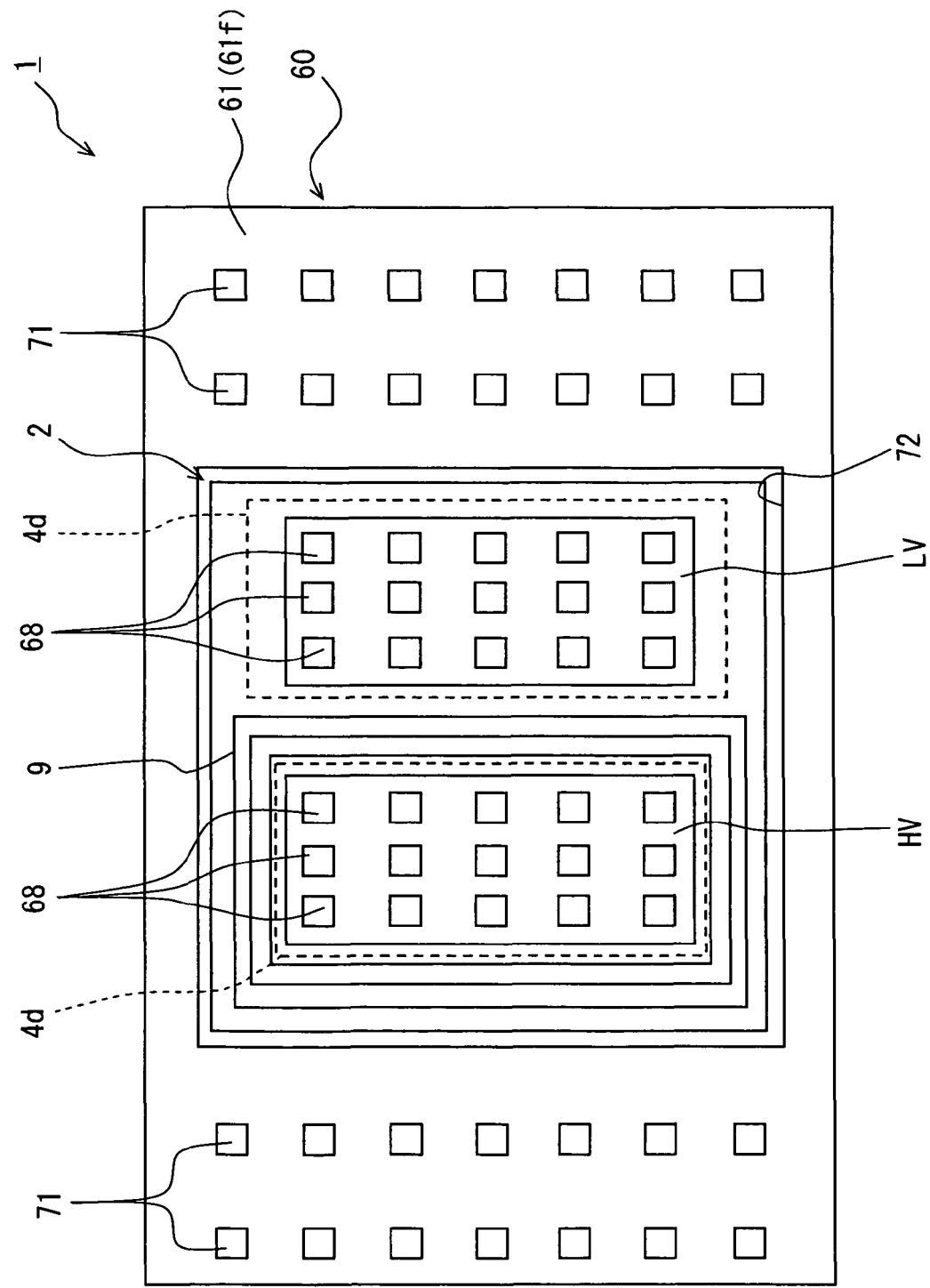
FIG. 32 is a plan view showing the semiconductor device taken along line) XXXII-XXXII in FIG. 31.

As shown in FIGS. 31 and 32, the semiconductor chip 2 is built in and mounted in the multi layer substrate as the substrate 60. The multi layer substrate 60 is formed such that thermoplastic resin such as liquid crystal polymer provides a board 61, and a conductive pattern 70 is arranged in the board 61 in multi-layered manner. In the semiconductor chip 2, the backsides 4d (i.e., a metal film) are formed on portions of the backside of the insulation member 3 corresponding to the high potential reference circuit HV and the low potential reference circuit LV, respectively, similar to FIGS. 16 and 30. The connection portion 68 such as a bump is formed on a pad portion not shown and formed on the principal surface of the semiconductor chip 2. The semiconductor chip 2 (including the insulation member 3) is accommodated in a removed region 72 formed in the board 61. The above connection portion 68 is electrically and mechanically coupled with the corresponding conductive pattern 70 (i.e., the inner layer pattern 70b) in the multi layer substrate 60.

The backside electrode 4d is coupled with a connection via 71 formed in the board 61. The backside electrode 4d is electrically coupled with the corresponding connection portion 68 via the conductive pattern 70 (i.e., the inner layer conductive pattern 70b) and the connection via 71. Further, the backside electrode 4d is electrically coupled with the land 70c as the conductive pattern 70 formed on the surface of the multi layer substrate 60 via the conductive pattern 70 (i.e., the inner layer conductive pattern 70b) and the connection via 71. Thus, a predetermined potential is applied through the land 70c so that the backside electrode 4d and a certain portion of the circuit portion opposite to the backside electrode 4d have the same potential. In this construction, similar to the construction shown in FIGS. 16 and 17, the conductive member (including the backside electrode 4*d*) can be arranged at a desired position, compared with a case of the device 1 with using only the lead 4. Further, since the semiconductor chip 2 is accommodated in and sealed in the substrate 60, the resin mold 6 is not necessary. Further, heat in the semiconductor chip 2 can be discharged to the outside via the connection via 71. Here, multiple lands 70*a* other than the above described land 70*c* are formed on the surface of each side of the multi layer substrate 60.

The semiconductor device 1 can be manufactured by the following procedure. Specifically, multiple boards 61 having a sheet shape are prepared (in this example, eight boards 61*a*-61*h* are prepared). The conductive pattern 70 is formed on one side or both sides of the board 61. The connection via 71 is formed in the board 61 such that conductive material is arranged in a hole having a bottom of the conductive pattern 70. In this case, a remove region is formed in a board 61*f* among the board 61 for mounting the semiconductor chip 2 such that a region corresponding to the dimensions of the semiconductor chip 2 is removed from the board 61*f*. Multiple boards 61 are stacked in an order shown in FIG. 32. In this case, after the board 61*f* is stacked, the semiconductor chip 2 is arranged in the remove region 72 formed in the board 61*f*. Then, residual boards 61 are stacked in turn, so that a stacked body including eight boards 61 is formed. After that, the stacked body is heated and pressurized from both sides of the stacked body in the stacking direction with using a vacuum hot press apparatus. Thus, the boards 61 are softened and melt and bonded to each other. Further, the connection via 71 is bonded to the adjacent conductive pattern 70 and the adjacent backside electrode 4*d*, respectively. Furthermore, the connection portion 68 is also bonded to the adjacent conductive pattern 70 (i.e., the adjacent inner layer conductive pattern 70*b*). Thus, the semiconductor device shown in FIG. 31 is obtained.

In the examples shown in FIGS. 31 and 32, the backside electrodes 4*d* are formed with respect to only the low potential reference circuit LV and the high potential reference circuit HV as the circuit portion. However, formation of the backside electrode 4*d* is not limited to the above examples. As described in the above embodiment, the backside electrode 4*d* may be formed in each region having different reference potential including the level shift circuit LS.

Thirteenth Embodiment

Figure 33:
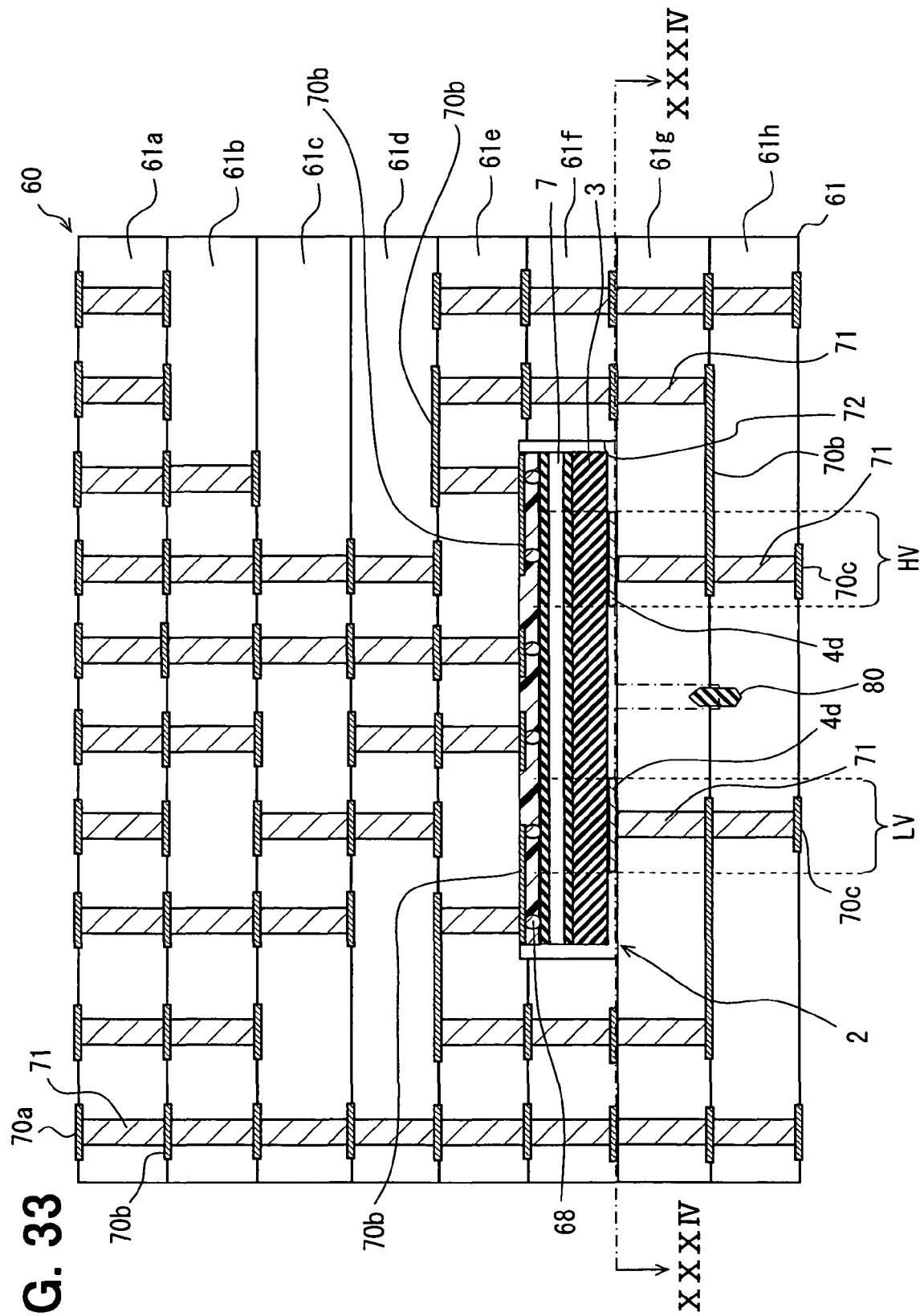
FIG. 33 is a cross sectional view showing a semiconductor device according to a thirteenth embodiment.
Figure 34:
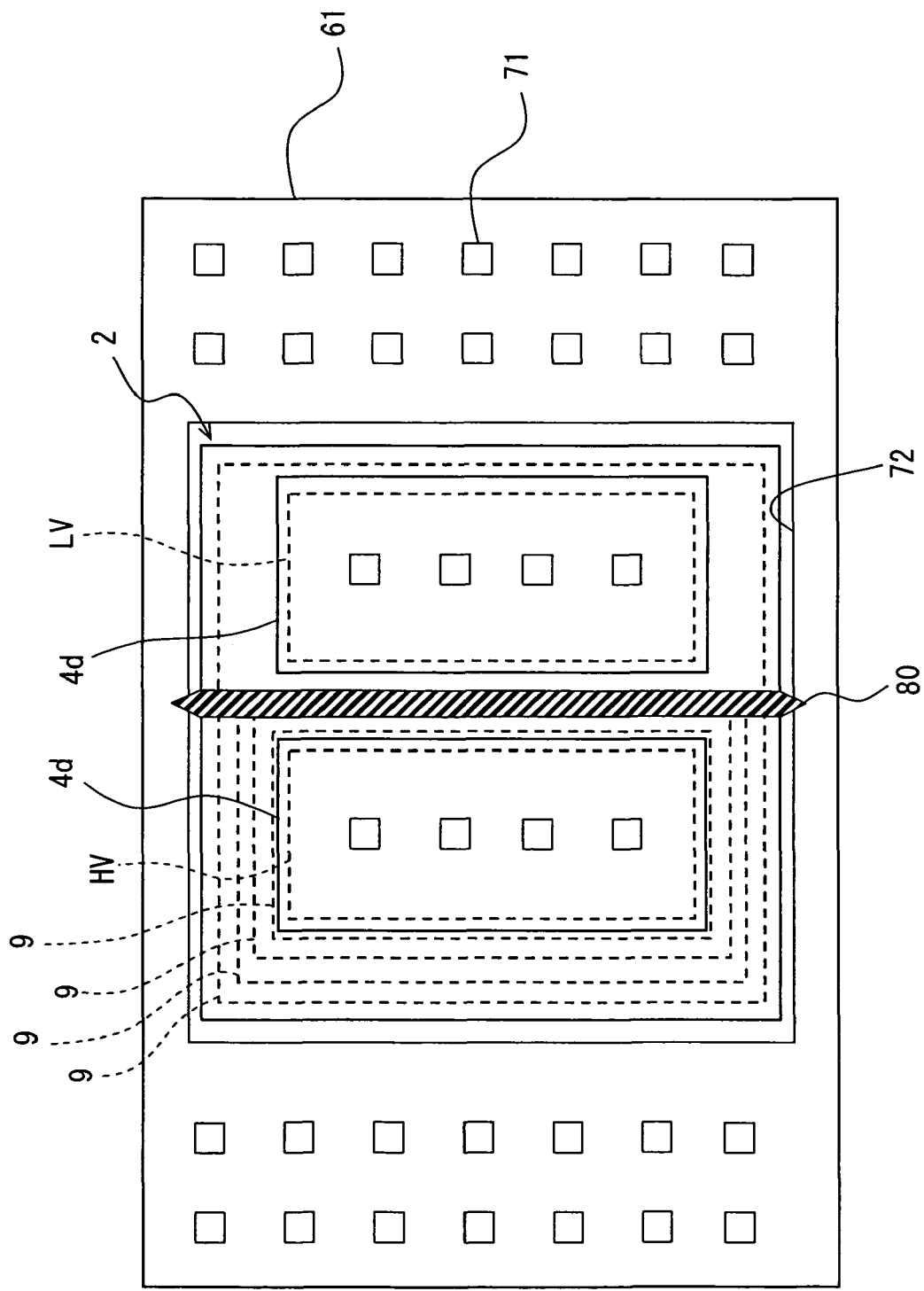
FIG. 34 is a plan view showing the semiconductor device along with line XXXIV-XXXIV in FIG. 33.

Next, a thirteenth embodiment of the present invention will be explained with reference to FIGS. 33 and 34. FIG. 33 is a cross sectional view showing the thirteenth embodiment. FIG. 34 is a plan view along with line XXXIV-XXXIV in FIG. 33.

In the present embodiment, in the multi layer substrate 60 having the semiconductor chip 2 built therein, which is explained in the twelfth embodiment, an insulation member 80 is formed between the connection via 71 together with the conductive pattern 70 (i.e., the inner layer pattern 70*b*), which are coupled with the metal film 4*d* opposite to the low potential reference circuit LV and applied with the reference potential (the first potential) of the low potential reference circuit LV, and the connection via 71 together with the conductive pattern 70 (i.e., the inner layer pattern 70*b*), which are coupled with the metal film 4*d* opposite to the high potential reference circuit HV and applied with the reference potential (the second potential) of the high potential reference circuit HV. The insulation member 80 crosses the interface between adjacent boards 61*g*, 61*h*. As shown in FIG. 34, the insulation member 80 is arranged to have at least a length of a facing surface between the low potential reference circuit LV and the high potential reference circuit HV. Preferably, the length of the insulation member 80 is longer than the length of the facing surface.

The multi layer substrate 60 is formed such that multiple boards 61 are bonded together. A bonding interface may include a small clearance. In this case, when moisture penetrates into the small clearance, short-circuit may occur between the conductive pattern 70 and the connection via 71 to be applied with the first potential and the conductive pattern 70 and the connection via 71 to be applied with the second potential.

In view of the above problem, in the present embodiment, the insulation member 80 is formed to cross the interface between adjacent boards 61*g*, 61*h*. Accordingly, even when moisture penetrates into the interface between the adjacent boards 61*g*, 61*h*, possibility of occurrence of short-circuit between the conductive pattern 70 and the connection via 71 to be applied with the first potential and the conductive pattern 70 and the connection via 71 to be applied with the second potential is reduced.

In the above example, the insulation member 80 is merely formed to cross the interface between the adjacent boards 61*g*, 61*h*. Alternatively, as shown in FIG. 35, an insulation member 81 instead of the insulation member 80 may be formed to have the length from the outer surface of the multi layer substrate 60 to the surface of the semiconductor chip 2, which is embedded in the multi layer substrate 60, in the stacking direction of the multi layer substrate 60.

The insulation member 81 is made of material such as ceramics, glass and high insulation performance resin (for example, KE-G3000D made by KYOCERA Chemical Corporation and PIX3400 made by Hitachi Chemical Co., Ltd.) having insulation performance higher than the board 61 for providing the multi layer substrate 60. Here, the insulation performance is evaluated by a voltage value at which current starts to flow when a high voltage is applied to a test piece having a plate shape with a predetermined thickness. When the voltage value at which the current starts to flow is high, the insulation performance of the material is high.

Figure 35:
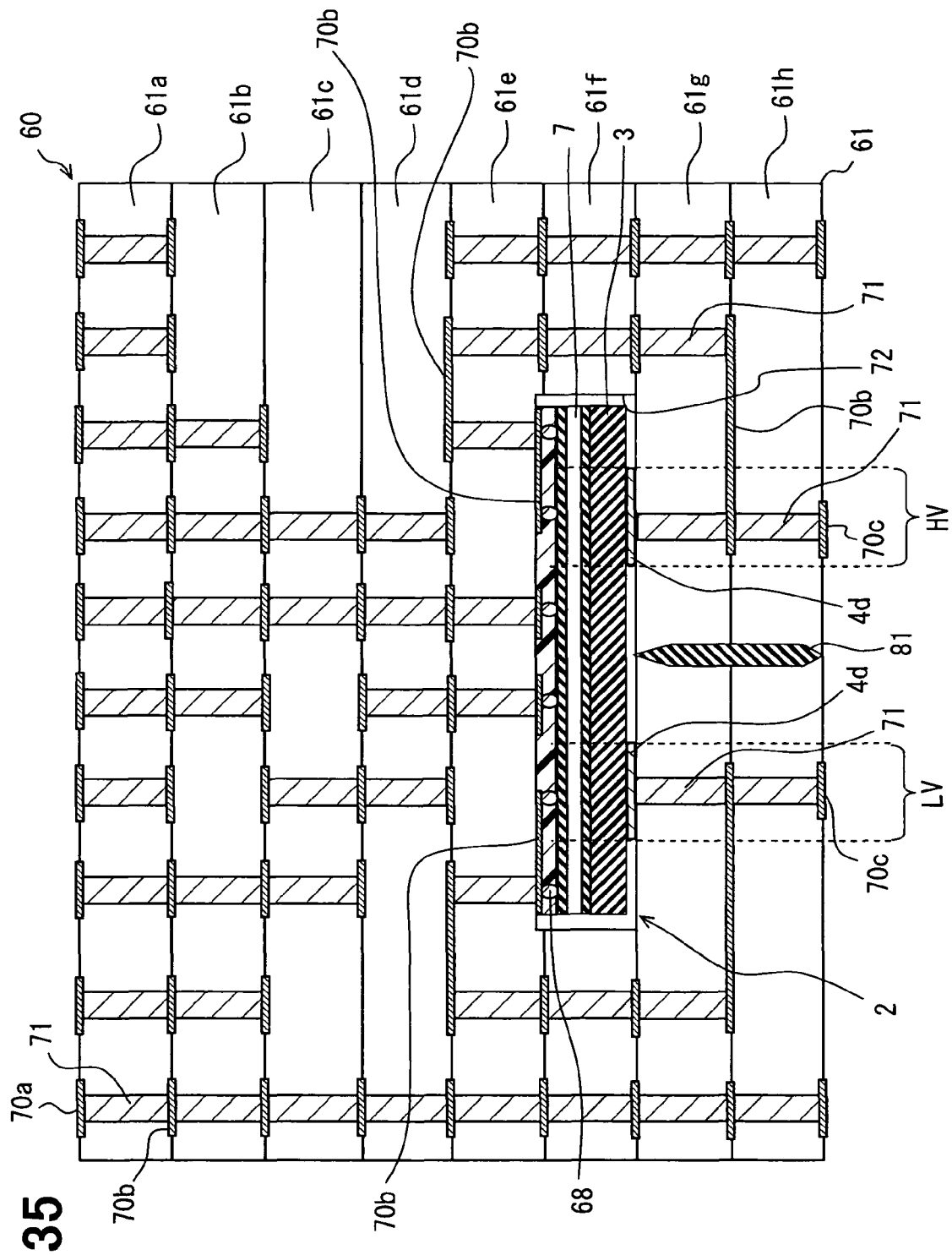
FIG. 35 is a cross sectional view showing a semiconductor device according to another example of the thirteenth embodiment.

When the device 1 includes the insulation member 81 shown in FIG. 35, occurrence of short-circuit caused by penetration of moisture into the interface between adjacent boards 61*g*, 61*h* is restricted. In addition, it is possible to improve the withstand voltage.

Figure 36:
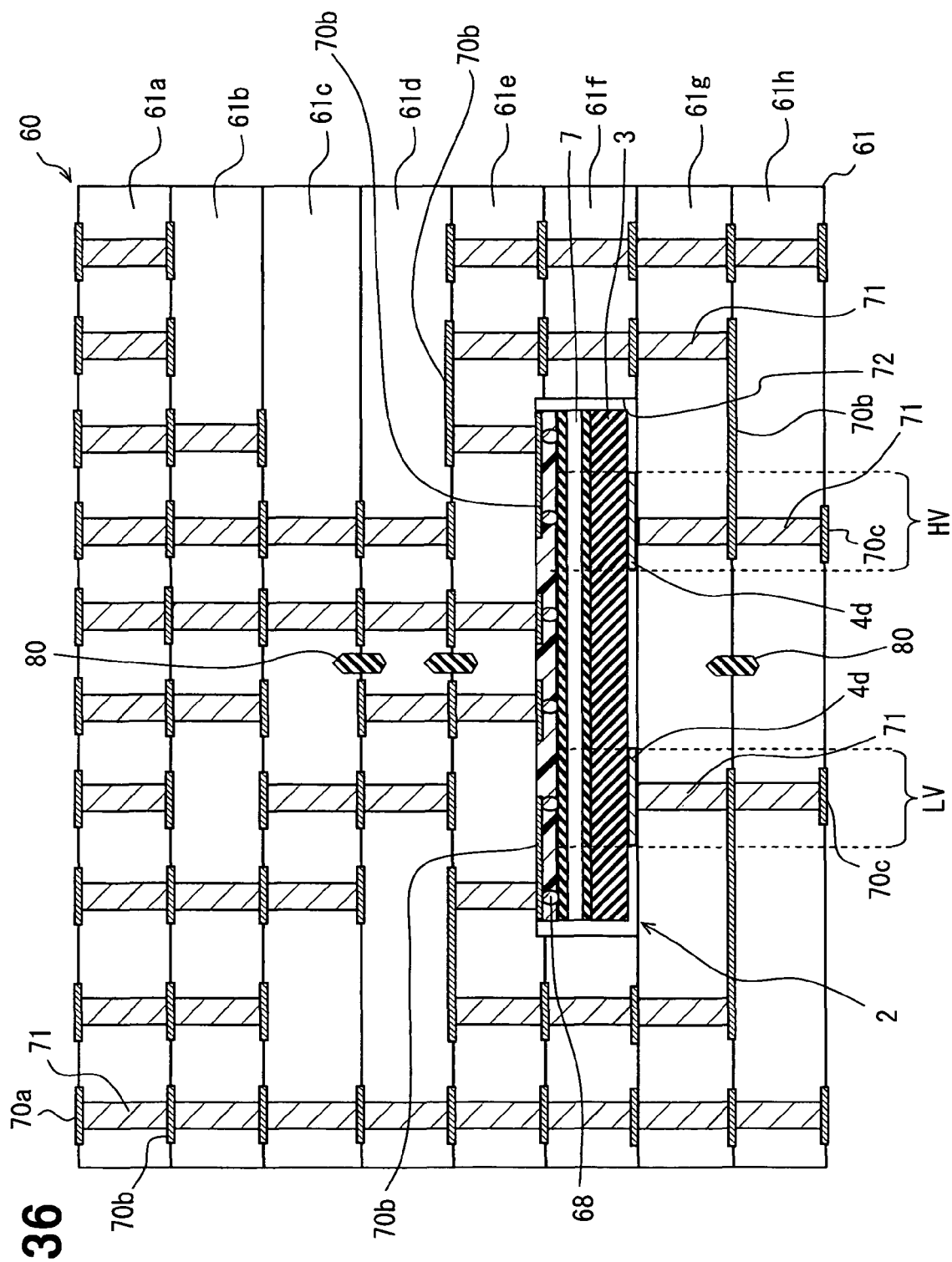
FIG. 36 is a cross sectional view showing a semiconductor device according to further another example of the thirteenth embodiment.

Further, as shown in FIG. 36, the insulation member 80 may be arranged not only on a side on which the insulation member 3 of the semiconductor chip 2 is formed but also to cross the interface between boards 61 on a circuit forming side (i.e., on a side on which the semiconductor layer 7 is formed). This is because the connection via 71 and the conductive pattern 70 on the circuit forming side may include one via 71 and one pattern 70, to which the first potential as the reference potential of the low potential reference circuit LV is applied, and another via 71 and another pattern 70, to which the second potential as the reference potential of the high potential reference circuit HV is applied. When the above described insulation member 80 is formed on the circuit forming side between the connection via 71 together with the conductive pattern 70, to which the first potential is applied, and the connection via 71 together with the conductive pattern 70, to which the second potential is applied, possibility of occurrence of short-circuit is much reduced.

As shown in FIG. 36, when an insulation member is formed on the circuit forming side, as shown in FIG. 35, an insulation member may be formed on the outer surface of the multi layer substrate 60 to reach the surface of the semiconductor chip 2. Alternatively, an insulation member arranged at each interface between adjacent boards 61 may be formed to have a length of the interface between adjacent boards contacting with each other. Thus, when the insulation member is made of material having insulation performance higher than the board 61, occurrence of short-circuit is restricted. In addition, a withstand voltage is improved.

Figure 37:
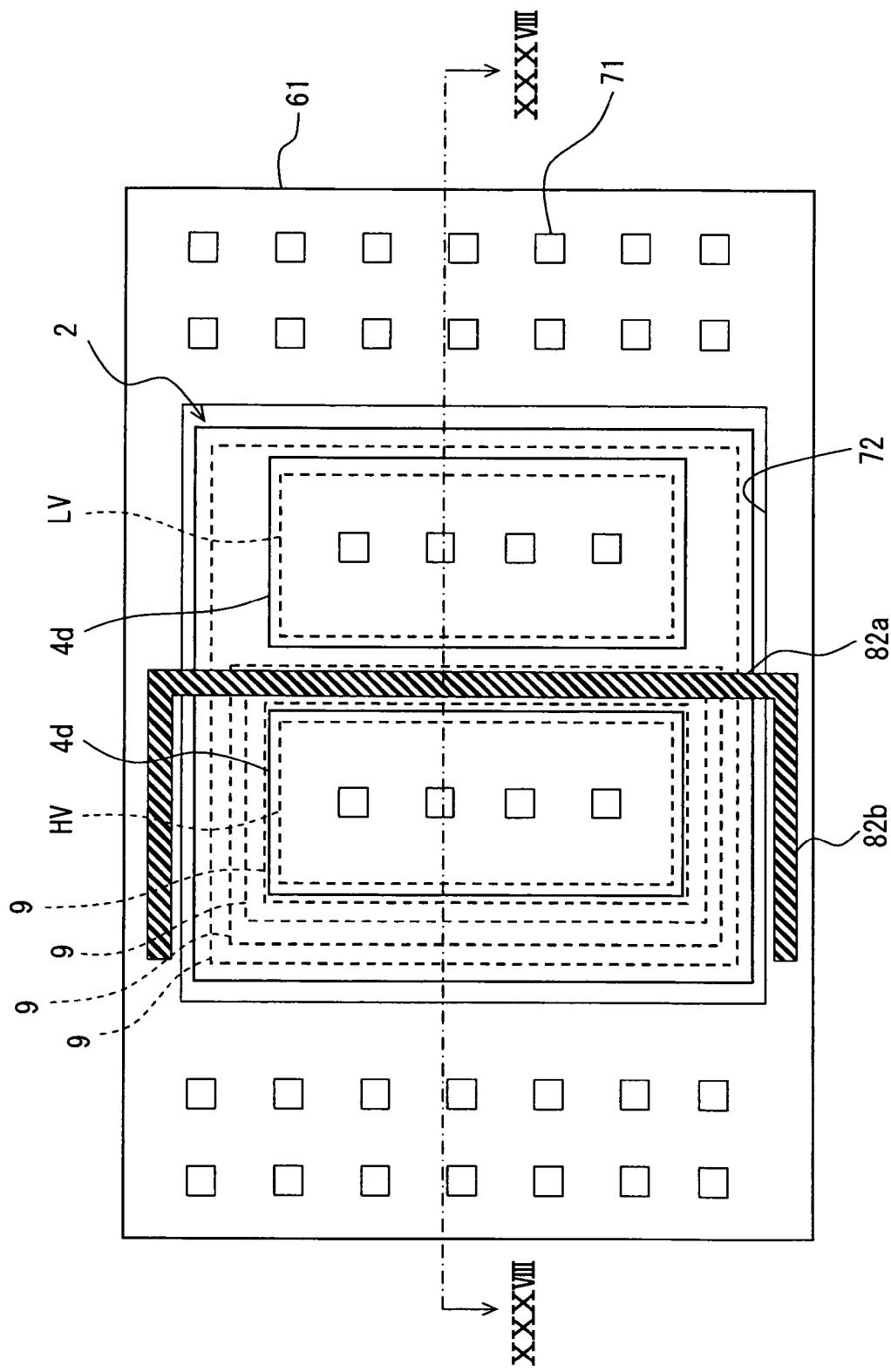
FIG. 37 is a cross sectional view showing a semiconductor device according to another example of the thirteenth embodiment.
Figure 38:
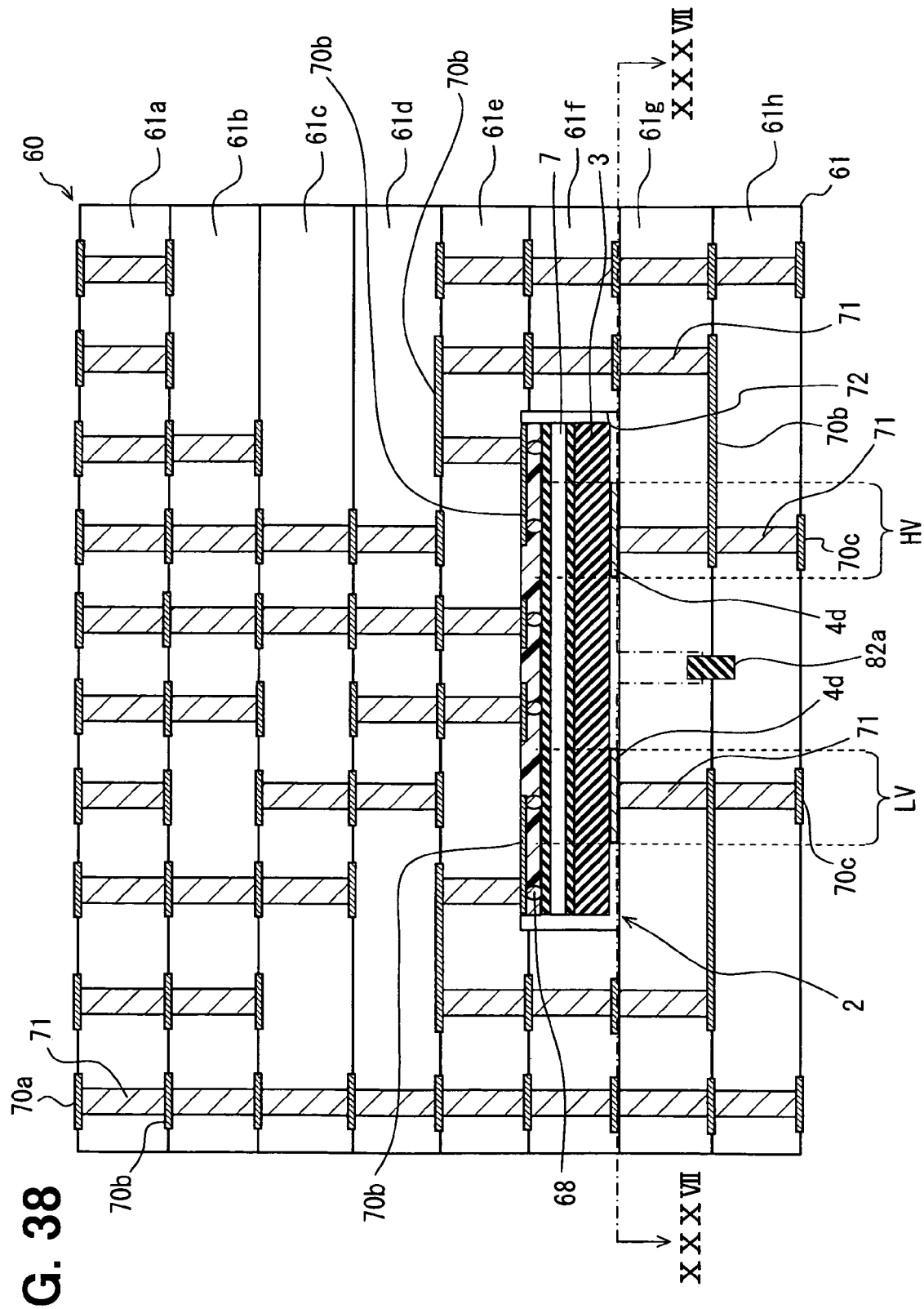
FIG. 38 is a cross sectional view showing the semiconductor device taken along line XXXVIII-XXXVIII in FIG. 37.

Instead of the insulation member 80, as shown in FIG. 37, an insulation member 82 may be formed. The insulation member 82 includes a main part 82a and a side part 82b. The main part 82a extends at least along with the length of a facing surface between the low potential reference circuit LV and the high potential reference circuit HV in the semiconductor chip 2. The side part 82b extends from each end of the main part 82a toward the high potential reference circuit HV. As shown in FIG. 38, the main part 82a of the insulation member 82 is formed to cross the interface between adjacent boards 61g, 61h. Regarding the side part 82b, the side part 82b has the same cross sectional shape as the main part 82a. The side part 82b is formed to cross the interface between adjacent boards 61g, 61h. Thus, when the insulation member 82 surrounds the connection via 71 together with the conductive pattern 70, to which the second potential of the high potential reference circuit HV is applied, from three directions, occurrence of short-circuit caused by moisture penetrating into the clearance at the interface between boards 61 is surely restricted.

The insulation member 82 may surround the connection via 71 together with the conductive pattern 70, to which the first potential of the low potential reference circuit LV is applied, from three directions. Alternatively, the insulation member 82 may be formed to have the length from the outer surface of the multi layer substrate 60 to the surface of the semiconductor chip 2 in the stacking direction of the multi layer substrate 60.

Figure 39:
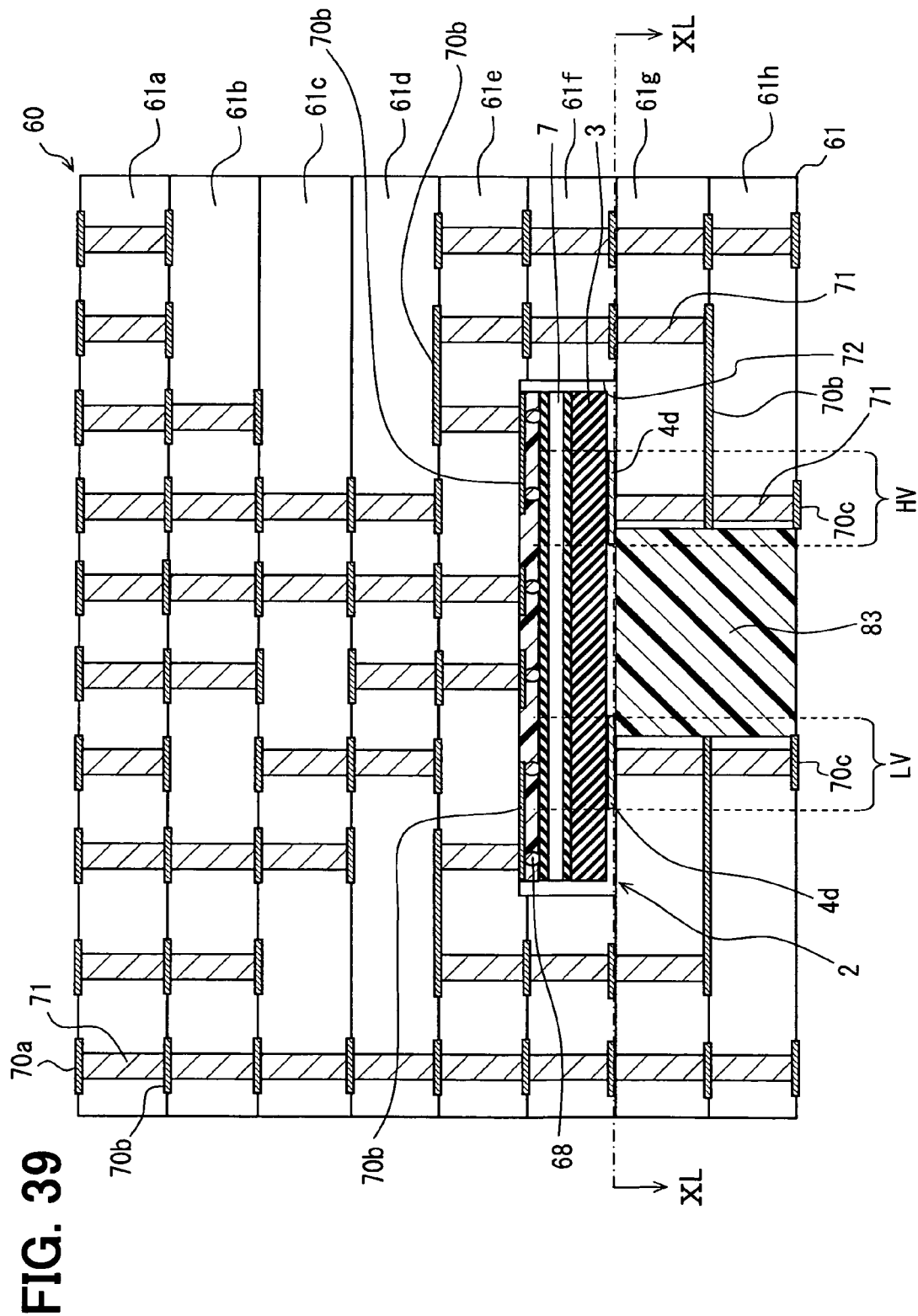
FIG. 39 is a cross sectional view showing a semiconductor device according to another example of the thirteenth embodiment.
Figure 40:
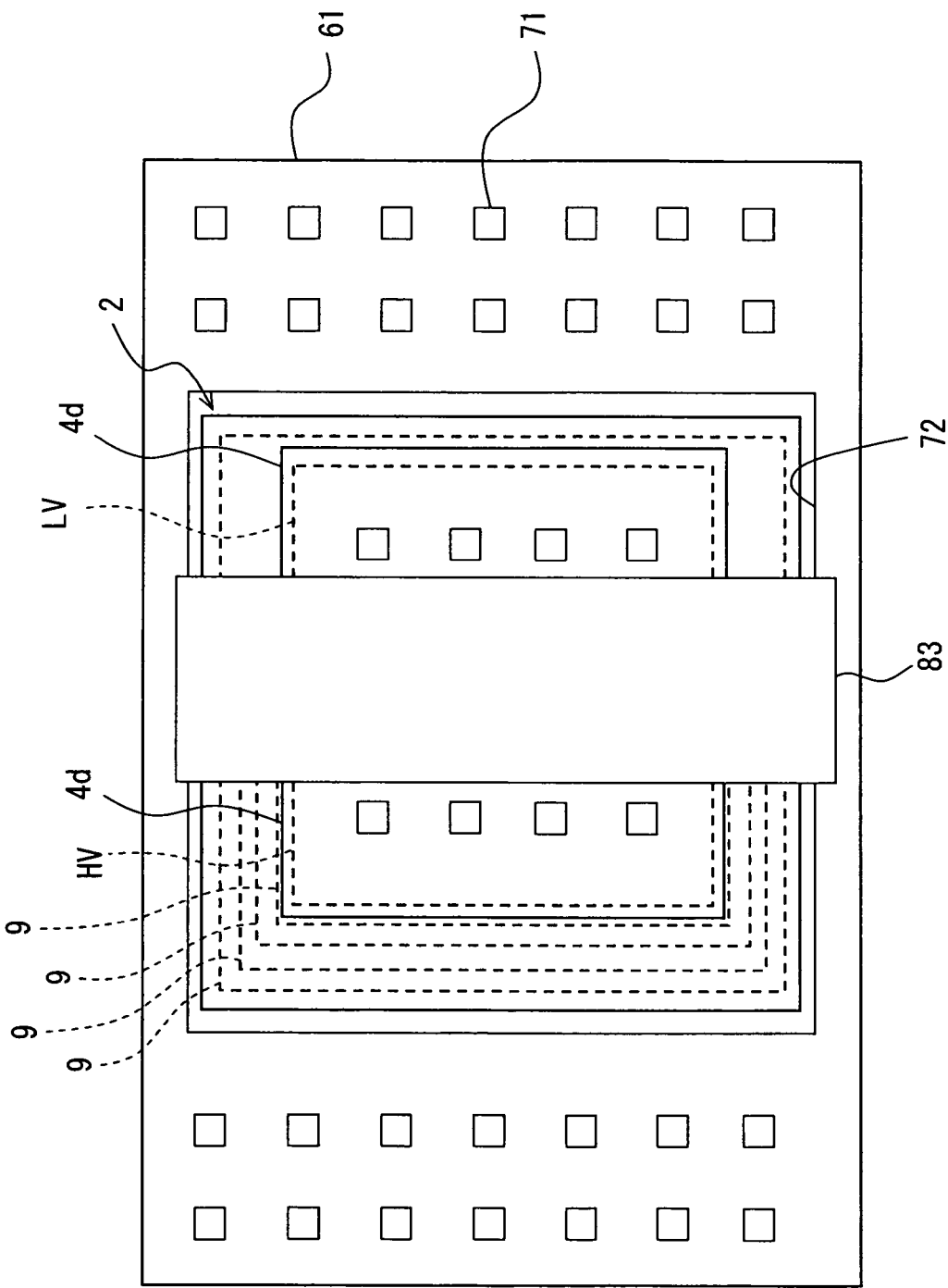
FIG. 40 is a plan view showing the semiconductor device taken along line XL-XL in FIG. 39.

Further, as shown in FIG. 39, the board 61 disposed between the connection via 71 together with the conductive pattern 70 connected to the metal film 4d opposite to the low potential reference circuit LV and the connection via 71 together with the conductive pattern 70 connected to the metal film 4d opposite to the high potential reference circuit HV may be replaced with the insulation member 83. The insulation member 83 is prepared such that a part of the board 61 from the surface of the multi layer substrate 60 to the surface of the semiconductor chip is removed, and high insulation performance material such as PIQ (poly imide) and mold resin (for example, epoxy resin) is embedded in the removed part. Thus, the insulation member 83 has insulation performance higher than the board 61. As shown in FIG. 40, the insulation member 83 has the length equal to or longer than at least the length of the facing surface between the low potential reference circuit LV and the high potential reference circuit HV in the semiconductor chip 2. Thus, occurrence of short-circuit is restricted even when moisture penetrates. Further, a withstand voltage is improved.

The above described insulation members 80-83 are formed in the multi layer substrate 60 such that a groove or a through hole corresponding to the dimensions of each insulation member 80-83 is formed in the board 61 on which the insulation member 80-83 is arranged, and the board 61 on which the insulation member 80-83 is mounted is stacked. However, for example, the insulation member 83 may be formed in the multi layer substrate 60 such that a board region for embedding the insulation member 83 therein is removed, and the insulation member 83 is inserted into the removed region after the multi layer substrate 60 is formed.

Fourteenth Embodiment

Figure 41:
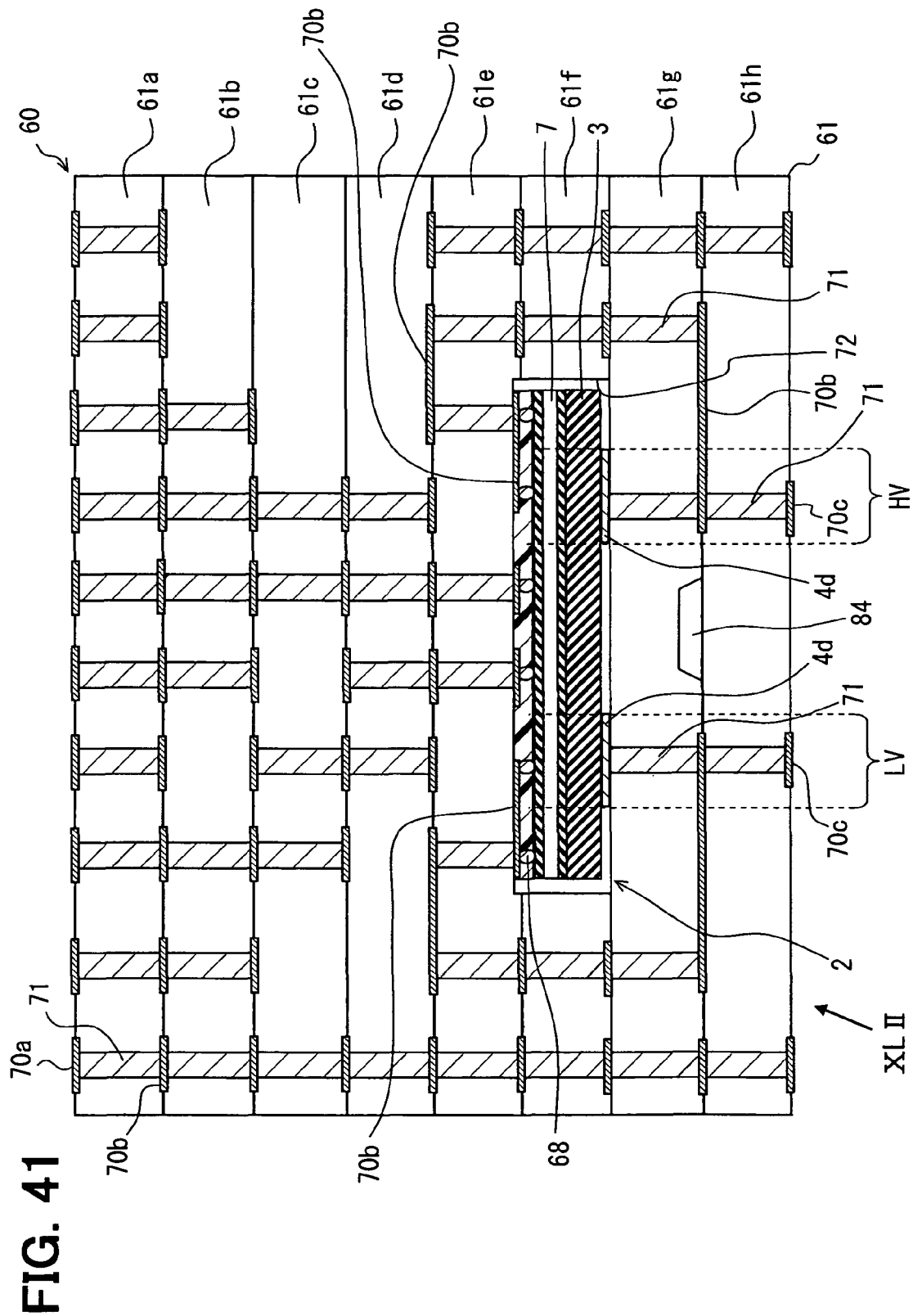
FIG. 41 is a cross sectional view showing a semiconductor device according to a fourteenth embodiment.
Figure 42:
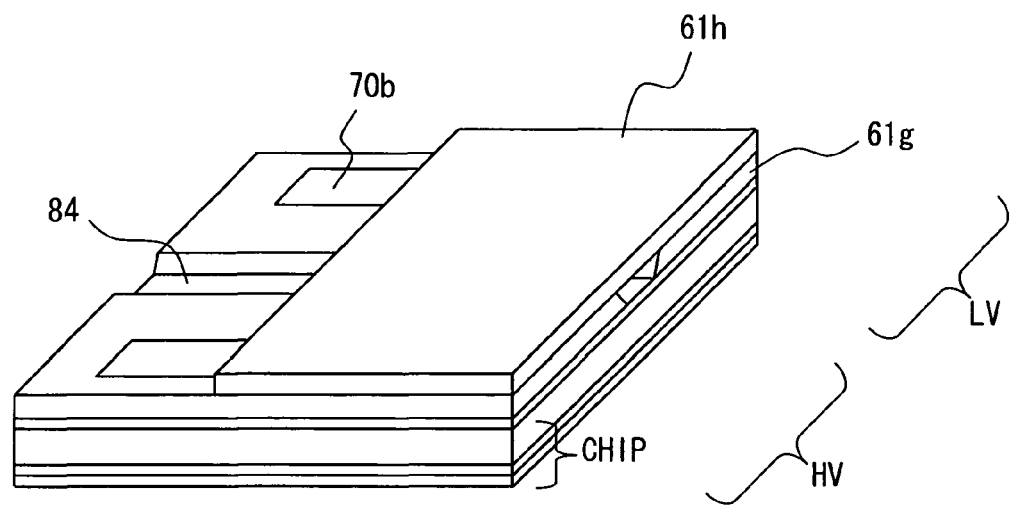
FIG. 42 is a perspective view showing a part of a multi layer substrate 60 seeing from a direction of an arrow XLII.

Next, a fourteenth embodiment of the present invention will be explained with reference to FIGS. 41 and 42. FIG. 41 is a cross sectional view showing the fourteenth embodiment. FIG. 42 is a perspective view showing a part of a multi layer substrate 60 seeing from a direction of an arrow XLII in FIG. 41.

In the present embodiment, in the multi layer substrate 60 having the semiconductor chip 2 built-in, which is explained in the above twelfth embodiment, a hollow portion 84 is formed at the interface between adjacent boards 61g, 61h, and disposed between the connection via 71 together with the conductive pattern 70 (i.e., the inner layer pattern 70b) connected to the metal film 4d opposite to the low potential reference circuit LV to be applied with the reference potential (the first potential) of the low potential reference circuit LV and the connection via 71 together with the conductive pattern 70 (i.e., the inner layer pattern 70b) connected to the metal film 4d opposite to the high potential reference circuit HV to be applied with the reference potential (the second potential) of the high potential reference circuit HV. As shown in FIG. 41, the hollow portion 84 extends along with an adjacent surface between the low potential reference circuit LV and the high potential reference circuit HV facing each other in the semiconductor chip 2. The hollow portion 84 has a length of at least the adjacent surface between the low potential reference circuit LV and the high potential reference circuit HV facing each other. Here, the hollow portion 84 ends not to reach the side of the multi layer substrate 60. Both ends of the hollow portion 84 are blocked by the board 61 of the multi layer substrate 60.

In this construction of the present embodiment, even when moisture penetrates into the clearance at the interface between the boards 61g, 61h, the moisture is trapped at the hollow portion 84. Accordingly, possibility of occurrence of short-circuit between the connection via 71 together with the conductive pattern 70 to which the first potential is applied and the connection via 71 together with the conductive pattern 70 to which the second potential is applied is reduced.

Fifteenth Embodiment

Figure 44:
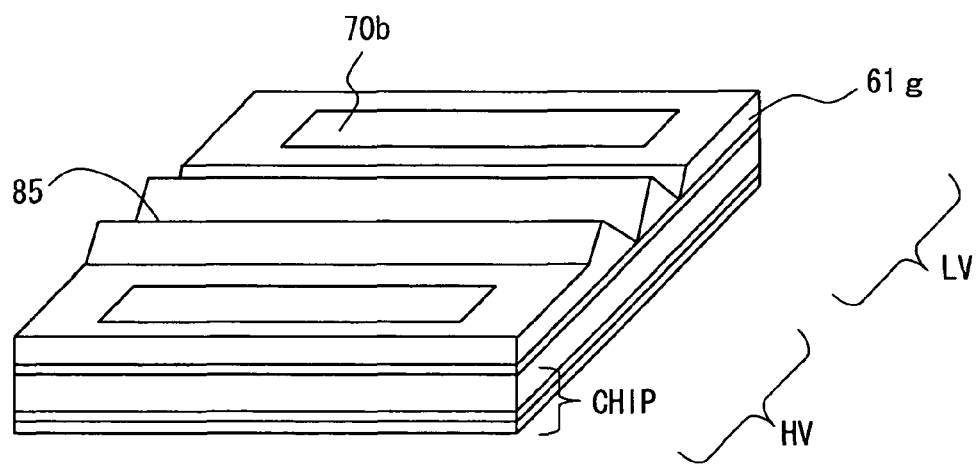
FIG. 44 is a perspective view showing a part of the semiconductor chip 2 and a part of a base 61g adjacent to the semiconductor chip 2, which are retrieved.
Figure 43:
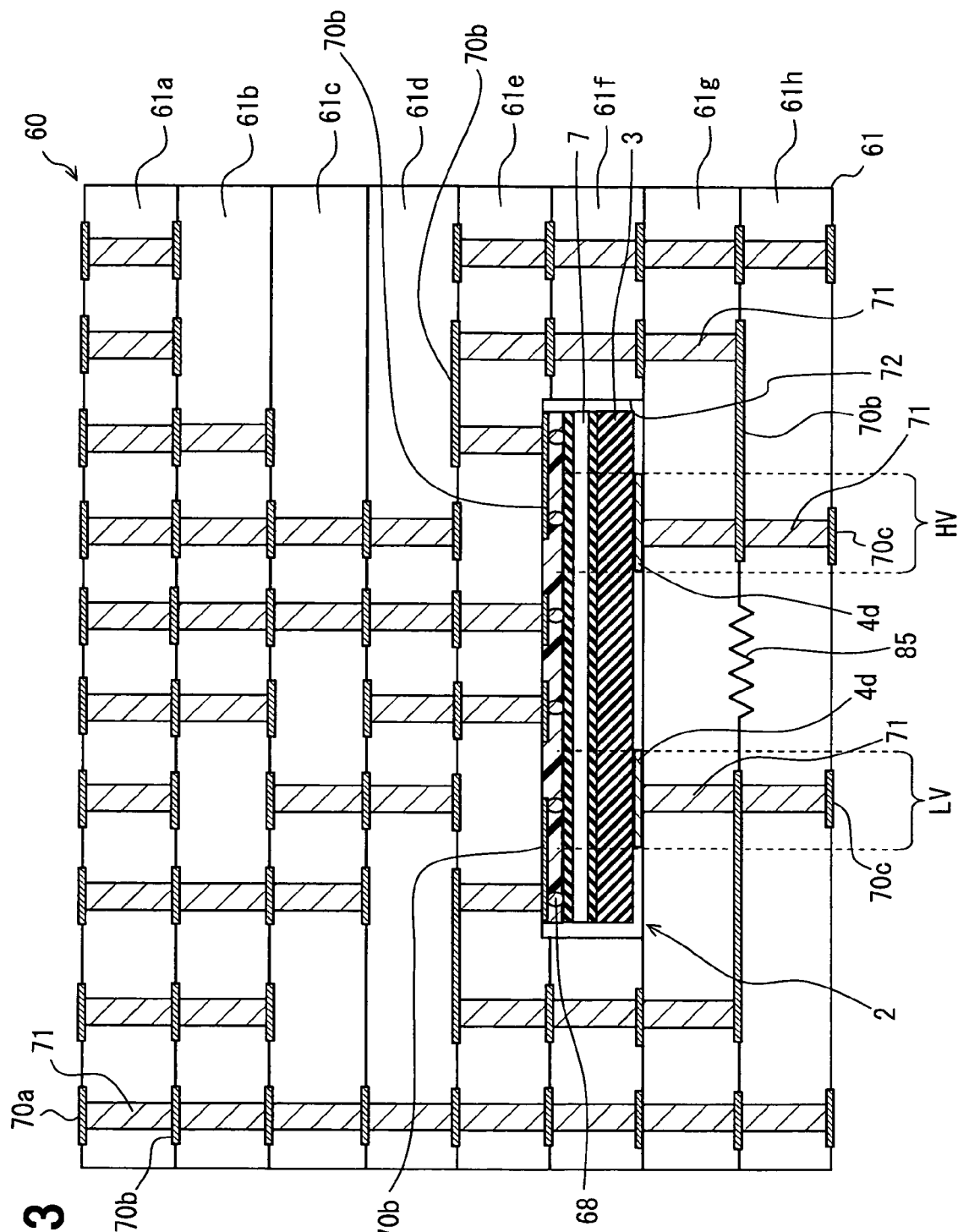
FIG. 43 is a cross sectional view showing a semiconductor device according to a fifteenth embodiment.

Next, a fifteenth embodiment of the present invention will be explained with reference to FIGS. 43 and 44. FIG. 43 is a cross sectional view showing the fifteenth embodiment. FIG. 44 is a perspective view showing a part of the semiconductor chip 2 and a part of a base 61g adjacent to the semiconductor chip 2, which are retrieved.

In the present embodiment, in the multi layer substrate 60 having the semiconductor chip 2 built-in the substrate 60, which is explained in the above twelfth embodiment, concavity and convexity portions 85 engaged with each other are formed on the surfaces of adjacent boards 61g, 61h, and disposed between the connection via 71 together with the conductive pattern 70 (i.e., the inner layer pattern 70b) connected to the metal film 4d opposite to the low potential reference circuit LV to be applied with the reference potential (the first potential) of the low potential reference circuit LV and the connection via 71 together with the conductive pattern 70 (i.e., the inner layer pattern 70b) connected to the metal film 4d opposite to the high potential reference circuit HV to be applied with the reference potential (the second potential) of the high potential reference circuit HV. As shown in FIG. 44, the concavity and convexity portions 85 are formed, for example, to have a triangle wave shape. The concavity and convexity portions 85 extend along with an adjacent surface between the low potential reference circuit LV and the high potential reference circuit HV facing each other in the semiconductor chip 2. The concavity and convexity portions 85 has a length of at least the adjacent surface between the low potential reference circuit LV and the high potential reference circuit HV facing each other.

Here, the shape of the concavity and convexity portions 85 is not limited to the triangle wave shape. Alternatively, the shape of the concavity and convexity portions 85 may be a rectangular shape with a concavity portion and a convexity portion. Alternatively, multiple triangular pyramids or quadrangular pyramids may be formed on the surface of the board 61.

Thus, when the concavity and convexity portions 85 are formed on the surfaces of the adjacent boards 61g, 61h to engage with each other, a length of a passage for generation of short-circuit caused by penetrated moisture is lengthened between the connection via 71 together with the conductive pattern 70 to which the first potential is applied and the connection via 71 together with the conductive pattern 70 to which the second potential is applied. Accordingly, even when moisture penetrates into the interface between the boards 61g, 61h, occurrence of short-circuit caused by the moisture is limited.

Sixteenth Embodiment

Figure 45:
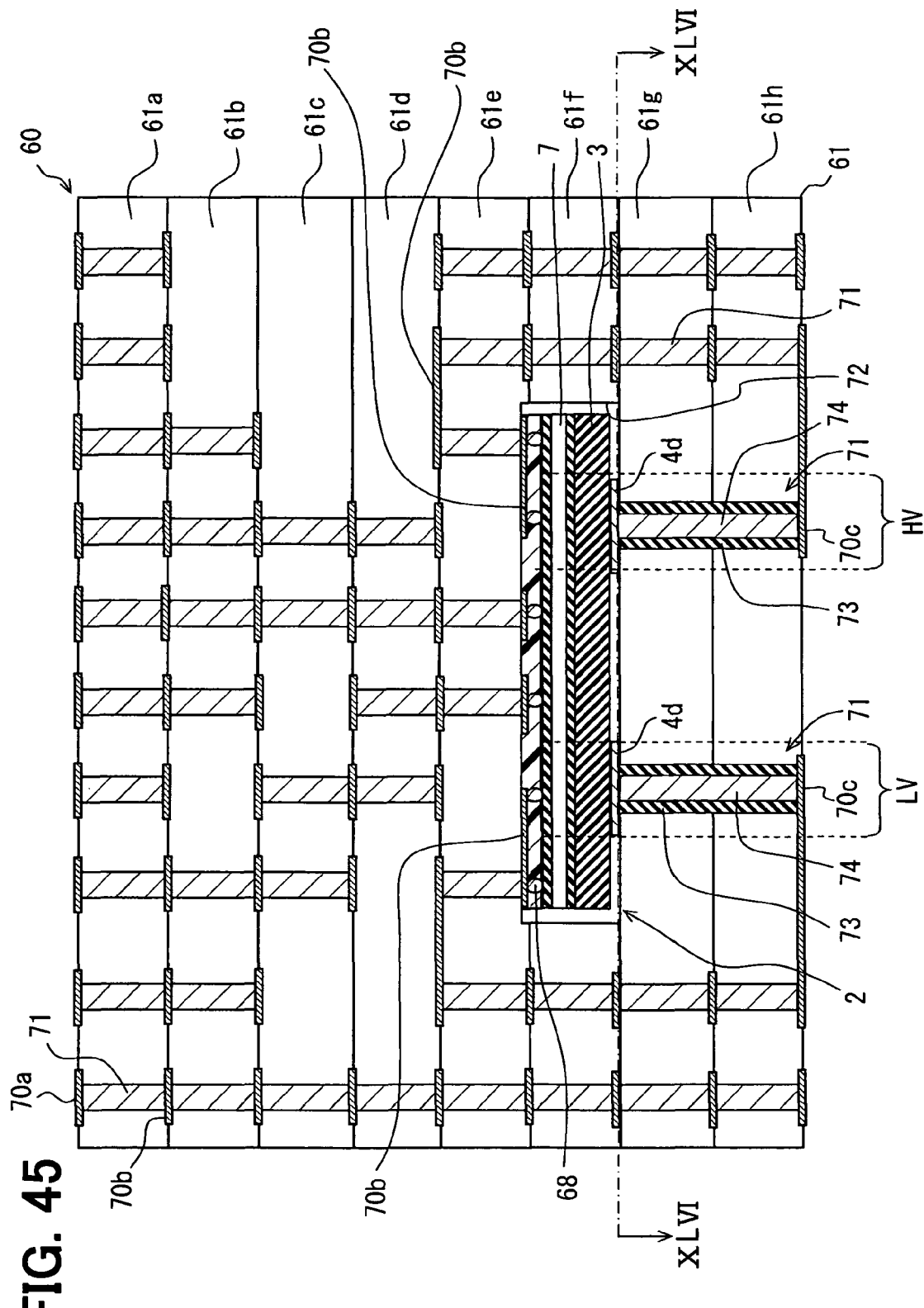
FIG. 45 is a cross sectional view showing a semiconductor device according to a sixteenth embodiment.
Figure 46:
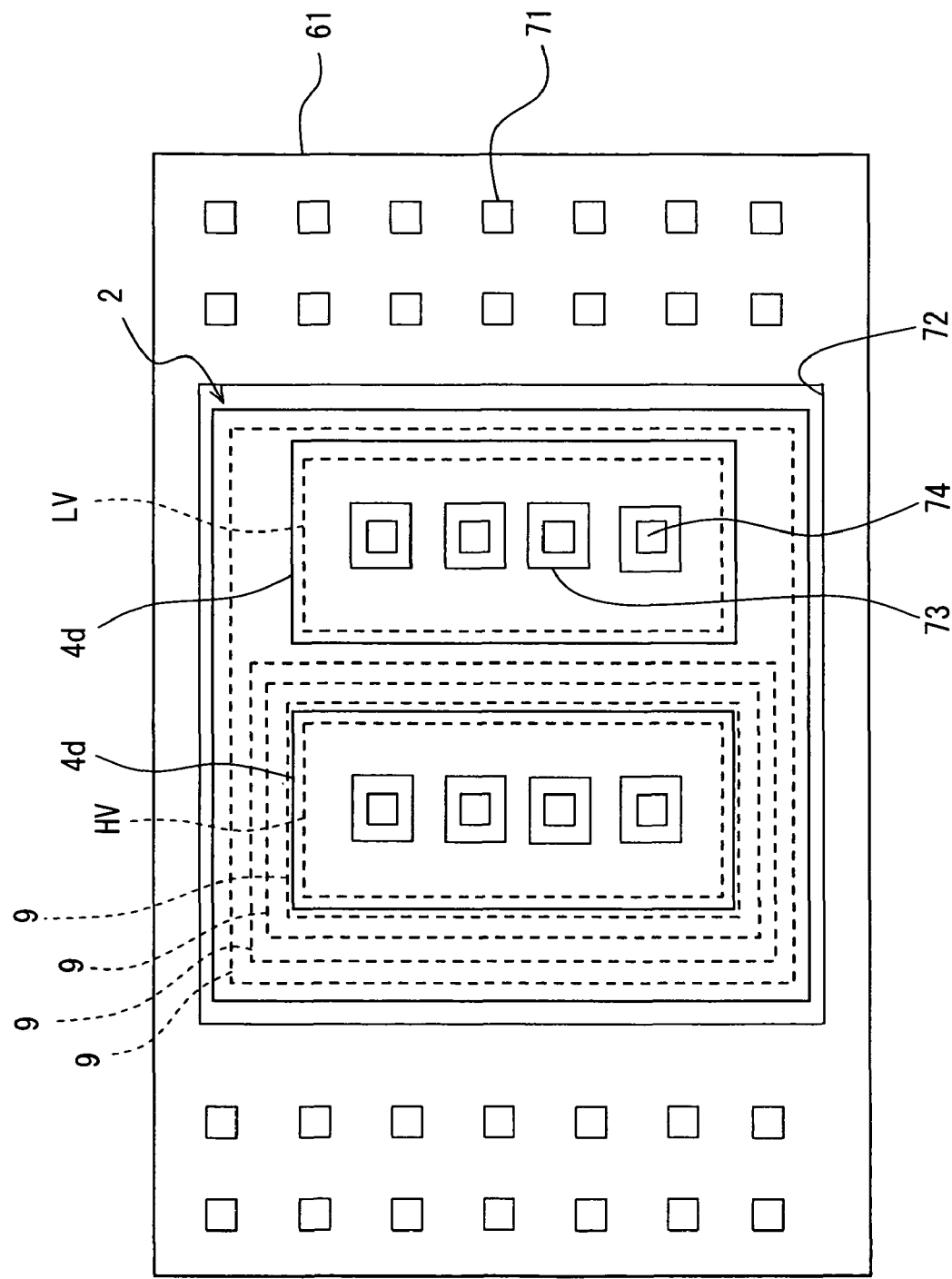
FIG. 46 is a plan view showing the semiconductor device taken along line XLVI-XLVI in FIG. 45.

Next, a sixteenth embodiment of the present invention will be explained with reference to FIGS. 45 and 46. FIG. 45 is a cross sectional view showing the sixteenth embodiment. FIG. 46 is a plan view taken along line XLVI-XLVI in FIG. 45.

In the present embodiment, in the multi layer substrate 60 having the semiconductor chip 2 built-in, which is explained in the above twelfth embodiment, the connection via 71 connected to the metal film 4d opposite to the low potential reference circuit LV and the connection via 71 connected to the metal film 4d opposite to the high potential reference circuit HV are comprised of the conductive member 74 and the insulation member 73 having high insulation performance and cylindrical shape and arranged around the conductive member 74.

Specifically, the insulation member 73 of the connection via 71 is made of material such as ceramics, glass and high insulation performance resin (for example, KE-G3000D made by KYOCERA Chemical Corporation and PIX3400 made by Hitachi Chemical Co., Ltd.) having insulation performance higher than the board 61 for providing the multi layer substrate 60.

As shown in FIG. 46, multiple connection vias 71 contacting various metal films 4d are formed with respect to one metal film 4d. Each of all of the connection vias 71 includes the insulation member 73 and the conductive member 74. The insulation member 73 has a length from the outer surface of the multi layer substrate 60 to the metal film 4d of the semiconductor chip 2. The connection via 71 comprised of the insulation member 73 and the conductive member 74 is formed such that the conductive member 74 is preliminary arranged in the insulation member 73, and the member 73 with the conductive member 74 is inserted into a via hole of the board 61g, 61h.

Thus, in the present embodiment, the conductive member 74 is surrounded with the insulation member 73 having high insulation performance in the connection via 71 connected to the metal film 4d. Thus, insulation performance between the connection vias 71 is increased, and a withstand voltage is improved.

FIG. 45 shows an example that the insulation member 73 has the length from the outer surface of the multi layer substrate to the metal film 4d. Alternatively, the insulation member 73 may have the length equal to the thickness of each board 61.

However, in the above case, the insulation member 73 is cut at the interface between the boards 61g, 61h. Accordingly, the moisture penetrating into the interface between the boards 61g, 61h may cause short-circuit between the conductive members 74 in the insulation member 73 of the connection via 71 connected to the metal film 4d corresponding to the low potential reference circuit LV and the insulation member 73 of the connection via 71 connected to the metal film 4d corresponding to the high potential reference circuit HV.

Figure 47:
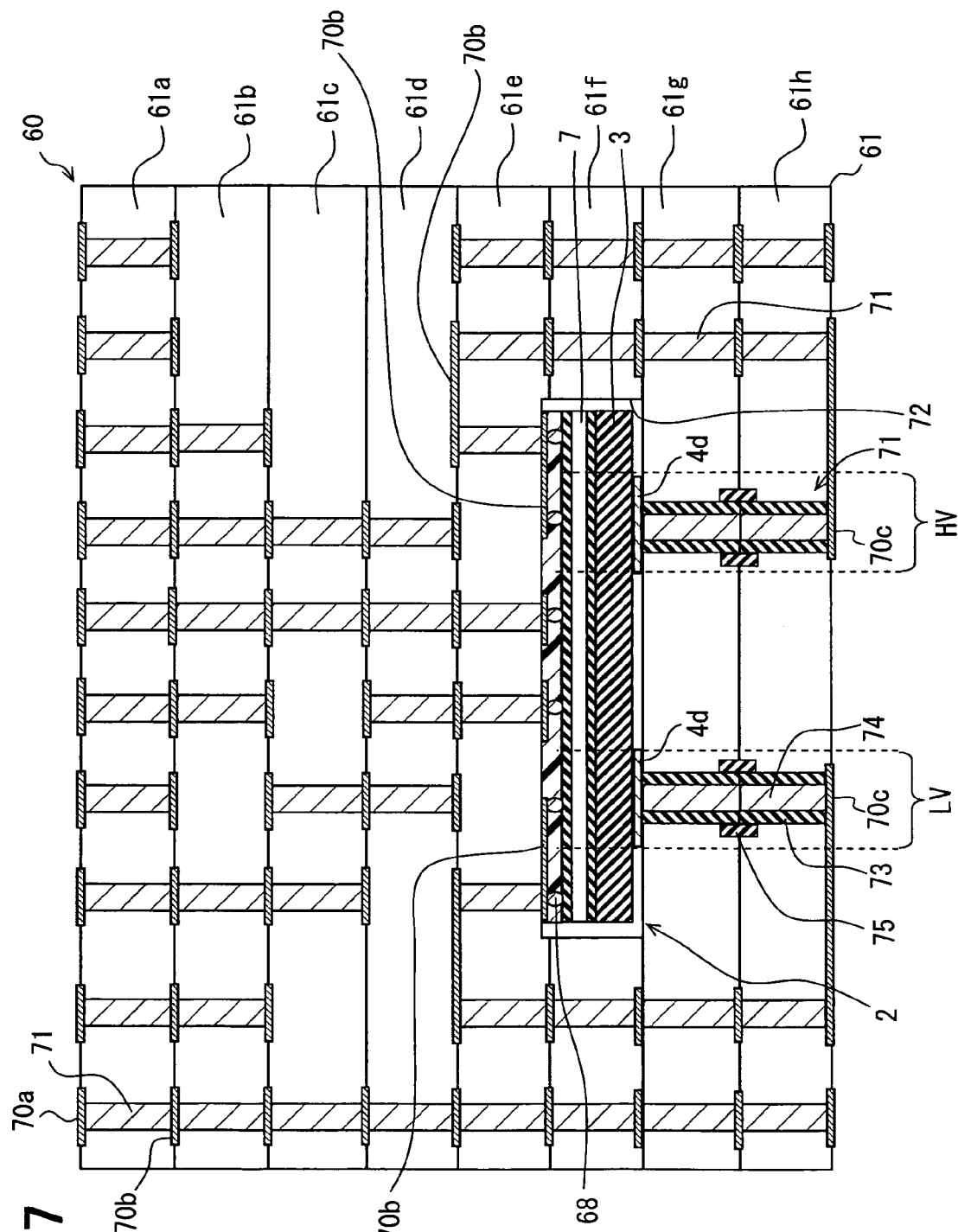
FIG. 47 is a cross sectional view showing a semiconductor device according to another example of the sixteenth embodiment.

Accordingly, when the insulation member 73 has the length equal to the thickness of each board 61, as shown in FIG. 47, an insulation member 75 having a ring shape is preferably formed at the interface between the boards 61g, 61h so as to surround a contact portion between two insulation members 73.

When the insulation member 73 has the length equal to the thickness of each board 61, the insulation member 73 can be preliminary embedded in the board 61. Thus, the manufacturing process of the multi layer substrate is simplified. Further, since the insulation member 75 is formed to surround the contact portion between two insulation members 73, even when moisture penetrates into the clearance at the interface between the adjacent boards 61g, 61h, the moisture is prevented from reaching the conductive member 74 in the insulation member 73. Accordingly, occurrence of shirt-circuit caused by the penetrated moisture is restricted.

Figure 48:
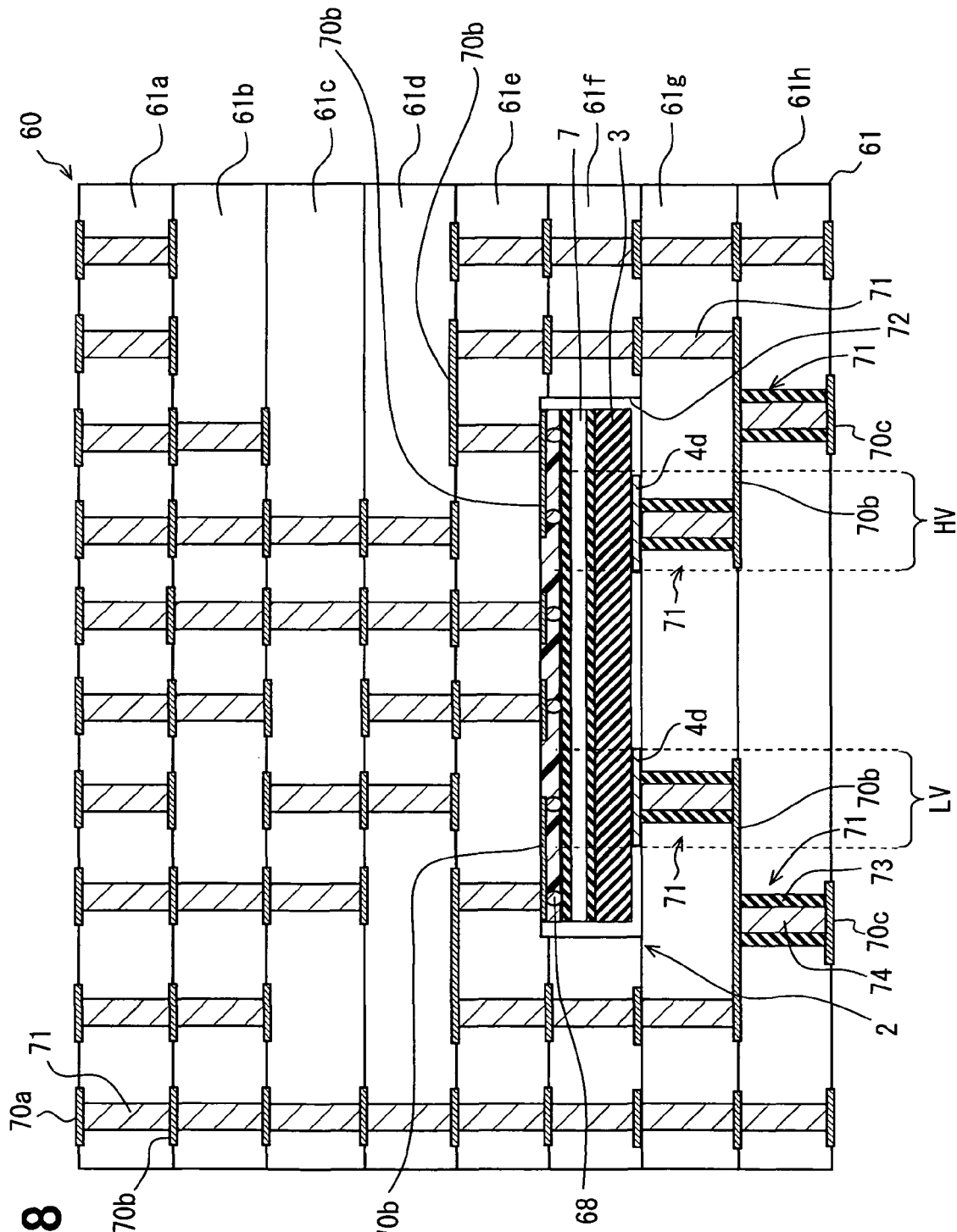
FIG. 48 is a cross sectional view showing further another example of the sixteenth embodiment.

Further, when the insulation member 73 has the length equal to the thickness of each board 61, as shown in FIG. 48, the distance between the connection via 71 connected to the land 70c on the surface of the multi layer substrate 60 to be applied with the first potential and the connection via 71 connected to the land 70c on the surface of the multi layer substrate 60 to be applied with the second potential may be wider than the distance between the connection via 71 connected to the metal film 4d to be applied with the first potential of the low potential reference circuit LV and the connection via 71 connected to the metal film 4d to be applied with the second potential of the high potential reference circuit HV. In this case, the connection via 71 connected to the metal film 4d and the connection via 71 connected to the land 70c are coupled with each other via the inner layer pattern 70b.

When three or more board layers 61 are disposed from the metal film 4d of the semiconductor chip 2 to the land 70c on the surface of the multi layer substrate 60, the distance between the connection vias 71 from the first layer board 61 near the semiconductor chip 2 to the surface layer board 61 may gradually expands. Alternatively, the distance between the connection vias 71 from the second or more layer board 61 to the surface layer board 61 may be constant, and wider than the distance between the connection vias of the first layer board 61.

Thus, in the board 61 near the surface of the multi layer substrate 60, when the distance between the connection via 71 to which the first potential is applied and the connection via 71 to which the second potential is applied is widened, the insulation performance is easily secured. Accordingly, the insulation member 73 made of material having comparatively high insulation performance and being expensive is used for the connection via 71 connected to the metal film. The insulation member 73 made of material having comparatively low insulation performance and being less expensive is used for the connection via 71 of the board 61 near the surface of the multi layer substrate 60. Thus, it is possible to reduce the manufacturing cost.

Seventeenth Embodiment

Figure 49:
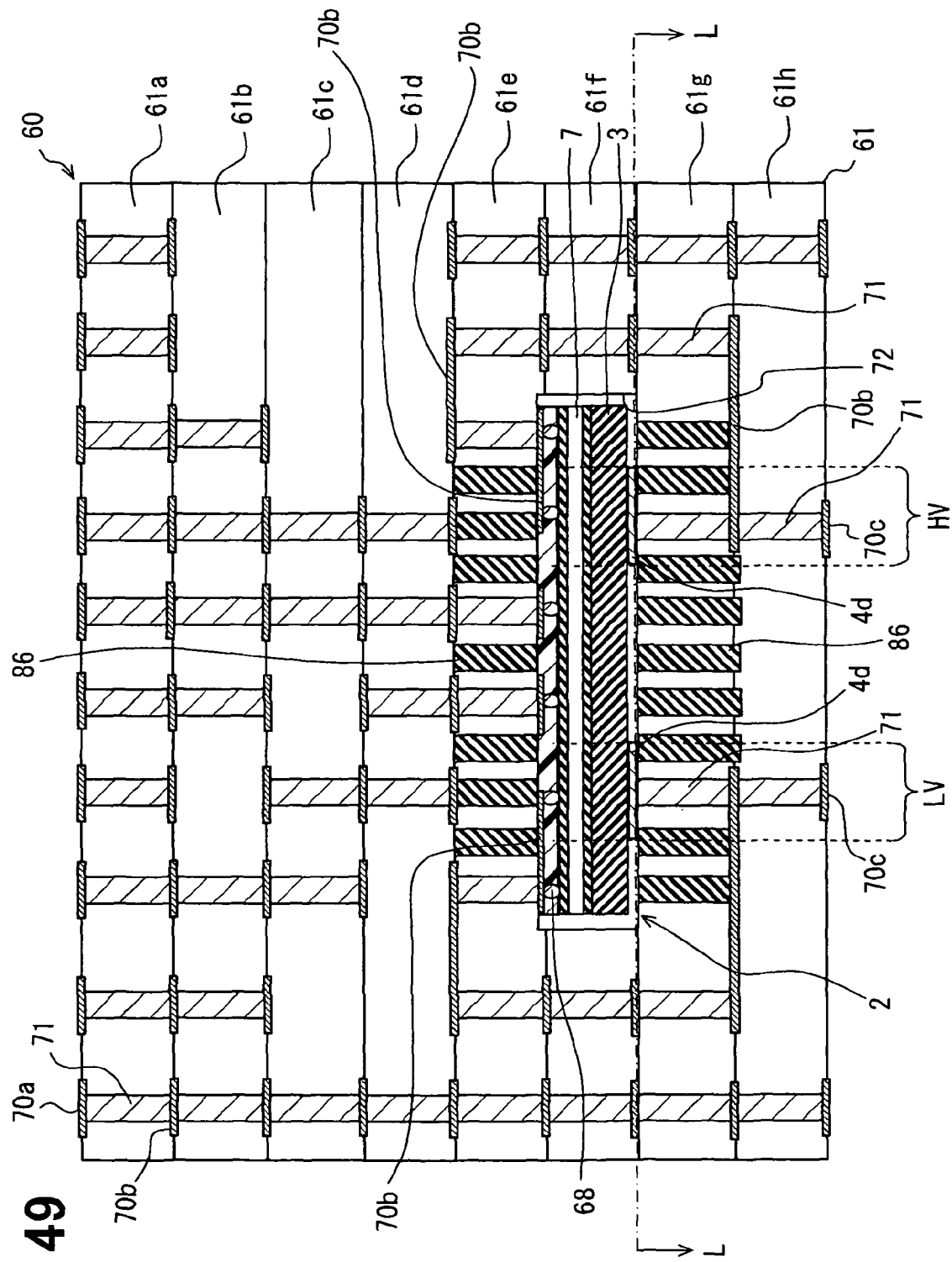
FIG. 49 is a cross sectional view showing a semiconductor device according to a seventeenth embodiment.
Figure 50:
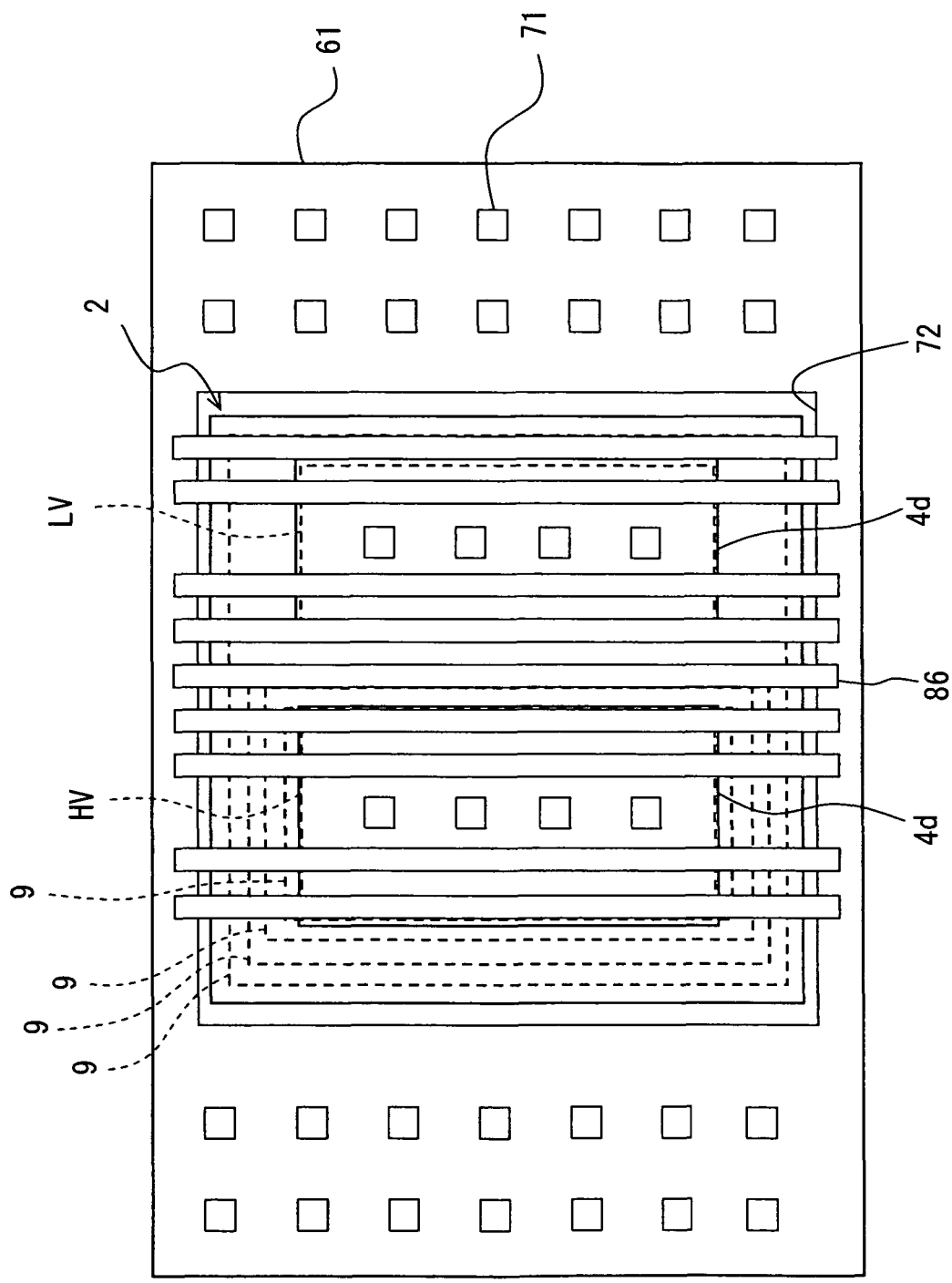
FIG. 50 is a plan view showing the semiconductor device along with line L-L in FIG. 49.

Next, a seventeenth embodiment of the present invention will be explained with reference to FIGS. 49 and 50. FIG. 49 is a cross sectional view showing the seventeenth embodiment. FIG. 50 is a plan view taken along line L-L in FIG. 49.

In the present embodiment, as shown in FIG. 49, multiple insulation members 86 are formed in at least the boards 61e, 61g disposed both sides of the semiconductor chip 2 and contacting the chip 2 in the stacking direction of the multi layer substrate 60. Each insulation member 86 penetrates the board 64e, 64g, and contacts the semiconductor chip 2. When the insulation members 86 are formed, a stress to be applied to the semiconductor chip 2 is uniformed when the multi layer substrate 60 is manufactured and after the multi layer substrate 60 is manufactured. Thus, generation of warpage of the semiconductor device is prevented.

As shown in FIG. 50, the insulation member 86 has at least the length of the facing surface between the between the low potential reference circuit LV and the high potential reference circuit HV facing each other in the semiconductor chip 2. As shown in FIG. 49, the insulation member 86 disposed between the connection via 71 together with the conductive pattern 70, which are coupled with the metal film 4d opposite to the low potential reference circuit LV and applied with the first potential, and the connection via 71 together with the conductive pattern 70, which are coupled with the metal film 4d opposite to the high potential reference circuit HV and applied with the second potential penetrates the board 61g contacting the semiconductor chip 2, and further, extends to a position at which the insulation member 86 crosses the interface between the board 61g and the adjacent board 61h. Thus, even when moisture penetrates into the interface between the adjacent boards 61g, 61h, possibility of occurrence of short-circuit between the connection via 71 together with the conductive pattern 70 applied with the first potential and the connection via 71 and the conductive patter 70 applied with the second potential is reduced.

Figure 51:
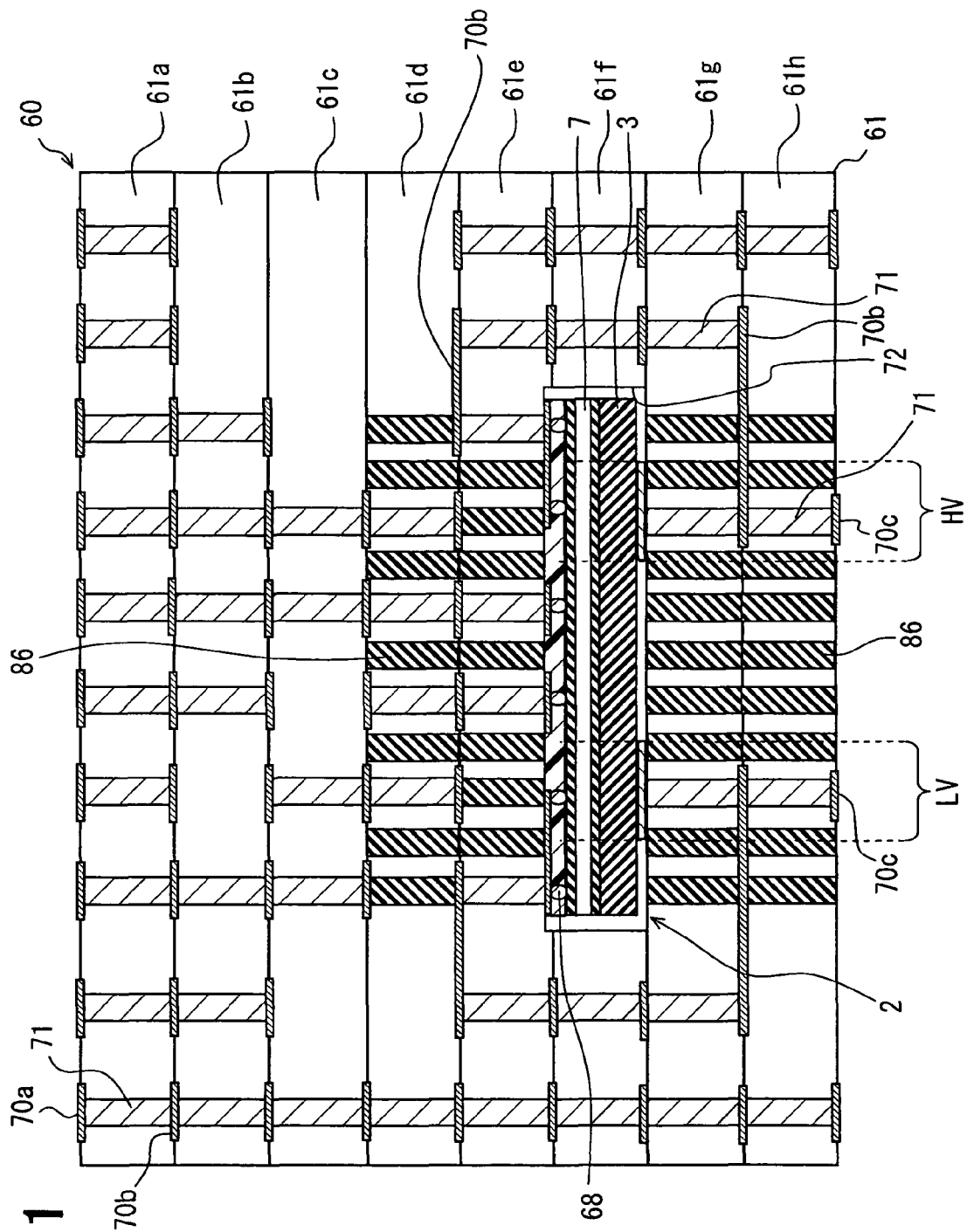
FIG. 51 is a cross sectional view showing another example of the seventeenth embodiment.

As shown in FIG. 51, the insulation member 86 has insulation performance higher than the board 61 for providing the multi layer substrate 60. The insulation member 86 may be formed to penetrate multiple boards 61 adjacent to the semiconductor chip 2 at least in a region of the length of the facing surface between the low potential reference circuit LV and the high potential reference circuit HV facing each other in the semiconductor chip 2. Thus, the breakdown voltage is improved.

Eighteenth Embodiment

Figure 52:
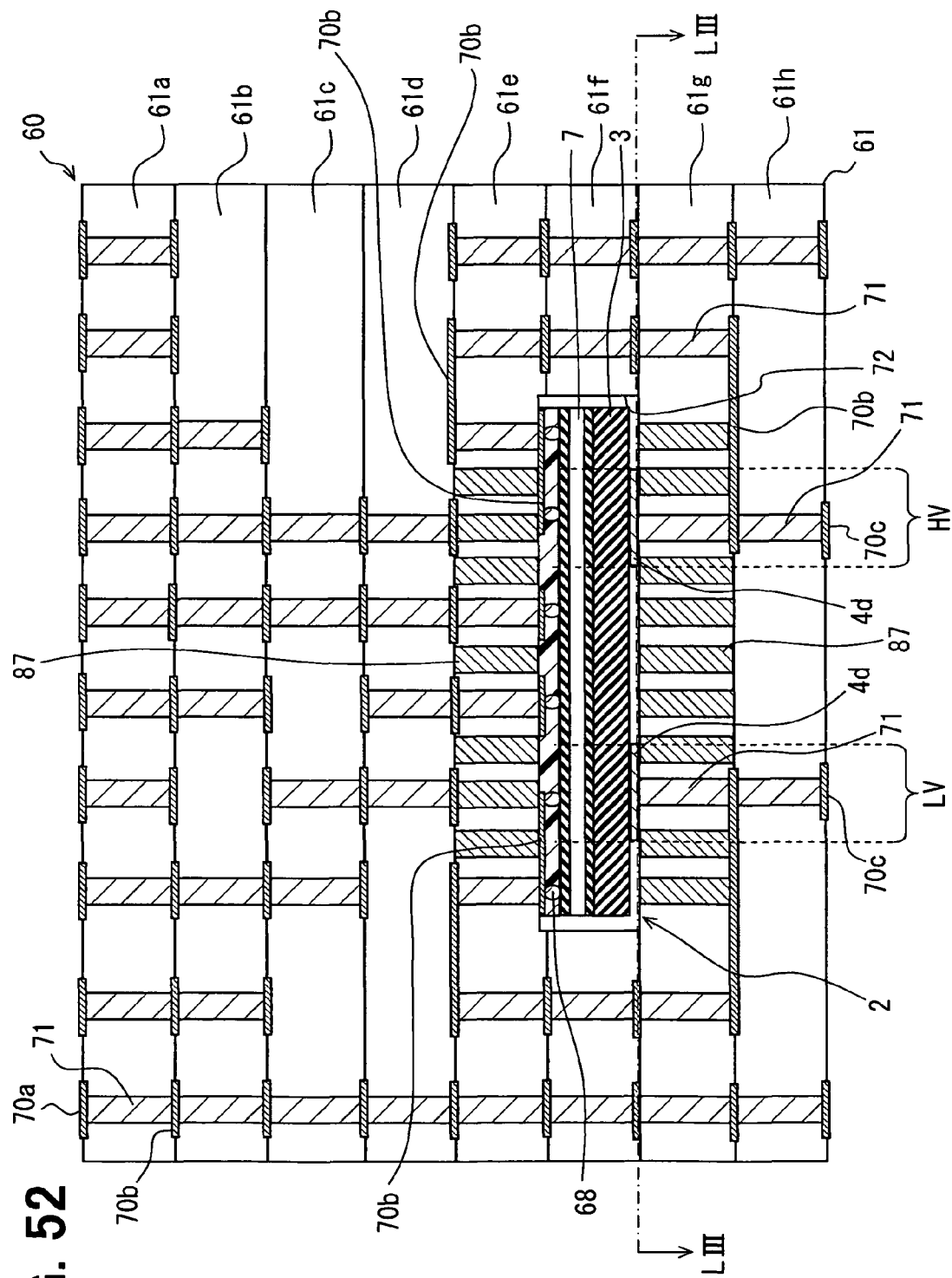
FIG. 52 is a cross sectional view showing a semiconductor device according to an eighteenth embodiment.
Figure 53:
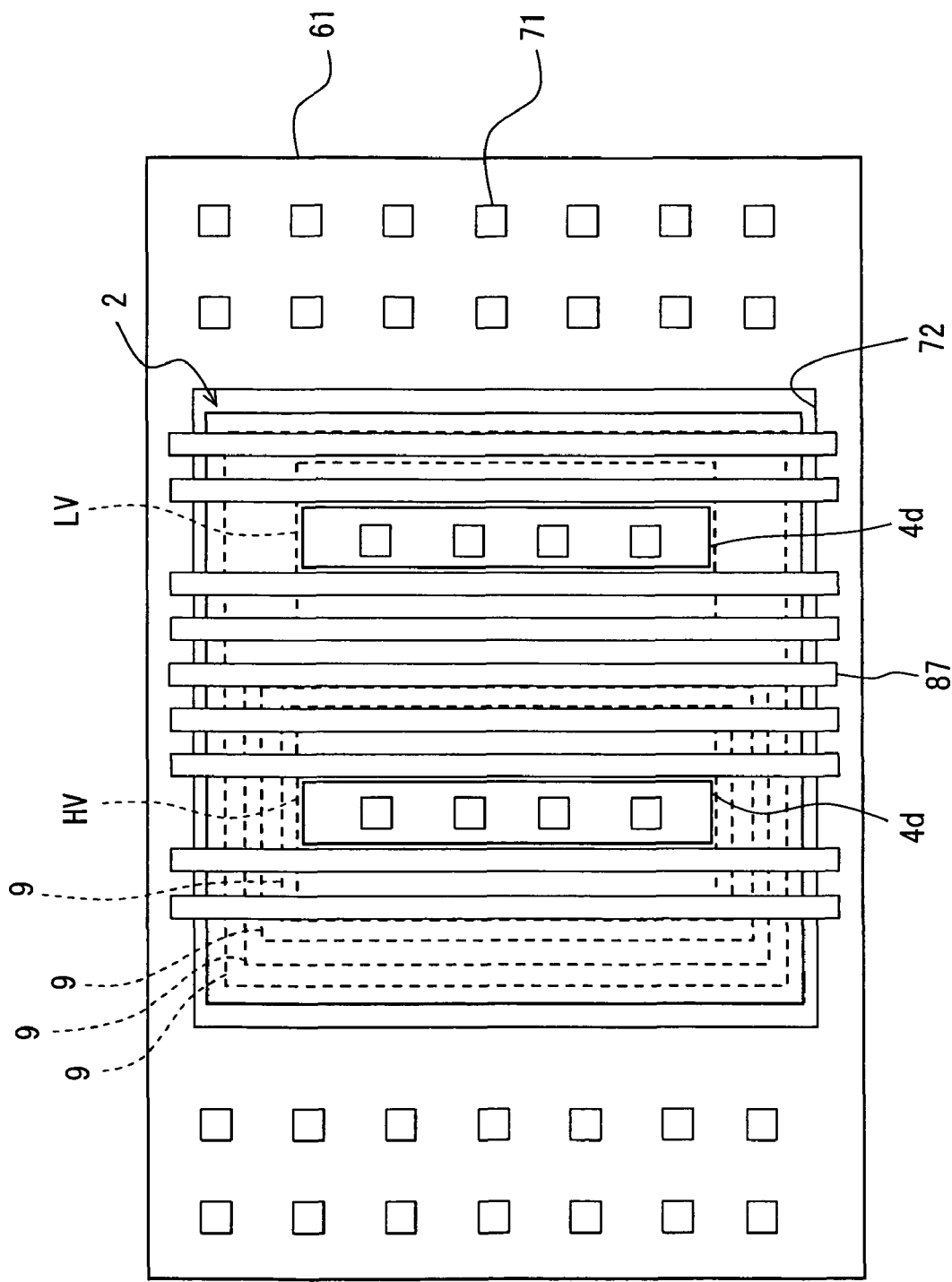
FIG. 53 is a plan view showing the semiconductor device taken along line LIII-LIII in FIG. 52.

Next, a eighteenth embodiment of the present invention will be explained with reference to FIGS. 52 and 53. FIG. 52 is a cross sectional view showing the eighteenth embodiment. FIG. 53 is a plan view taken along line LIII-LIII in FIG. 52.

In the present embodiment, as shown in FIG. 52, multiple metal members 87 are formed on at least both of the boards 61e, 61g contacting the semiconductor chip 2 to contact the semiconductor chip 2 and to penetrate the boards 61e, 61g in the stacking direction of the multi layer substrate 60. When multiple metal members 87 are formed, a stress to be applied to the semiconductor chip 2 is uniformed when the multi layer substrate 60 is manufactured and after the multi layer substrate 60 is manufactured. Thus, occurrence of warpage of the semiconductor chip 2 is restricted. Further, since heat in the semiconductor chip 2 is radiated via the multiple metale members 87, heat radiation performance is improved.

As shown in FIG. 53, the metal member 87 has at least the length of the facing surface between the low potential reference circuit LV and the high potential reference circuit HV facing each other in the semiconductor chip 2. However, the metal member 87 is not a plate shape member having the length of the facing surface between the low potential reference circuit LV and the high potential reference circuit HV facing each other in the semiconductor chip 2, but a columnar shape member arranged at each predetermined distance, similar to the connection via 71.

In the present embodiment, the metal film 4d is formed to be opposite to a part of the low potential reference circuit LV and a part of the high potential reference circuit HV so that the metal film 4d of the semiconductor chip 2 does not contact the metal member 86.

Figure 54:
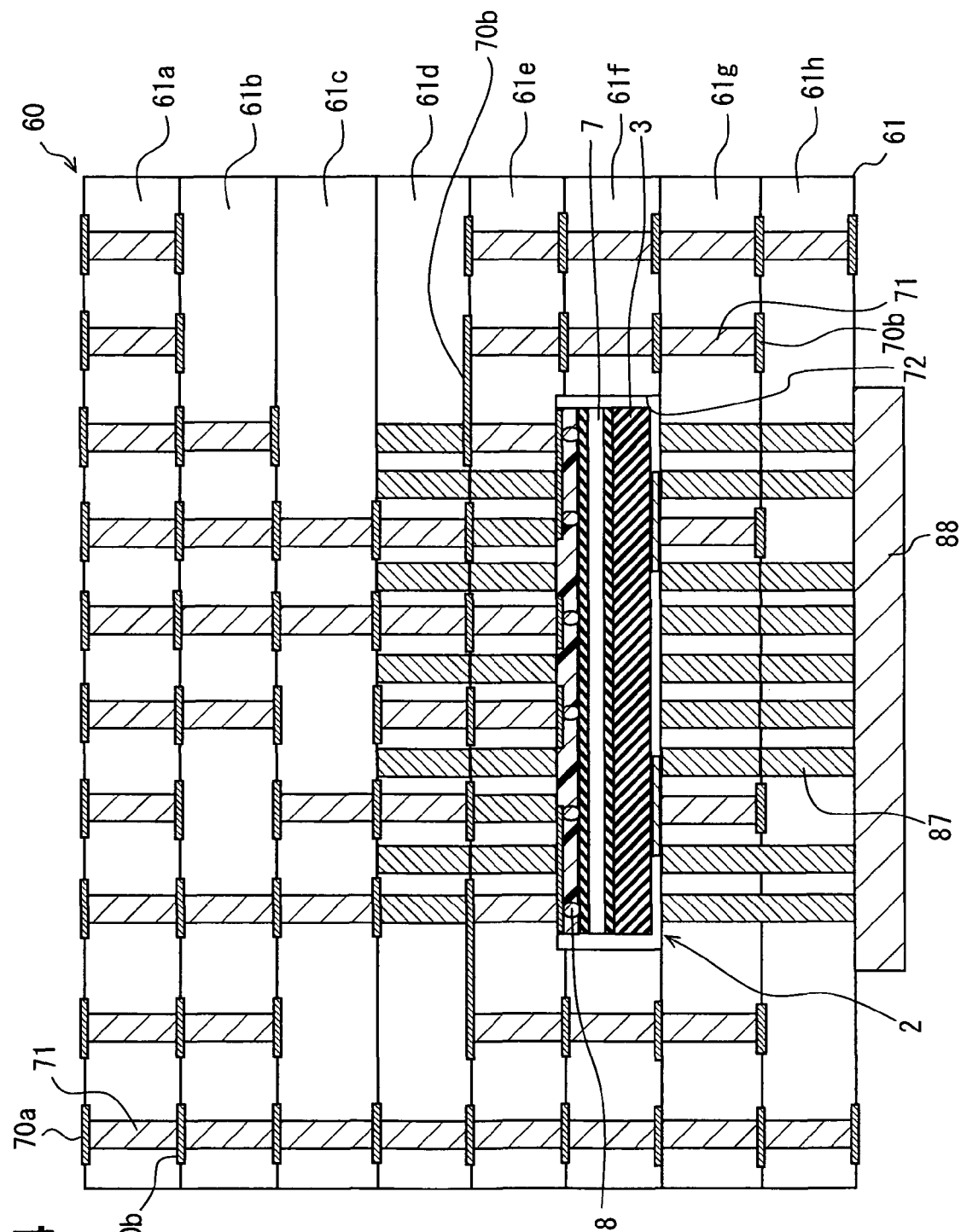
FIG. 54 is a cross sectional view showing a semiconductor device according to another example of the eighteenth embodiment.

As shown in FIG. 54, the metal member 87 may be formed to penetrate multiple boards 61 adjacent to the semiconductor chip 2. Thus, heat radiation performance is improved. It is preferred that a heat sink 88 is formed on the surface of the multi layer substrate 60. In this case, since the metal member 87 contacts the heat sink 88, heat radiation performance of heat generated in the semiconductor chip 2 is much increased.

As shown in FIG. 54, the metal member 87 may be made of the same material as the conductive material of the connection via 71. Thus, it is possible to form the conductive member in the connection via 71 and the metal member 87 in the common process. Thus, the manufacturing cost is reduced.

Since the above described metal member 87 is not used for useful signal transmission in the semiconductor chip 2 and/or the multi layer substrate 60, the formation position of the member 87 can be arranged comparatively freely.

Although the embodiments of the present invention are explained above, the present invention is not limited to the above embodiments. The present invention can be operable even when the invention is modified within an aspect of the present invention.

For example, in the above described twelfth embodiment to eighteenth embodiment, the semiconductor chip 2 includes the low potential reference circuit LV and the high potential reference circuit HV. Alternatively, the twelfth embodiment to eighteenth embodiment can be applied to the chip 2 further includes the level shift circuit LS.

The above disclosure has the following aspects.

According to a first aspect of the present disclosure, a method for manufacturing a semiconductor device includes: preparing a wafer formed of a SOI substrate having a support substrate, an insulation layer and a semiconductor layer, which are stacked in this order; forming a circuit portion with a low potential reference circuit and a high potential reference circuit in a principal surface portion of the semiconductor layer, wherein the low potential reference circuit functions with a first potential as a reference potential, the high potential reference circuit functions with a second potential as a reference potential, the second potential is higher than the first potential, and the low potential reference circuit transmits a signal to and receives a signal from the high potential reference circuit; removing the support substrate of the SOI substrate after the forming the circuit portion; fixing an insulation member on a backside of the semiconductor layer so as to be opposite to the circuit portion after the removing the support substrate; dicing the wafer and dividing the wafer into a plurality of chips having the low potential reference circuit and the high potential reference circuit after the fixing the insulation member; arranging a first conductive member on the insulation member so as to be opposite to at least a part of the low potential reference circuit, and arranging a second conductive member on the insulation member so as to be opposite to at least a part of the high potential reference circuit, wherein a potential to be applied to the first conductive member is different from a potential to be applied to the second conductive member; and coupling the first conductive member with a first part of the low potential reference circuit, to which the first potential is to be applied, and coupling the second conductive member with a second part of the high potential reference circuit, to which the second potential is to be applied.

Thus, in the semiconductor device manufactured by the above method with using the SOI substrate, the first conductive member is arranged to be opposite to at leas a part of the low potential reference circuit, and the second conductive member is arranged to be opposite to at least a part of the high potential reference circuit. Accordingly, a part of the insulation member disposed below the low potential reference circuit is sandwiched between the same potential portions since the low potential reference circuit and the first conductive member have almost the same potential. Similarly, a part of the insulation member disposed below the high potential reference circuit is sandwiched between the same potential portions since the high potential reference circuit and the second conductive member have almost the same potential.

Accordingly, it is possible to reduce or preclude a potential difference between both ends of a parasitic capacitor formed in the semiconductor device, and therefore, a capacitance is cancelled. Thus, generation of a displacement current generated by a dv/dt surge for charging and discharging a parasitic capacitor is prevented. Further, it is possible to prevent malfunction of a circuit.

Alternatively, the forming the circuit portion may include forming a level shift circuit together with the low potential reference circuit and the high potential reference circuit in the principal surface portion of the semiconductor layer. The level shift circuit may include at least one level shift element for performing level shift of a reference potential between the low potential reference circuit and the high potential reference circuit. In the dicing the wafer, the chip may include the circuit portion together with the level shift circuit. In this case, the semiconductor device having the level shift circuit disposed on the same chip is obtained. Here, when the same chip includes the circuit portion having at least the low potential reference circuit and the high potential reference circuit, generation of the displacement current is prevented. Thus, the level shift circuit and the like for transmitting a signal between the low potential reference circuit and the high potential reference circuit may be disposed in another chip.

Alternatively, the method for manufacturing the semiconductor device may further include: arranging at least one third conductive member on the insulation member so as to be opposite to at least a part of the level shift circuit; and electrically coupling the third conductive member with the level shift circuit. In a conventional structure with using a SOI substrate, the displacement current is generated not only between the low potential reference circuit and the high potential reference circuit but also between the level shift circuit and the low potential reference circuit or between the level shift circuit and the high potential reference circuit. Further, an electric filed may be generated in the insulation member between the high potential reference circuit and the low potential reference circuit according to a potential difference between the high potential reference circuit and the low potential reference circuit. In this case, the equipotential distribution in the insulation member provides not a flat distribution in a whole between the high potential reference circuit and the low potential reference circuit but a distribution such that the nearer the high potential reference circuit, or the nearer the low potential reference circuit, the stronger the generation of a biased potential. According to this biased potential, a parasitic capacitance is formed between a biased potential portion and the high potential reference circuit or between the biased potential portion and the low potential reference circuit, so that the displacement current may be generated. On the other hand, in the above method, the third conductive member is arranged opposite to the level shift circuit disposed between the high, potential reference circuit and the low potential reference circuit. Accordingly, a part of the insulation member disposed below the level shift circuit is sandwiched between same potential portions since the level shift circuit and the third conductive member have the same potential. Accordingly, a potential difference between both ends of a parasitic capacitor formed in the semiconductor device is reduced or precluded. Thus, the displacement current generated by the dv/dt surge for charging and discharging the parasitic capacitor is prevented from being generated in a path of a forming portion of the level shift circuit. Thus, it is possible to prevent malfunction of a circuit. Further, the third conductive member is arranged opposite to the level shift circuit disposed between the high potential reference circuit and the low potential reference circuit. The level shift circuit and the third conductive circuit have the same potential between the first potential and the second potential. Thus, a potential difference between adjacent conductive members in the insulation member is reduced. Thus, the above biased potential is reduced. Accordingly, generation of the displacement current is prevented by this effect.

Further, the level shift circuit may include a plurality of level shift elements, which are coupled in series with each other. A plurality of third conductive members are arranged on the insulation member. Each third conductive member is arranged on the insulation member so as to be opposite to a corresponding level shift element. Each third conductive member is electrically coupled with a corresponding level shift element. In the level shift circuit having multiple level shift elements arranged in a multiple stage manner, voltage ranges of the level shift elements are different from each other. On the other hand, in the present invention, each third conductive member is arranged opposite to a corresponding level shift element, and the third conductive member is electrically coupled with a corresponding level shift element. Accordingly, the capacitance of the parasitic capacitor is cancelled in a whole area of the level shift circuit, compared with a case where only one third conductive member is arranged opposite to the level shift circuit having multiple level shift elements. Further, a potential difference between adjacent conductive members in the insulation member is much reduced, and therefore, generation of the displacement current is effectively prevented.

Alternatively, the first conductive member may be opposite to a whole of the low potential reference circuit. The second conductive member may be opposite to a whole of the high potential reference circuit. In this case, the biased potential is reduced, compared with a case where the conductive member is opposite to only a part of the circuit portion. Thus, generation of the displacement current is prevented.

Alternatively, the insulation member may be fixed to the insulation layer. In this case, when the insulation layer providing the SOI substrate remains without removing, contamination of the semiconductor layer is prevented till the insulation member is fixed to the backside of the semiconductor layer. Further, since the insulation member is fixed to the insulation layer, sufficient fixation is secured (for example, adhesiveness is improved), compared with a case where the insulation member is fixed to the semiconductor layer.

Further, the removing the support substrate may include: mechanically cutting the support substrate; and etching the support substrate with using the insulation layer as an etching stopper. When the support substrate is removed by mechanically cutting, the substrate can be removed for a short time, and therefore, a manufacturing cost is reduced. However, when the substrate is only cut, the support substrate may remain in a concavity of the insulation film since the surface of the insulation film has concavities and convexities. In this case, when the support substrate remains in an area from the low potential reference circuit to the high potential reference circuit, the remained support substrate provides a transmission path of the displacement current. On the other hand, since the substrate is etched with using the insulation layer as a stopper after cutting, the support substrate remained in the concavities is completely removed. Thus, in the constitution with using the SOI substrate, the semiconductor device provides to prevent effectively generation of the displacement current.

Alternatively, the method for manufacturing the semiconductor device may further include: cutting the insulation member fixed on the backside of the semiconductor layer to be a predetermined thickness after the fixing the insulation member. The insulation member having a predetermined thickness may be fixed to the backside of the semiconductor layer. When the insulation member is cut to have a predetermined thickness after fixing, damage of the insulation member is prevented till the fixation.

Alternatively, the method for manufacturing the semiconductor device may further include: forming a metal film on the insulation member before the electrically coupling; patterning the metal film according to the circuit portion in such a manner that the metal film is divided into a first metal portion and a second metal portion, which are electrically separated from each other; and coupling the first conductive member with the first metal portion, and coupling the second conductive member with the second metal portion. A positioning accuracy with respect to a corresponding part of the circuit portion in case where the part is a patterned part of the metal film is better than that in a case where the part is a part of the conductive member. In the above method, since the metal film electrically functions as a part of the conductive member, the conductive member (including the corresponding part of the metal film) can be arranged at a desired position, compared with a case where the conductive member is fixed to the insulation member without forming the metal film. Further, since the conductive member is preferably coupled with a part of the metal film, it is not necessary to provide high positioning accuracy of the conductive member.

Alternatively, the first conductive member may be a first lead, and the second conductive member may be a second lead. In the electrically coupling, the semiconductor layer in a chip may be fixed to the first lead and the second lead via the insulation member. Further, the second lead may be arranged on the insulation member in such a manner that the second lead opposite to at least the high potential reference circuit is opposite to only the high potential reference circuit. The second lead may include a bent portion, and a part of the bent portion opposite to an end of the high potential reference circuit is bent so as to separate away from the insulation member. Thus, the lead as the conductive member opposite to the high potential reference circuit is prevented from being opposite to a region of the circuit portion other than the high potential reference circuit as much as possible.

Alternatively, the method for manufacturing the semiconductor device may further include: attaching a support member on the principal surface of the semiconductor layer before the removing the support substrate; and removing the support member after the fixing the insulation member and before the electrically coupling. In the removing the support substrate, the support substrate is removed from the SOI substrate having rigidity enhanced by the support member. In this case, the support substrate is stably removed even when the thickness of the SOI substrate is thin (for example, equal to or smaller than 150 micrometers). Further, the removing the support member may be performed before the dicing. It is possible to remove the support member after dicing, i.e., it is possible to dice the support member. In the above case, the support member can be reused.

According to a second aspect of the present disclosure, a method for manufacturing a semiconductor device includes: preparing a wafer formed of a bulk semiconductor substrate as a semiconductor layer; forming an insulation isolation trench having a predetermined depth on a principal surface of the semiconductor substrate; forming a circuit portion with a low potential reference circuit and a high potential reference circuit in a principal surface portion of the semiconductor substrate, wherein the low potential reference circuit functions with a first potential as a reference potential, the high potential reference circuit functions with a second potential as a reference potential, and the second potential is higher than the first potential; removing a part of a backside of the semiconductor substrate so as to expose the insulation isolation trench after the forming the circuit portion; fixing an insulation member on the backside of the semiconductor substrate so as to be opposite to the circuit portion after the removing the part of the backside of the semiconductor substrate; dicing the wafer and dividing the wafer into a plurality of chips having the low potential reference circuit and the high potential reference circuit after the fixing the insulation member; arranging a first conductive member on the insulation member so as to be opposite to at least a part of the low potential reference circuit, and arranging a second conductive member on the insulation member so as to be opposite to at least a part of the high potential reference circuit, wherein a potential to be applied to the first conductive member is different from a potential to be applied to the second conductive member; and coupling the first conductive member with a first part of the low potential reference circuit, to which the first potential is to be applied, and coupling the second conductive member with a second part of the high potential reference circuit, to which the second potential is to be applied.

Thus, regarding the semiconductor device formed by the manufacturing method with using the bulk semiconductor substrate, it is possible to reduce or preclude a potential difference between both ends of a parasitic capacitor formed in the semiconductor device, and therefore, a capacitance is cancelled. Thus, generation of a displacement current generated by a dv/dt surge for charging and discharging a parasitic capacitor is prevented. Further, it is possible to prevent malfunction of a circuit.

Alternatively, the removing the part of the backside of the semiconductor substrate may include: mechanically cutting the semiconductor substrate; and polishing a cut surface so as to remove a fracture layer. When the semiconductor layer (i.e., the semiconductor substrate) is mechanically cut, a crystal structure of the cut surface portion is damaged so that the fracture layer is formed. In the fracture layer, crystal defect may be easily generated. The crystal defect causes current leakage. On the other hand, in the present invention, the cut surface is polished after cutting so that the fracture layer is removed, and therefore, generation of quality inferior caused by the crystal defect is prevented.

Alternatively, the method for manufacturing the semiconductor device may further include: forming an insulation film on the backside of the semiconductor substrate after removing the part of the backside of the semiconductor substrate and before the fixing the insulation member. In the fixing the insulation member, the insulation member is fixed to the insulation film. In this case, when the insulation film is formed on the backside of the semiconductor layer, contamination on the semiconductor layer is prevented till the insulation member is fixed to the backside of the semiconductor layer. Further, since the insulation member is fixed to the insulation film, it is possible to secure good fixation (for example, adhesiveness is improved), compared with a case where the insulation member is fixed to the semiconductor layer.

According to a third aspect of the present disclosure, a semiconductor device includes: a semiconductor layer having a circuit portion, which includes a low potential reference circuit, a high potential reference circuit and a level shift circuit, wherein the low potential reference circuit, the high potential reference circuit and the level shift circuit are disposed in a principal surface portion of the semiconductor layer, the low potential reference circuit functions with a first potential as a reference potential, the high potential reference circuit functions with a second potential as a reference potential, the second potential is higher than the first potential, and the level shift circuit includes at least one level shift element for performing level shift of a reference potential between the low potential reference circuit and the high potential reference circuit; an insulation member fixed on a backside of the semiconductor layer and opposite to the circuit portion; a first conductive member arranged on the insulation member and opposite to at least a part of the low potential reference circuit; a second conductive member arranged on the insulation member and opposite to at least a part of the high potential reference circuit; and a third conductive member arranged on the insulation member and opposite to at least a part of the level shift circuit. A potential to be applied to the first conductive member, a potential to be applied to the second conductive member and a potential to be applied to the third conductive member are different from each other. The first conductive member is electrically coupled with a first part of the low potential reference circuit, to which the first potential is to be applied. The second conductive member is electrically coupled with a second part of the high potential reference circuit, to which the second potential is to be applied, and the third conductive member is electrically coupled with the level shift circuit.

Thus, it is possible to reduce or preclude a potential difference between both ends of a parasitic capacitor formed in the semiconductor device, and therefore, a capacitance is cancelled. Thus, generation of a displacement current generated by a dv/dt surge for charging and discharging a parasitic capacitor is prevented. Further, it is possible to prevent malfunction of a circuit.

According to a fourth aspect of the present disclosure, a semiconductor device includes: a semiconductor layer having a circuit portion, which includes a low potential reference circuit and a high potential reference circuit, wherein the low potential reference circuit and the high potential reference circuit are disposed in a principal surface portion of the semiconductor layer, the low potential reference circuit functions with a first potential as a reference potential, the high potential reference circuit functions with a second potential as a reference potential, the second potential is higher than the first potential, and the low potential reference circuit transmits a signal to and receives a signal from the high potential reference circuit; an insulation member fixed on a backside of the semiconductor layer and opposite to the circuit portion; a first conductive member arranged on the insulation member and opposite to at least a part of the low potential reference circuit; and a second conductive member arranged on the insulation member and opposite to at least a part of the high potential reference circuit. A potential to be applied to the first conductive member is different from a potential to be applied to the second conductive member. The first conductive member is electrically coupled with a first part of the low potential reference circuit, to which the first potential is to be applied, and the second conductive member is electrically coupled with a second part of the high potential reference circuit, to which the second potential is to be applied.

Thus, it is possible to reduce or preclude a potential difference between both ends of a parasitic capacitor formed in the semiconductor device, and therefore, a capacitance is cancelled. Thus, generation of a displacement current generated by a dv/dt surge for charging and discharging a parasitic capacitor is prevented. Further, it is possible to prevent malfunction of a circuit.

Alternatively, the semiconductor device may further include: a metal film arranged on the insulation member. The metal film includes a first metal portion and a second metal portion, which are separated from each other according to the circuit portion, and the first conductive member is coupled with the first metal portion, and the second conductive member is coupled with the second metal portion.

According to a fifth aspect of the present disclosure, a multi layer substrate includes: the semiconductor device according to the fourth aspect of the present disclosure, which is embedded in the multi layer substrate; a plurality of resin layers, which are stacked; a hollow region arranged in the multi layer substrate and having dimensions corresponding to dimensions of the semiconductor device, wherein the semiconductor device is embedded in the hollow region; a wiring pattern arranged between the resin layers; and a connection via penetrating the resin layers. The circuit portion of the semiconductor device is electrically coupled with the metal film through the wiring pattern and the connection via.

In the above case, since the semiconductor device is accommodated and sealed in the multi layer substrate, it is not necessary to seal the device with another mold resin or the like. Further, heat in the semiconductor device can be discharged to the outside through the connection via.

Alternatively, the multi layer substrate may further include: a first insulation member. The wiring pattern includes a first wiring pattern and a second wiring pattern. The connection via includes a first connection via and a second connection via. A first potential is to be applied to the first wiring pattern and the first connection via. A second potential is to be applied to the second wiring pattern and the second connection via. The first insulation member is arranged between the first wiring pattern and the first connection via and the second wiring pattern and the second connection via. The first insulation member intersects an interface between adjacent two resin layers, in which the first wiring pattern, the first connection via, the second wiring pattern and the second connection via are arranged, and the first insulation member penetrates at least a boundary between the low potential reference circuit and the high potential reference circuit. The multi layer substrate is formed by bonding multiple resin layers together. A bonding interface may include a small clearance. In this case, when moisture penetrates into the small clearance, the wiring pattern and the connection via to be applied with the first potential may short-circuit the wiring pattern and the connection via to be applied with the second potential. In view of this problem, since the first insulation member is formed, even when moisture penetrates into the interface between adjacent resin layers, possibility of occurrence of the short-circuit between the wiring pattern and the connection via to be applied with the first potential and the connection via to be applied with the second potential is reduced.

Alternatively, the first insulation member may have insulation performance higher than the resin layer, and the first insulation member may be arranged continuously from a surface of the semiconductor device to an outer surface of the multi layer substrate. In this case, occurrence of short-circuit caused by penetration of moisture is prevented. Further, it is possible to improve withstand voltage.

Alternatively, the first insulation member may include a main part and a side part. The main part penetrates at least the boundary between the low potential reference circuit and the high potential reference circuit, and the side part extends from both ends of the main part to a side of the low potential reference circuit or the high potential reference circuit. Thus, the first insulation member is arranged to surround the wiring pattern and the connection via to be applied with the first potential of the low potential reference circuit or the wiring pattern and the connection via to be applied with the second potential of the high potential reference circuit from three directions. Therefore, occurrence of short-circuit caused by moisture penetrating into the clearance at the interface between adjacent resin layers is prevented.

Alternatively, the multi layer substrate may further include: a hollow portion. The wiring pattern includes a first wiring pattern and a second wiring pattern. The connection via includes a first connection via and a second connection via. A first potential is to be applied to the first wiring pattern and the first connection via. A second potential is to be applied to the second wiring pattern and the second connection via. The hollow portion is arranged between the first wiring pattern and the first connection via and the second wiring pattern and the second connection via. The hollow portion intersects an interface between adjacent two resin layers, in which the first wiring pattern, the first connection via, the second wiring pattern and the second connection via are arranged, and the hollow portion penetrates at least a boundary between the low potential reference circuit and the high potential reference circuit. In this case, even when moisture penetrates into the clearance, of the interface between adjacent resin layers, the moisture is trapped in the hollow portion. Thus, possibility of occurrence of short-circuit is reduced.

Alternatively, the multi layer substrate may further include: a concavity and convexity portion. The wiring pattern includes a first wiring pattern and a second wiring pattern. The connection via includes a first connection via and a second connection via. A first potential is to be applied to the first wiring pattern and the first connection via. A second potential is to be applied to the second wiring pattern and the second connection via. The concavity and convexity portion is arranged between first wiring pattern and the first connection via and the second wiring pattern and the second connection via. The concavity and convexity portion intersects an interface between adjacent two resin layers, in which the first wiring pattern, the first connection via, the second wiring pattern and the second connection via are arranged. The concavity and convexity portion penetrates at least a boundary between the high potential reference circuit and the low potential reference circuit. In this case, a length of a passage for causing short-circuit with penetrated moisture can be lengthened between the wiring pattern and the connection via to be applied with the first potential and the wiring pattern and the connection via to be applied with the second potential. Accordingly, even when moisture penetrates into the clearance of the interface between adjacent resin layers, short-circuit caused by the moisture is hardly occurred.

Alternatively, the wiring pattern may include a first wiring pattern and a second wiring pattern. The connection via includes a first connection via and a second connection via. The first metal film is coupled with the first wiring pattern and the first connection via. The second metal film is coupled with the second wiring pattern and the second connection via. Each of the first connection via and the second connection via includes a second insulation member and a fourth conductive member. The second insulation member has a cylinder shape and insulation performance higher than the resin layer. The fourth conductive member is embedded in the second insulation member having the cylinder shape. Since the conductive member in the connection via connected to the metal film is surrounded with the second insulation member having high insulating performance, the insulation performance between connection vias is improved. Thus, it is possible to improve withstand voltage.

Alternatively, the second insulation member may continuously extend from each metal film to an outer surface of the multi layer substrate. The insulation performance is much improved with using such a second insulation member.

Alternatively, each of the first connection via and the second connection via may further include a third insulation member. The second insulation member has a plurality of second insulation parts having a length equal to a thickness of each resin layer, and the third insulation member has a ring shape, and surrounds a contact portion between adjacent two second insulation parts. Since the length of the second insulation member is equal to the thickness of each resin layer, and the second insulation member can be preliminary arranged on each resin layer, the manufacturing process of the multi layer substrate is easily performed. Further, since the third insulation member is arranged to surround a contact portion between two second insulation members, even when the moisture penetrates into the clearance at the interface between adjacent resin layers, the moisture is prevented from reaching the conductive member in the second insulation member. Accordingly, occurrence of short-circuit caused by the penetrated moisture is prevented.

Alternatively, the multi layer substrate may further include: a low potential electrode and a high potential electrode, which are arranged on an outer surface of the multi layer substrate. The first metal film is coupled with the low potential electrode through the first connection via and the first wiring pattern. The second metal film is coupled with the low potential electrode through the second connection via and the second wiring pattern. The first connection via includes a plurality of first connection via parts having a length equal to the thickness of each resin layer. The second connection via includes a plurality of second connection via parts having a length equal to the thickness of each resin layer. A distance between the first connection via connecting to the low potential electrode and the second connection via connecting to the high potential electrode is larger than a distance between the first connection via part connecting to the first metal film and the second connection via part connecting to the second metal film. Thus, in the surface portion of the multi layer substrate, the distance between the connection via connecting to the low potential electrode and the connection via connecting to the high potential electrode is widened, so that the insulation performance is easily secured. Accordingly, material for providing the second insulation member, which is comparatively expensive and has high insulation performance, is used for the connection via connecting to the metal film. Material for providing the second insulation member, which is comparatively cheap and has low insulation performance, is used for the connection via in the surface portion of the multi layer substrate. Thus, it is possible to reduce the manufacturing cost.

Alternatively, the multi layer substrate may further include: a plurality of fourth insulation members arranged in at least both resin layers, which contacts the semiconductor device. Each fourth insulation member penetrates the resin layers in a stacking direction of the multi layer substrate and contacts the semiconductor device. In this case, by arranging the fourth insulation member, a stress to be applied to the semiconductor device when the multi layer substrate is manufactured and after the multi layer substrate is manufactured is homogenized.

Alternatively, the wiring pattern may include a first wiring pattern and a second wiring pattern. The connection via includes a first connection via and a second connection via. A first potential is to be applied to the first wiring pattern and the first connection via. A second potential is to be applied to the second wiring pattern and the second connection via. One fourth insulation member is arranged between the first wiring pattern and the first connection via and the second wiring pattern and the second connection via. The one fourth insulation member penetrates at least a boundary between the low potential reference circuit and the high potential reference circuit. The one fourth insulation member extends in order to intersect an interface between one resin layer contacting the semiconductor device and another resin layer adjacent to the one resin layer. Thus, even when the moisture penetrates into the interface between adjacent resin layers, possibility of occurrence of short-circuit between the wiring pattern and the connection via to be applied to the first potential and the wiring pattern and the connection via to be applied to the second potential is reduced.

Alternatively, the fourth insulation member may have insulation performance higher than the resin layer. The fourth insulation member penetrates a boundary between the low potential reference circuit and the high potential reference circuit, and the fourth insulation member penetrates a plurality of resin layers adjacent to the semiconductor device. Thus, occurrence of short-circuit caused by penetrated moisture at the interface between adjacent resin layers is prevented surely.

Alternatively, the multi layer substrate may further include: a plurality of metal members arranged in at least both resin layers, which contact the semiconductor device. Each metal member penetrates the resin layer in a stacking direction of the multi layer substrate, and contacts the semiconductor device. By arranging the metal members, a stress to be applied to the semiconductor device when the multi layer substrate is manufactured and after the multi layer substrate is manufactured is homogenized. Thus, generation of warpage of the semiconductor device is prevented. Further, since heat of the semiconductor device is radiated through the multiple metal members, heat radiation performance is improved.

Alternatively, the multi layer substrate may further include: a heat sink arranged on an outer surface of the multi layer substrate. A part of the plurality of metal members arranged on one side of the semiconductor device contacts the heat sink. In this case, heat radiation performance of heat generated in the semiconductor device is much improved.

Alternatively, the metal member may be made of a same material as the conductive member of the connection via. Thus, the conductive member in the connection via and the metal member are formed in the common process, so that it is possible to reduce the manufacturing cost.

Here, since the above metal member is not used for transmitting a significant signal in the semiconductor device, a forming place of the metal member is comparatively freely arranged.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a semiconductor layer having a circuit portion, which includes a low potential reference circuit, a high potential reference circuit and a level shift circuit, wherein the low potential reference circuit, the high potential reference circuit and the level shift circuit are disposed in a principal surface portion of the semiconductor layer, the low potential reference circuit functions with a first potential as a reference potential, the high potential reference circuit functions with a second potential as a reference potential, the second potential is higher than the first potential, and the level shift circuit includes at least one level shift element for performing level shift of a reference potential between the low potential reference circuit and the high potential reference circuit;
   an insulation member fixed on a backside of the semiconductor layer and opposite to the circuit portion;
   a first conductive member arranged on the insulation member and opposite to at least a part of the low potential reference circuit;
   a second conductive member arranged on the insulation member and opposite to at least a part of the high potential reference circuit; and
   a third conductive member arranged on the insulation member and opposite to at least a part of the level shift circuit,
   wherein a potential to be applied to the first conductive member, a potential to be applied to the second conductive member and a potential to be applied to the third conductive member are different from each other,
   wherein the first conductive member is electrically coupled with a first part of the low potential reference circuit, to which the first potential is to be applied,
   wherein the second conductive member is electrically coupled with a second part of the high potential reference circuit, to which the second potential is to be applied, and
   wherein the third conductive member is electrically coupled with the level shift circuit.

2. The semiconductor device according to claim 1,
   wherein the level shift circuit includes a plurality of level shift elements, which are coupled in series with each other,
   wherein a plurality of third conductive members are arranged on the insulation member,
   wherein each third conductive member is arranged on the insulation member so as to be opposite to a corresponding level shift element, and wherein each third conductive member is electrically coupled with a corresponding level shift element.

3. A semiconductor device comprising:
a semiconductor layer having a circuit portion, which includes a low potential reference circuit and a high potential reference circuit, wherein the low potential reference circuit and the high potential reference circuit are disposed in a principal surface portion of the semiconductor layer, the low potential reference circuit functions with a first potential as a reference potential, the high potential reference circuit functions with a second potential as a reference potential, the second potential is higher than the first potential, and the low potential reference circuit transmits a signal to and receives a signal from the high potential reference circuit;
an insulation member fixed on a backside of the semiconductor layer and opposite to the circuit portion;
a first conductive member arranged on the insulation member and opposite to at least a part of the low potential reference circuit; and
a second conductive member arranged on the insulation member and opposite to at least a part of the high potential reference circuit,
wherein a potential to be applied to the first conductive member is different from a potential to be applied to the second conductive member,
wherein the first conductive member is electrically coupled with a first part of the low potential reference circuit, to which the first potential is to be applied, and
wherein the second conductive member is electrically coupled with a second part of the high potential reference circuit, to which the second potential is to be applied.

4. The semiconductor device according to claim 3, further comprising:
a metal film arranged on the insulation member,
wherein the metal film includes a first metal portion and a second metal portion, which are separated from each other according to the circuit portion, and
wherein the first conductive member is coupled with the first metal portion, and the second conductive member is coupled with the second metal portion.

5. The semiconductor device according to claim 4,
wherein the first conductive member is a first lead, and the second conductive member is a second lead.

6. The semiconductor device according to claim 3, further comprising:
a metal film arranged on the insulation member,
wherein the metal film includes a first metal portion and a second metal portion, which are separated from each other according to the circuit portion, and
wherein the first conductive member provides the first metal portion, and the second conductive member provides the second metal portion.

7. A multi layer substrate comprising:
the semiconductor device according to claim 6, which is embedded in the multi layer substrate;
a plurality of resin layers, which are stacked;
a hollow region arranged in the multi layer substrate and having dimensions corresponding to dimensions of the semiconductor device, wherein the semiconductor device is embedded in the hollow region;
a wiring pattern arranged between the resin layers; and
a connection via penetrating the resin layers,
wherein the circuit portion of the semiconductor device is electrically coupled with the metal film through the wiring pattern and the connection via.

8. The multi layer substrate according to claim 7, further comprising:
a first insulation member,
wherein the wiring pattern includes a first wiring pattern and a second wiring pattern,
wherein the connection via includes a first connection via and a second connection via,
wherein a first potential is to be applied to the first wiring pattern and the first connection via,
wherein a second potential is to be applied to the second wiring pattern and the second connection via,
wherein the first insulation member is arranged between the first wiring pattern together with the first connection via and the second wiring pattern together with the second connection via,
wherein the first insulation member intersects an interface between adjacent two resin layers, in which the first wiring pattern, the first connection via, the second wiring pattern and the second connection via are arranged, and
wherein the first insulation member penetrates at least a boundary between the low potential reference circuit and the high potential reference circuit.

9. The multi layer substrate according to claim 8,
wherein the first insulation member has insulation performance higher than the resin layer, and
wherein the first insulation member is arranged continuously from a surface of the semiconductor device to an outer surface of the multi layer substrate.

10. The multi layer substrate according to claim 8,
wherein the first insulation member includes a main part and a side part,
wherein the main part penetrates at least the boundary between the low potential reference circuit and the high potential reference circuit, and
wherein the side part extends from both ends of the main part to a side of the low potential reference circuit or the high potential reference circuit.

11. The multi layer substrate according to claim 7, further comprising:
a hollow portion,
wherein the wiring pattern includes a first wiring pattern and a second wiring pattern,
wherein the connection via includes a first connection via and a second connection via,
wherein a first potential is to be applied to the first wiring pattern and the first connection via,
wherein a second potential is to be applied to the second wiring pattern and the second connection via,
wherein the hollow portion is arranged between the first wiring pattern together with the first connection via and the second wiring pattern together with the second connection via,
wherein the hollow portion intersects an interface between adjacent two resin layers, in which the first wiring pattern, the first connection via, the second wiring pattern and the second connection via are arranged, and
wherein the hollow portion penetrates at least a boundary between the low potential reference circuit and the high potential reference circuit.

12. The multi layer substrate according to claim 7, further comprising:
a concavity and convexity portion,
wherein the wiring pattern includes a first wiring pattern and a second wiring pattern,
wherein the connection via includes a first connection via and a second connection via, wherein a first potential is to be applied to the first wiring pattern and the first connection via, wherein a second potential is to be applied to the second wiring pattern and the second connection via, wherein the concavity and convexity portion is arranged between first wiring pattern together with the first connection via and the second wiring pattern together with the second connection via, wherein the concavity and convexity portion intersects an interface between adjacent two resin layers, in which the first wiring pattern, the first connection via, the second wiring pattern and the second connection via are arranged, and wherein the concavity and convexity portion penetrates at least a boundary between the high potential reference circuit and the low potential reference circuit.

13. The multi layer substrate according to claim 7,
wherein the wiring pattern includes a first wiring pattern and a second wiring pattern,
wherein the connection via includes a first connection via and a second connection via,
wherein the first metal film is coupled with the first wiring pattern and the first connection via,
wherein the second metal film is coupled with the second wiring pattern and the second connection via,
wherein each of the first connection via and the second connection via includes a second insulation member and a fourth conductive member,
wherein the second insulation member has a cylinder shape and insulation performance higher than the resin layer, and
wherein the fourth conductive member is embedded in the second insulation member having the cylinder shape.

14. The multi layer substrate according to claim 13,
wherein the second insulation member continuously extends from each metal film to an outer surface of the multi layer substrate.

15. The multi layer substrate according to claim 13,
wherein each of the first connection via and the second connection via further includes a third insulation member,
wherein the second insulation member has a plurality of second insulation parts having a length equal to a thickness of each resin layer, and
wherein the third insulation member has a ring shape, and surrounds a contact portion between adjacent two second insulation parts.

16. The multi layer substrate according to claim 13, further comprising:
a low potential electrode and a high potential electrode, which are arranged on an outer surface of the multi layer substrate,
wherein the first metal film is coupled with the low potential electrode through the first connection via and the first wiring pattern,
wherein the second metal film is coupled with the low potential electrode through the second connection via and the second wiring pattern,
wherein the first connection via includes a plurality of first connection via parts having a length equal to the thickness of each resin layer, wherein the second connection via includes a plurality of second connection via parts having a length equal to the thickness of each resin layer, and wherein a distance between the first connection via connecting to the low potential electrode and the second connection via connecting to the high potential electrode is larger than a distance between the first connection via part connecting to the first metal film and the second connection via part connecting to the second metal film.

17. The multi layer substrate according to claim 7, further comprising:
a plurality of fourth insulation members arranged in at least both resin layers, which contacts the semiconductor device,
wherein each fourth insulation member penetrates the resin layers in a stacking direction of the multi layer substrate and contacts the semiconductor device.

18. The multi layer substrate according to claim 17,
wherein the wiring pattern includes a first wiring pattern and a second wiring pattern,
wherein the connection via includes a first connection via and a second connection via,
wherein a first potential is to be applied to the first wiring pattern and the first connection via,
wherein a second potential is to be applied to the second wiring pattern and the second connection via,
wherein one fourth insulation member is arranged between the first wiring pattern together with the first connection via and the second wiring pattern together with the second connection via,
wherein the one fourth insulation member penetrates at least a boundary between the low potential reference circuit and the high potential reference circuit, and
wherein the one fourth insulation member extends in order to intersect an interface between one resin layer contacting the semiconductor device and another resin layer adjacent to the one resin layer.

19. The multi layer substrate according to claim 17,
wherein the fourth insulation member has insulation performance higher than the resin layer,
wherein the fourth insulation member penetrates a boundary between the low potential reference circuit and the high potential reference circuit, and
wherein the fourth insulation member penetrates a plurality of resin layers adjacent to the semiconductor device.

20. The multi layer substrate according to claim 7, further comprising:
a plurality of metal members arranged in at least both resin layers, which contact the semiconductor device,
wherein each metal member penetrates the resin layer in a stacking direction of the multi layer substrate, and contacts the semiconductor device.

21. The multi layer substrate according to claim 20, further comprising:
a heat sink arranged on an outer surface of the multi layer substrate,
wherein a part of the plurality of metal members arranged on one side of the semiconductor device contacts the heat sink.

22. The multi layer substrate according to claim 20,
wherein the metal member is made of a same material as the conductive member of the connection via.

* * * * *